(12) United States Patent
Tsuge

(10) Patent No.: US 7,561,147 B2
(45) Date of Patent: Jul. 14, 2009

(54) CURRENT OUTPUT TYPE OF SEMICONDUCTOR CIRCUIT, SOURCE DRIVER FOR DISPLAY DRIVE, DISPLAY DEVICE, AND CURRENT OUTPUT METHOD

(75) Inventor: Hitoshi Tsuge, Osaka (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 722 days.

(21) Appl. No.: 10/555,642

(22) PCT Filed: Apr. 28, 2004

(86) PCT No.: PCT/JP2004/006179

§ 371 (c)(1),
(2), (4) Date: Nov. 4, 2005

(87) PCT Pub. No.: WO2004/100119

PCT Pub. Date: Nov. 18, 2004

(65) Prior Publication Data

US 2006/0279260 A1 Dec. 14, 2006

(30) Foreign Application Priority Data

| May 7, 2003 | (JP) | ............................. | 2003-129497 |
| May 28, 2003 | (JP) | ............................. | 2003-150769 |
| Aug. 5, 2003 | (JP) | ............................. | 2003-287215 |
| Oct. 2, 2003 | (JP) | ............................. | 2003-344787 |

(51) Int. Cl.
*G09G 5/00* (2006.01)

(52) U.S. Cl. ......................... 345/204; 345/87; 345/156; 345/205; 345/690; 315/169.3

(58) Field of Classification Search ................... 345/87, 345/156, 204, 205, 690; 315/169.3
See application file for complete search history.

(56) References Cited

U.S. PATENT DOCUMENTS 4,910,480 A  3/1990  Crosby (Continued)

FOREIGN PATENT DOCUMENTS

CN    1294375 A    5/2001

(Continued)

OTHER PUBLICATIONS

U.S. Appl. No. 11/865,749, filed Oct. 2, 2007, Takahara, et al.

*Primary Examiner*—Bipin Shalwala
*Assistant Examiner*—Vince E Kovalick
(74) *Attorney, Agent, or Firm*—Oblon, Spivak, McClelland, Maier & Neustadt, P.C.

(57) ABSTRACT

To provide a current output type semiconductor circuit, a drive device for display, a display device, and a current output method that can control an increase in a circuit size to be lower even if the number of output bits of a current driver is increased.

A current output type semiconductor circuit, including first current source groups 241a and 241b, includes first unit transistors of outputting a predetermined current and output lower order N (N is a natural number) bits; and second current source groups 242a, 242b, 242c, 242d, 242e, and 242f that include second unit transistors of outputting a current larger than that of the first unit transistors and output higher order M (M is a natural number, $(N+M) \geq 3$) bits.

17 Claims, 44 Drawing Sheets

U.S. PATENT DOCUMENTS

| | | | |
|---|---|---|---|
| 4,954,766 A * | 9/1990 | Ishikawa et al. | 323/272 |
| 5,684,365 A | 11/1997 | Tang et al. | |
| 5,903,234 A | 5/1999 | Kimura | |
| 5,952,789 A | 9/1999 | Stewart et al. | |
| 5,959,600 A | 9/1999 | Uchino et al. | |
| 5,990,629 A | 11/1999 | Yamada et al. | |
| 6,072,415 A | 6/2000 | Cheng | |
| 6,091,203 A | 7/2000 | Kawashima et al. | |
| 6,219,113 B1 | 4/2001 | Takahara | |
| 6,229,506 B1 | 5/2001 | Dawson et al. | |
| 6,246,180 B1 | 6/2001 | Nishigaki | |
| 6,332,661 B1 | 12/2001 | Yamaguchi | |
| 6,351,255 B1 | 2/2002 | Ishizuka et al. | |
| 6,359,605 B1 | 3/2002 | Knapp et al. | |
| 6,369,786 B1 | 4/2002 | Suzuki | |
| 6,373,454 B1 | 4/2002 | Knapp et al. | |
| 6,384,817 B1 | 5/2002 | Janssen et al. | |
| 6,525,704 B1 | 2/2003 | Kondo et al. | |
| 6,528,951 B2 | 3/2003 | Yamazaki et al. | |
| 6,531,827 B2 | 3/2003 | Kawashima | |
| 6,531,996 B1 | 3/2003 | Murade | |
| 6,542,138 B1 | 4/2003 | Shannon et al. | |
| 6,567,327 B2 | 5/2003 | Tsuchi | |
| 6,577,302 B2 | 6/2003 | Hunter et al. | |
| 6,583,775 B1 | 6/2003 | Sekiya et al. | |
| 6,586,888 B2 | 7/2003 | Kitahara et al. | |
| 6,608,620 B1 | 8/2003 | Suzuki et al. | |
| 6,628,355 B1 | 9/2003 | Takahara | |
| 6,734,636 B2 | 5/2004 | Sanford et al. | |
| 6,747,417 B2 | 6/2004 | Meade et al. | |
| 6,756,951 B1 | 6/2004 | Ishizuka et al. | |
| 6,765,560 B1 | 7/2004 | Ozawa | |
| 6,872,973 B1 | 3/2005 | Koyama et al. | |
| 6,909,409 B2 | 6/2005 | Tanada | |
| 6,924,601 B2 | 8/2005 | Date | |
| 6,943,759 B2 | 9/2005 | Tam | |
| 6,992,647 B2 | 1/2006 | Hanada et al. | |
| 7,173,612 B2 | 2/2007 | Nanno et al. | |
| 7,180,513 B2 | 2/2007 | Tsuge | |
| 2001/0048106 A1 | 12/2001 | Tanada | |
| 2001/0048408 A1 | 12/2001 | Koyama et al. | |
| 2002/0008686 A1 | 1/2002 | Kumada et al. | |
| 2002/0050962 A1 | 5/2002 | Kasai | |
| 2002/0060636 A1 | 5/2002 | Kazuhiro et al. | |
| 2002/0067134 A1 | 6/2002 | Kawashima | |
| 2002/0118150 A1 | 8/2002 | Kwon | |
| 2002/0135309 A1 | 9/2002 | Okuda | |
| 2003/0043127 A1 * | 3/2003 | Satoh et al. | 345/204 |
| 2003/0052718 A1 * | 3/2003 | Takai | 327/158 |
| 2003/0071576 A1 * | 4/2003 | Koyama | 315/169.3 |
| 2003/0184568 A1 | 10/2003 | Date et al. | |
| 2005/0030264 A1 | 2/2005 | Tsuge et al. | |
| 2005/0041002 A1 | 2/2005 | Takahara et al. | |
| 2005/0057580 A1 | 3/2005 | Yamano et al. | |
| 2005/0168490 A1 | 8/2005 | Takahara | |
| 2005/0168491 A1 | 8/2005 | Takahara et al. | |
| 2005/0180083 A1 | 8/2005 | Takahara et al. | |
| 2006/0279260 A1 | 12/2006 | Tsuge | |
| 2007/0080905 A1 | 4/2007 | Takahara | |
| 2007/0120784 A1 | 5/2007 | Tsuge | |
| 2007/0126667 A1 | 6/2007 | Nakamura et al. | |
| 2007/0222718 A1 | 9/2007 | Takahara | |

FOREIGN PATENT DOCUMENTS

| | | |
|---|---|---|
| CN | 1552050 A | 12/2004 |
| EP | 0 419 255 A2 | 3/1991 |
| EP | 0 737 957 A1 | 10/1996 |
| EP | 0 821 490 A1 | 1/1998 |
| EP | 0 883 191 A2 | 12/1998 |
| EP | 1 094 436 A2 | 4/2001 |
| EP | 1 102 234 A2 | 5/2001 |
| EP | 1 130 565 A1 | 9/2001 |
| EP | 1 282 104 A1 | 2/2003 |
| JP | 58-54728 | 3/1983 |
| JP | 63-290413 A | 11/1988 |
| JP | 1-193797 | 8/1989 |
| JP | 3-57310 | 3/1991 |
| JP | 3-118168 | 5/1991 |
| JP | 4-42619 | 2/1992 |
| JP | 6-314977 | 11/1994 |
| JP | 6-314977 A | 11/1994 |
| JP | 8-234683 | 9/1996 |
| JP | 8-286639 A | 11/1996 |
| JP | 8-340243 A | 12/1996 |
| JP | 9-223967 | 8/1997 |
| JP | 9-319323 | 12/1997 |
| JP | 10-11032 A | 1/1998 |
| JP | 10-232649 | 9/1998 |
| JP | 10-319908 | 12/1998 |
| JP | 11-3048 | 1/1999 |
| JP | 11-143429 A | 5/1999 |
| JP | 11-202295 A | 7/1999 |
| JP | 11-265162 A | 9/1999 |
| JP | 11-282420 | 10/1999 |
| JP | 11-311970 | 11/1999 |
| JP | 2000-105574 A | 4/2000 |
| JP | 2000-122608 A | 4/2000 |
| JP | 2003-99001 A | 4/2000 |
| JP | 2000-293245 A | 10/2000 |
| JP | 2001-42822 A | 2/2001 |
| JP | 2001-42827 A | 2/2001 |
| JP | 2001-60076 A | 3/2001 |
| JP | 2001-84927 A | 3/2001 |
| JP | 2001-092370 A | 4/2001 |
| JP | 2001-134217 A | 5/2001 |
| JP | 2001-147659 | 5/2001 |
| JP | 2001-147675 A | 5/2001 |
| JP | 2001-195014 A | 7/2001 |
| JP | 2001-255843 A | 9/2001 |
| JP | 2001-306031 A | 11/2001 |
| JP | 2001-312243 A | 11/2001 |
| JP | 2002-40990 A | 2/2002 |
| JP | 2002-55654 A | 2/2002 |
| JP | 2002-514320 A | 5/2002 |
| JP | 2002-182612 A | 6/2002 |
| JP | 2002-518691 A | 6/2002 |
| JP | 2002-189448 A | 7/2002 |
| JP | 2002-215095 A | 7/2002 |
| JP | 2002-215096 A | 7/2002 |
| JP | 2002-287682 A | 10/2002 |
| JP | 2003-29708 A | 1/2003 |
| JP | 2003-66865 A | 3/2003 |
| JP | 2003-66906 A | 3/2003 |
| JP | 2003-66908 A | 3/2003 |
| JP | 2003-108065 A | 4/2003 |
| JP | 2003-108066 A | 4/2003 |
| JP | 2003-114644 A | 4/2003 |
| JP | 2003-114645 | 4/2003 |
| JP | 2003-150104 A | 5/2003 |
| JP | 2003-150109 A | 5/2003 |
| JP | 2003-216100 A | 7/2003 |
| JP | 2003-283267 A | 10/2003 |
| JP | 2005-266735 A | 9/2005 |
| KR | 1985-0007703 | 12/1985 |
| KR | 1999-027857 | 4/1999 |
| KR | 2001-0050632 | 6/2001 |
| KR | 2001-0062310 | 7/2001 |
| KR | 2002-0014676 | 2/2002 |
| KR | 2002-0021362 | 3/2002 |
| KR | 2003-0002464 | 1/2003 |
| KR | 2003-0022084 | 3/2003 |
| WO | WO 97-29548 A1 | 8/1997 |
| WO | WO 98/33165 | 7/1998 |

| WO | WO 98/48403 A1 | 10/1998 |
| WO | WO 99/50817 | 10/1999 |
| WO | WO 99/65011 A2 | 12/1999 |
| WO | WO 99/65012 A2 | 12/1999 |
| WO | WO 01/006484 | 1/2001 |
| WO | WO 03/023750 A1 | 3/2003 |
| WO | WO 03/023752 A1 | 3/2003 |
| WO | 03/027998 | 4/2003 |

* cited by examiner

Fig. 14 (a)

| GRADA-TION | TRANSISTOR GROUP | TRANSISTOR GROUP CHARACTERISTICS | | |
|---|---|---|---|---|
| | | CHANNEL WIDTH [μm] | CHANNEL LENGTH [μm] | OUTPUT CURRENT FLUCTUATION [%] |
| 1 | 241a | 3.0 | 54 | 2.5 |
| 2 | 241b | | | 1.8 |
| 4 | 242a | 6.0 | 27 | 2.5 |
| 8 | 242b | | | 1.8 |
| 16 | 242c | | | 1.3 |
| 32 | 242d | | | 0.9 |
| 64 | 242e | | | 0.6 |
| 128 | 242f | | | 0.5 |

Fig. 14 (b)

| GRADA-TION | TRANSISTOR GROUP | TRANSISTOR GROUP CHARACTERISTICS | | |
|---|---|---|---|---|
| | | CHANNEL WIDTH [μm] | CHANNEL LENGTH [μm] | OUTPUT CURRENT FLUCTUATION [%] |
| 1 | 241a | 1.5 | 27 | 5.0 |
| 2 | 241b | | | 3.5 |
| 4 | 242a | 6.0 | 27 | 2.5 |
| 8 | 242b | | | 1.8 |
| 16 | 242c | | | 1.3 |
| 32 | 242d | | | 0.9 |
| 64 | 242e | | | 0.6 |
| 128 | 242f | | | 0.5 |

CURRENT OUTPUT TYPE OF SEMICONDUCTOR CIRCUIT, SOURCE DRIVER FOR DISPLAY DRIVE, DISPLAY DEVICE, AND CURRENT OUTPUT METHOD

TECHNICAL FIELD

The present invention relates to a driving semiconductor circuit of performing current output which is used for a display device of performing gradation display according to an amount of current such as an organic field luminous element.

BACKGROUND ART

An organic luminous element is hopeful for a display device of the next generation, because the organic luminous element is a self-luminous element, and therefore, for example, the device does not require a backlight required in a liquid crystal display device, and has a wide viewing angle.

A sectional view of an element structure of a general organic luminous element is shown in FIG. 4. The organic luminous element has a structure in which an organic layer 42 is sandwiched by a cathode 41 and an anode 43. When a DC power supply 44 is connected to this organic luminous element, holes and electrons are injected into the organic layer 42 from the anode 43 and the cathode 41, respectively. The injected holes and electrons move to the counter electrodes in the organic layer 42 due to an electric field formed by the power supply 44. The electrons and the holes are combined again within the organic layer 42 in the course of the movement to generate excitons. Luminescence is observed in a process in which energy of the excitons is deactivated. Luminescent colors are different depending upon energy inherent in the excitons, and light having a wavelength of energy substantially corresponding to a value of an energy band gap inherent in the organic layer 42 is generated.

In order to take out the light generated in the organic layer to the outside, a material, which is transparent in a visible light region, is used for at least one of the electrodes. A material, which has a low work function, is used for the cathode in order to facilitate injection of electrons into the organic layer. For example, a material such as aluminum, magnesium, or calcium is used. A material such as an alloy of these metals or aluminum-lithium alloy may be used for durability and a lower work function.

On the other hand, a material having a large ionization potential is used for the anode owing to its easiness to inject holes. In addition, since the cathode does not have transparency, a transparent material is often used for this electrode. Therefore, in general, an ITO (Indium Tin Oxide), gold, indium zinc oxide (IZO), or the like is used.

In recent years, in an organic luminous element using a low molecular material, in order to improve luminous efficiency, the organic layer 42 may be constituted by plural layers. This makes it possible to share functions of carrier injection, carrier movement to a luminous field, and emission of light having a predetermined wavelength in the respective layers. Furthermore, it becomes possible to create an organic luminous element with higher efficiency by using materials with high efficiency for the respective layers.

Luminance of the organic luminous element formed in this way is proportional to a current as shown in FIG. 5(a) and is in a nonlinear relation with respect to a voltage as shown in FIG. 5(b). Therefore, in order to perform gradation control, it is better to control the organic luminous element according to a value of current.

In the case of an active matrix type, display devices are distributed into those of two systems, namely, a voltage drive system and a current drive system.

The voltage drive system is a method of using a source driver of a voltage output type, converting a voltage into a current inside a pixel, and supplying the converted current to organic luminous elements.

In this method, since voltage/current conversion is performed by a transistor provided for each pixel, there is a problem in that fluctuation in output currents occurs and unevenness in luminance is caused according to fluctuation in characteristics of this transistor.

The current drive system is a method of using a source driver of a current output type, giving only a function of retaining a value of current, which is outputted for one horizontal scanning period, inside a pixel, and supplying the same value of current as the source driver to organic luminous elements.

Examples of the current drive system are shown in FIG. 6. The system of FIG. 6 uses a current copier system in a pixel circuit.

A circuit at the time of operation of a pixel 67 in FIG. 6 is shown in FIG. 7.

When a pixel is selected, as shown in FIG. 7(a), a signal is outputted from a gate driver 35 such that a gate signal line 61a of a row of the pixel brings a switch into a conduction state and a gate signal line 61b of the line brings a switch into a non-conduction state. A state of the pixel circuit at this point is shown in FIG. 7(a). At this point, a current flowing to the source signal line 60, which is a current attracted into a source driver 36, flows through a path indicated by dotted line 71. Thus, a current identical with the current flowing to the source signal line 60 flows to a transistor 62. Then, a potential of a node 72 changes to a potential corresponding to a current/voltage characteristic of the transistor 62.

Next, when the pixel changes to an unselected state, the circuit is changed to a circuit as shown in FIG. 7(b) by the gate signal lines 61. A current flows from the EL power supply line 64 to the organic luminous element 63 through a path of dotted line indicated by 73. This current depends upon the potential of the node 72 and the current/voltage characteristic of the transistor 62.

In FIGS. 7(a) and (b), the potential of the node 72 does not change. Therefore, a drain current flowing to the identical transistor 62 is identical in FIGS. 7(a) and (b) Consequently, a current of the same value as the value of current flowing to the source signal line 60 flows to the organic luminous element 63. Even if there is fluctuation in the current/voltage characteristic of the transistor 62, values of currents 71 and 73 are not affected in principle, and uniform display without influence of fluctuation in characteristics of a transistor can be realized.

Therefore, it is necessary to use the current drive system in order to obtain uniform display. For that purpose, the source driver 36 must be a driver IC of a current output type.

An example of an output stage of a current driver IC, which outputs a value of current according to a gradation, is shown in FIG. 10. An analog current is outputted to display gradation data 54 from the current output 104 by a digital/analog conversion unit 106. The analog/digital conversion unit is constituted by plural (at least the number of bits of the gradation data 54) current sources for gradation display 103 and switches 108, and a common gate line 107 which regulates a value of current flown by one current source for gradation display 103.

In FIG. 10, an analog current is outputted in response to the input 105 of three bits. It is selected by the switches 108 whether the current sources 103 of the number corresponding to a weight of bits are connected to the current output 104, whereby a current corresponding to a gradation can be outputted in such a manner that a current equivalent to one current source 103 is outputted in the case of data 1 and a current equivalent to seven current sources 103 is outputted in the case of data 7. A current output type driver can be realized by arranging digital/analog conversion units 106 of this structure by the number corresponding to the number of outputs of the driver. In order to compensate for a temperature characteristic of the transistors 102, a voltage of the common gate line 107 is determined by a distributing mirror transistor 102. The transistor 102 and the current source group 103 are formed in a current mirror structure, and a current per one gradation is determined according to a value of a reference current 89. With this structure, an output current changes according to a gradation, and a current per one gradation is determined according to a reference current.

Examples of a display device using an organic luminous element are shown in FIGS. 21 to 23. FIG. 21 shows a television, wherein FIG. 21(a) is a perspective view of the television and FIG. 21(b) is a block diagram showing a structure of the television, FIG. 22 shows a digital camera or a digital video camera, and FIG. 23 shows a personal digital assistant. Since a response speed of the organic luminous element is high, the organic luminance element is a display panel suitable for these display devices which has many opportunities to display motion images (For example, see Japanese Patent Application Laid-open No. 2001-147659).

In a current driver as shown in FIG. 10, transistors 103 of an identical size are arranged in a number equivalent to "number of gradations−1") and the number of transistors 103 connected to outputs is changed with respect to input data, whereby current output is performed. Therefore, a gradation and an output current are in a proportional relation. When this current is outputted directly, an image looks whitish generally due to human visual characteristics. (A low gradation side is whitish.)

In a drive device for a general display, an output according to each gradation is subjected to gamma correction. In the case of a liquid crystal display, since the liquid crystal display is voltage drive, a voltage value corresponding to each gradation is required. (In the case of a voltage, since it is impossible to represent a gradation according to addition of gradation components unlike the case of a current, a voltage is required for each gradation.) Therefore, a voltage is adjusted to a voltage value so as to be a voltage output corresponding to gamma correction and outputted at a stage of each gradation voltage. Thus, even a drive is a six-bit driver, a voltage is subjected to gamma correction, and gradation display is possible sufficiently.

On the other hand, in a current driver, since an output is not subjected to gamma correction even in the same six bits, a gradation output finer than six bits is required in order to make a pitch fine in a low gradation part. If it is attempted to achieve this with frame curtailing (FRC), frame curtailing among at least four frames is required. Moreover, since response speed of an organic luminous element is high, flicker occurs. Therefore, it is necessary to perform gradation representation without the FRC, for example, it is necessary to change an output to eight bits.

This problem is a problem peculiar to the case in which a current driver, in which a gradation and an output current are proportional, and a current output type display element, in which an input current and a luminance are proportional, are combined.

In order to eliminate gamma correction according to the FRC, it is conceivable to adopt a constitution in which an output of a current driver is increased to six bits to eight bits, gamma processing is performed before a signal is inputted to a source driver, and an eight-bit signal subjected to the gamma processing is inputted to the source driver.

As a method of expanding an output of the current driver from six bits to eight bits, there is a method of preparing 255 transistors 103. In the case of this method, four times as many transistors 103 are required compared with a conventional method (sixty-three transistors 103), and an area of the source driver also increases accordingly. Since a ratio of an area occupied by an output stage transistor in a total chip area is about seventy percent, simply speaking, the area is about three times as large as the area at the time of six bits. This imposes a significant impact in terms of cost.

In addition, in recent years, multicolor has been advanced in a portable information terminal as well, and 65,000 color or 220,000 color display has become a mainstream. In the case of an RGB digital interface, an input signal of a driver IC requires sixteen bits or eighteen bits. Therefore, sixteen to eighteen input signal lines are required only for transfer of data. Other than the input signal lines, signal lines are required for a signal for operation of a shift register, setting of various registers, and the like.

Therefore, the number of wirings increases. For example, as shown in FIG. 3, wirings between a control IC 31 and source driver ICs 36 increases with respect to a display panel 33. Consequently, there is a problem in that cost increases because, for example, a size of a flexible plate 32 increases and a multilayer substrate is used.

DISCLOSURE OF THE INVENTION

Therefore, taking into account the above-described problems, it is an object of the invention to provide a current output type semiconductor circuit that can control an increase in a circuit size to be lower even if the number of output bits of a current driver is increased, and a source driver for display drive, a display device, and a current output method using the current output type semiconductor circuit.

In addition, it is another object of the invention to provide a current output type semiconductor device in which the number of wirings is reduced, and a source driver for display drive, a display device, and a signal input/output method using the current output type semiconductor device.

The first invention is a current output type semiconductor circuit, comprising:

first current source groups that include a first unit transistor of outputting a predetermined current and output lower order N (N is a natural number) bits; and second current source groups that include a second unit transistor of outputting a current larger than the predetermined current and output higher order M (M is a natural number, (N+M)≧3) bits.

The second invention is the current output type semiconductor circuit according to the first invention, wherein a current outputted by the first unit transistor is substantially $½^N$ of a current outputted by the second unit transistor.

The third invention is the current output type semiconductor circuit according to the first invention, wherein, when it is assumed that a channel length of the first unit transistor is L1, a channel width thereof is W1, a channel length of the second unit transistor is L2, and a channel width thereof is W2, L1×W1<L2×W2.

The fourth invention is the current output type semiconductor circuit according to the third invention, wherein L2×W2 is a maximum value among values at which fluctuation in an output current of the second unit transistor is equal to or lower than an allowable value of fluctuation in an output current of the first unit transistor.

The fifth invention is the current output type semiconductor circuit according to the first invention, wherein M is six and N is two.

The sixth invention is a source driver for display drive, comprising the current output type semiconductor circuit according to the first invention.

The seventh invention is a display device, comprising:
the source driver for display drive according to the sixth invention; and
a current drive type pixel connected to the source driver.

The eighth invention is a current output method, comprising:
a step of outputting lower order N (N is a natural number) bits from first current source groups including first unit transistors of outputting a predetermined current; and
a step of outputting higher order M (M is a natural number, (N+M)≧3) bits from second current source groups including second unit transistors of outputting a current larger than the predetermined current.

The ninth invention is a current output type semiconductor device, comprising:
a driver that has a drive signal output stage of outputting at least a current signal for driving; and
a control circuit that is constituted separately from the driver and generates at least video signals and command data signals for various controls, wherein
the video signals and the command data signals are outputted from the control circuit via an identical signal line and at staggered times from each other between ON and OFF of a power supply of the control circuit and inputted to the driver.

The tenth invention is a current output type semiconductor device, comprising:
a driver for driving that has a drive signal output stage of outputting at least a current signal for driving; and
a control circuit that is constituted separately from the driver and generates at least video signals and command data signals for various controls, wherein
the video signals are outputted via an identical signal line and at staggered times from each other for each video signal corresponding to each color of the three primary colors between ON and OFF of a power supply of the control circuit.

The eleventh invention is the current output type semiconductor device according to the ninth or the tenth invention, comprising a distribution circuit of distributing a signal inputted to the driver into the video signals and the command data signals.

The twelfth invention is a source driver for display device driving, comprising the current output type semiconductor device of the ninth or the tenth invention.

The thirteenth invention is a display device, comprising the source driver for display device driving of the twelfth invention.

The fourteenth invention is a signal input/output method, comprising:
a step of outputting at least a current signal for driving from a driver including a drive signal output stage;
a step of generating at least video signals and command data signals for various controls from a control circuit constituted separately from the driver; and
a step of inputting the video signals and the command data signals to the driver via an identical signal line from the control circuit and at staggered times from each other between ON and OFF of a power supply.

According to the current output type semiconductor circuit, the drive device for display, the display device, and the current output method of the invention, even if the number of output bits of a current driver is increased, an increase in a circuit size can be controlled to be lower.

BRIEF DESCRIPTION OF THE DRAWINGS

FIG. 14(a) is a diagram showing a relation between a channel size of a transistor constituting each transistor group and fluctuation;

FIG. 14(b) is a diagram showing a relation between a channel size of a transistor constituting each transistor group and fluctuation;

DESCRIPTION OF SYMBOLS

Figure 1:
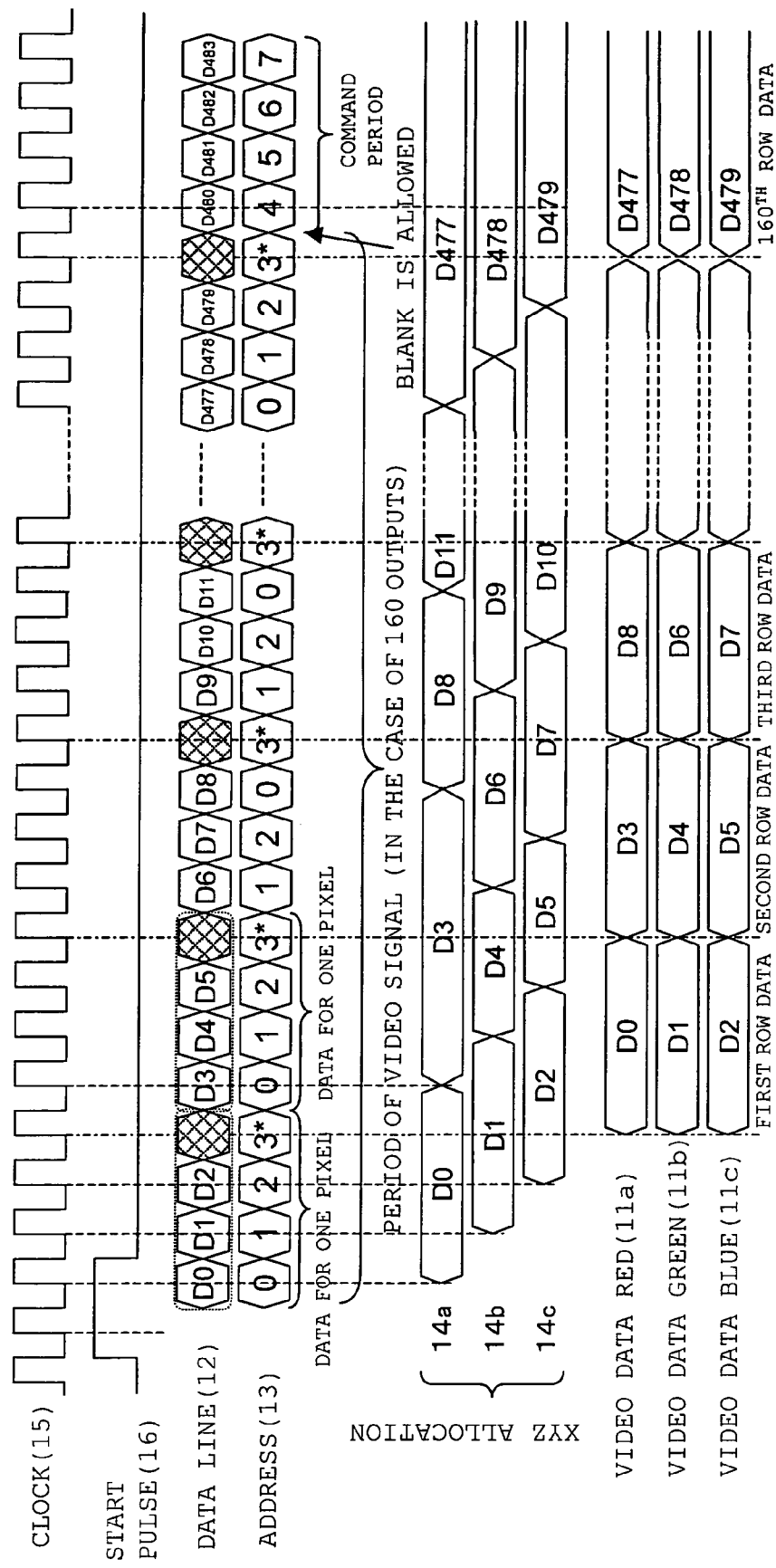
FIG. 1 is a diagram showing an external connection wire bound at the time when plural reference current generation units of driver ICs are used in an embodiment of the present invention.

11 Video data
12 Data line
13 Address
14 Data after distribution
15 Clock
16 Start pulse
20 Electronic volume control signal
31 Control IC
32 Flexible substrate
33 Display panel
34 Display area
35 Gate driver
36 Current output type source driver IC
41 Cathode
42 Organic layer
43 Anode
44 Power supply
51 Output enable
54 Gradation data
65 Accumulation capacitance
81 Resistance
82 Operational amplifier
84 Transistor
85 Resistance
86 Voltage adjustment unit
87 Power supply line
88 Switching means (switch)
89 Control data
102 Reference current line
103 Mirror transistor for distribution
104 Current source for gradation display
106 Current output
107 Digital analog conversion unit 108 Common gate line
181 Switch
203 Clock B
203 EL power supply line
204a Gate signal line 1
204b Gate signal line 2
214 Video signal
215 Housing
221 Body
222 Photographic section
223 Shutter switch
224 Finder
225 Display panel
231 Antenna
232 Key
233 Housing
234 Display panel
241 Transistor
311 Substrate
313 EL power supply line
388 Pre-charge voltage signal

BEST MODE FOR CARRYING OUT THE INVENTION

Embodiment 1

The structure and the operation of the current output type semiconductor circuit in embodiment 1 of the present invention will be hereinafter described with reference to the drawings.

Figure 24:
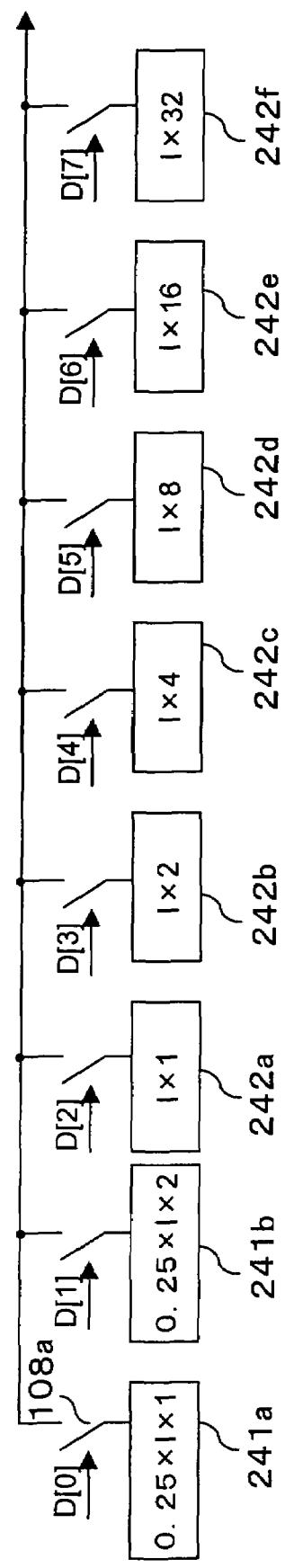
FIG. 24 is a diagram showing a concept of a current output unit of a semiconductor circuit using an embodiment of the invention.

In the current output type semiconductor circuit of the invention, two bits to be added are added on a lower order side of the conventional six bits. Therefore, a current source, which outputs one fourth of a current value of a current source for gradation display 103 used for six-bit output in the past, is prepared, and 256 gradation output is performed by adding three units of such current sources. FIG. 24 shows a conceptual diagram of a current output stage of performing eight-bit output.

Since the number of transistors to be increased by increasing six bits to eight bits is three, it is possible to realize a structure in which an increase in a circuit size is small compared with the case in which two bits are added on a higher order side.

Figure 8:
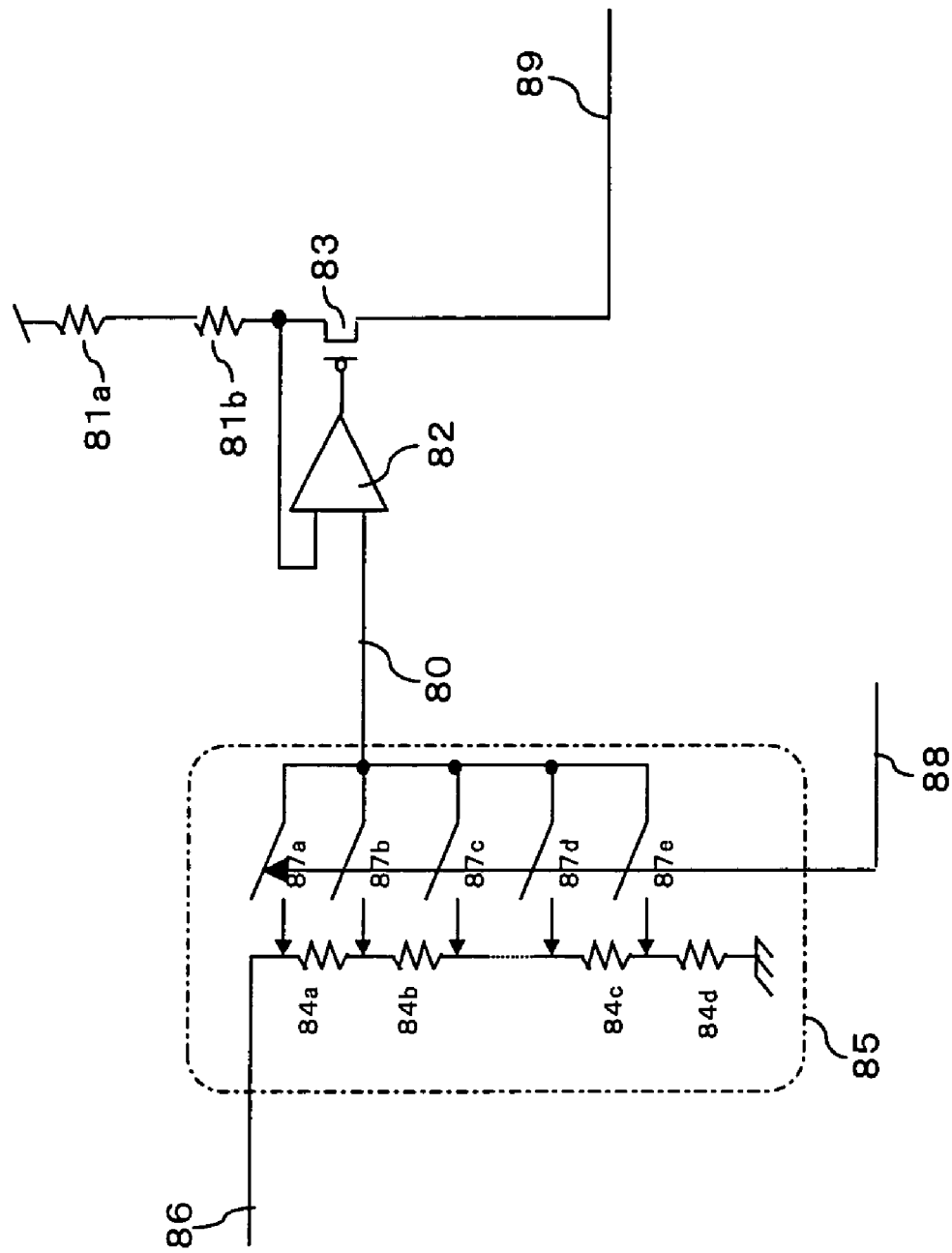
FIG. 8 is a diagram showing an example of a constant current source circuit.

A value of "I" only has to be adjusted for adjustment of a current value in a white display (maximum gradation display), and this value of "I" can be changed if a reference current 89 in a structure of FIG. 8 is controlled. Thus, the adjustment is realized by inputting control data 88 according to an application.

Figure 25:
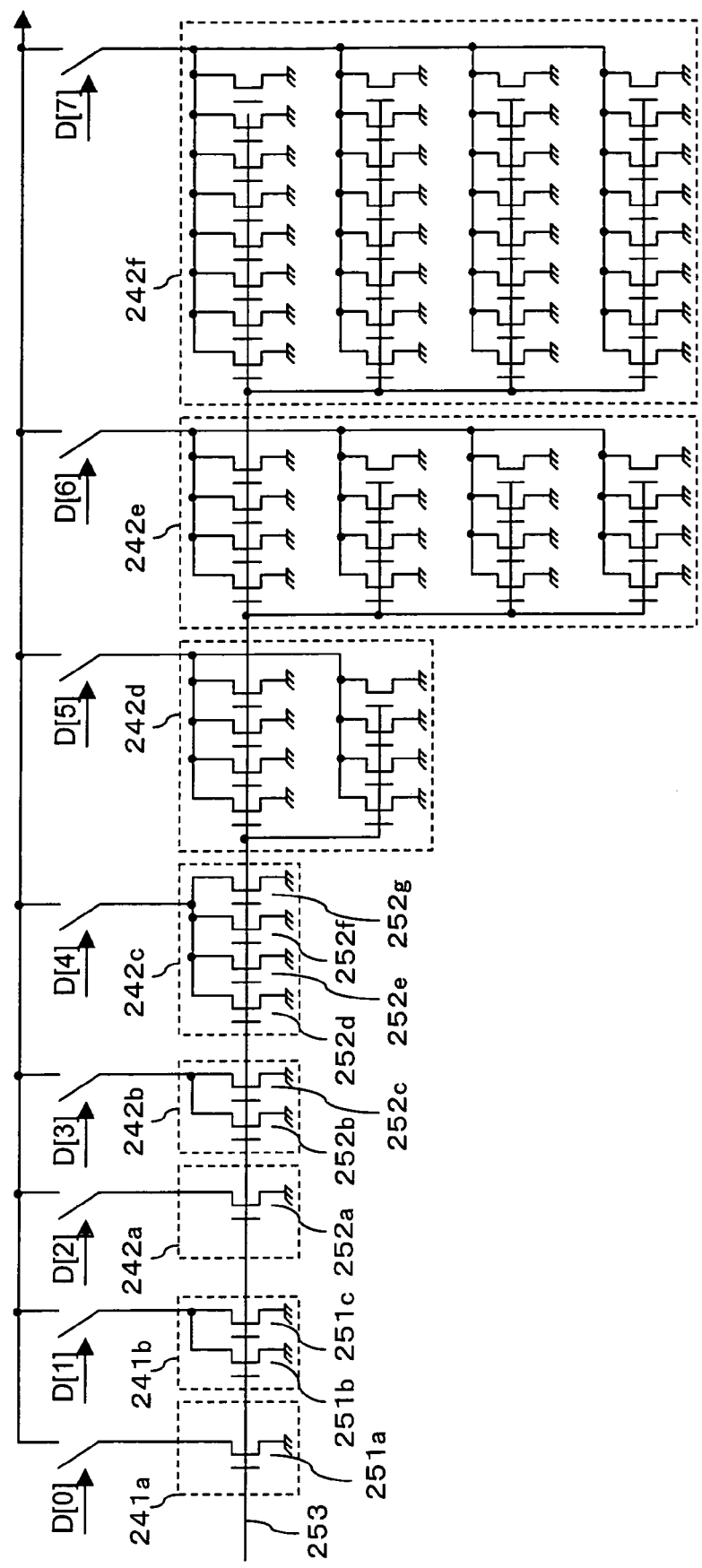
FIG. 25 is a diagram showing a case in which a current source is constituted by a transistor in a structure of FIG. 24.

FIG. 25 shows an example at the time when a structure of FIG. 24 is realized by transistors. A transistor 252 for higher order six bits corresponds to a first unit transistor of the invention as an example, and a transistor 251 for lower order two bits corresponds to a second unit transistor of the invention as an example. Transistor groups 241a and 241b correspond to a first current source group of the invention as an example, and transistor groups 242a, 242b, 242c, 242d, 242e, and 242f correspond to a second current source group of the invention as an example. With respect to input video signal data D [7:0], a weight for each bit is represented by changing the number of transistors connected to an output between D[0] and D[1] and between D[2] and D[7], and weighting between lower order two bits and higher order four bits is determined according to a channel width of a transistor. Transistors 251 and 252 are designed such that a channel width of the transistor 252 is about four times as large as that of the transistor 251. However, since a ratio of channel widths and a ratio of output currents are not exactly the same, an output stage with a higher gradation property can be constituted by determining a ratio of channel widths of transistors between 3.3 times and four times on the basis of simulation or actually measured data of a TEG transistor.

Figure 26:
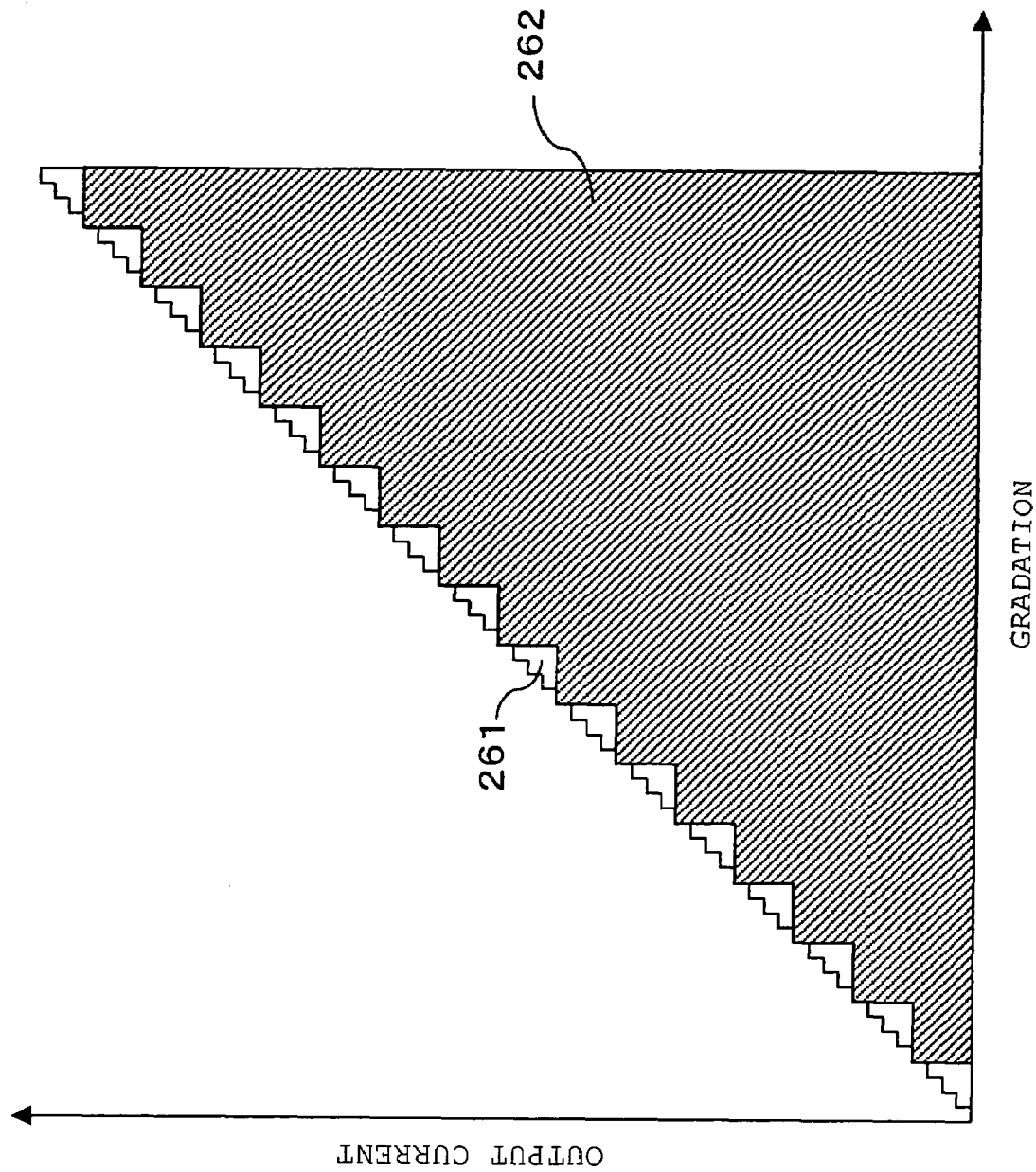
FIG. 26 is a diagram showing a relation between a gradation of an input signal and an output current by a current output unit shown in FIG. 24 or FIG. 25.

An output current is determined by the number of current source transistors connected to each bit, and an output current is changed in a form of accumulating a current amount flowing to one transistor by the number of current source transistors. In the case of eight-bit output in FIG. 24 and FIG. 25, a gradation and an output current characteristics are as shown in FIG. 26. (Note that only lower order sixty-four gradations are shown in the figure on account of limited space.) A current indicated by an area of 262 is outputted by transistors 252 of higher order six bits, and a current indicated by an area of 261 is outputted by transistors 251 of lower two bits. Since a current value of the current of 262 is changed according to a difference of the number of transistors, fluctuation in a pitch width can be reduced to 1% or less. Since most of an output current is in the part of 262, even if fluctuation occurs slightly in a current in the part of 261, linearity of gradations is not affected. In addition, even if a pitch width of 261 increases or decreases compared with a predetermined value, a part of a different pitch width appears only once in four gradations, which does not matter practically when a ratio of 262 and 261 with respect to the output current is taken into account. In a low gradation area where a current ratio of 262 is small, a luminance difference is hardly recognized due to a characteristic of human eyes, and fluctuation in a pitch width is less conspicuous. Thus, no problem is caused.

Since output fluctuation between adjacent terminals due to the transistors 252 for higher order six bits is identical with output fluctuation of a six-bit driver, it has been confirmed that fluctuation is within 2.5% and vertical streaks due to output current fluctuation does not occur.

On the other hand, with transistors for two bits added a new, since a channel area of the transistors decreases when a channel width is simply reduced to one quarter, fluctuation increases to exceed 2.5%. (Output current fluctuation between adjacent terminals is inversely proportional to a square root of a transistor area.)

Figure 19:
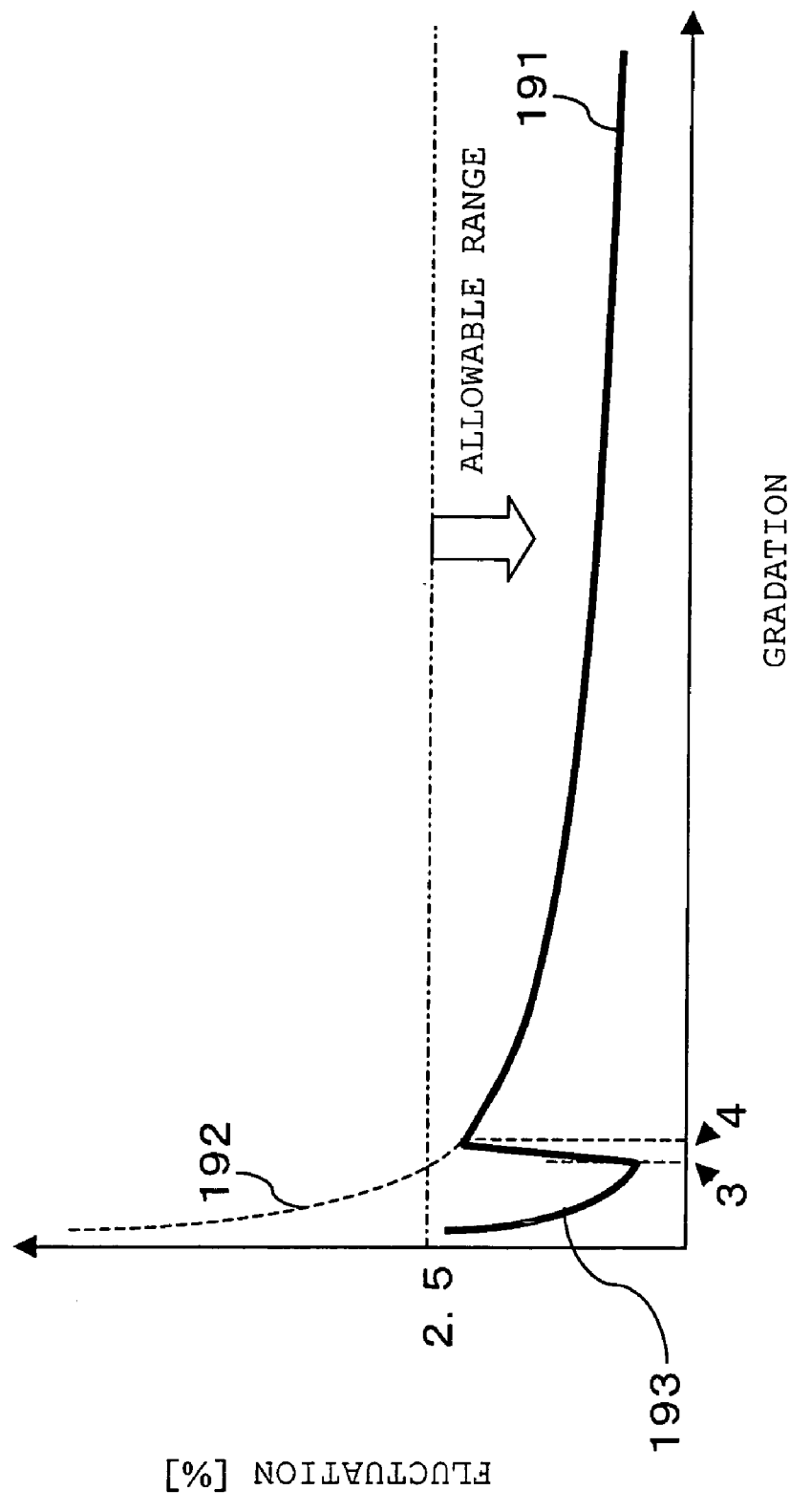
FIG. 19 is a diagram showing a relation between fluctuation between adjacent terminals of an output current in a source driver using an output stage shown in FIG. 25 and FIG. 14(a) and a gradation.

FIG. 19 shows a relation between a gradation and fluctuation in a current between adjacent terminals in the structure of the output stage in FIG. 25. In the case in which a size of the transistors 251 for lower order two bits is simply reduced, this results in a relation of a gradation and fluctuation indicated by a solid line 191 and a broken line 192. There is a problem in that fluctuation exceeds 2.5% at a gradation 3 or less. FIG. 14(b) shows a relation between fluctuation and a gradation in the case in which a channel width is simply reduced to one quarter. This relation is not allowable because fluctuation exceeds 2.5% at gradations 1 to 3.

Thus, in the invention, only the three transistors 251 contributing to outputs at the gradations 1 to 3 maintain a value of (transistor channel width)/(transistor channel length), an output current is not changed, and a channel width and a channel length are increased to increase a channel area, whereby fluctuation is reduced. FIG. 14(a) shows an example. In this case, both the channel length and the channel width are increased by two-fold and the channel area is increased by four-fold, whereby fluctuation is reduced to 2.5% or less at all gradations.

Note that, in this example, a logical numerical value is referred to. Actually, channel widths of the transistor group 241a and the transistor group 241b are larger than this value.

Since the channel widths are created to be larger, the channel widths tend to have a margin with respect to fluctuation in an output current. Thus, it is sufficient to calculate and design the channel widths according to a logical value and change the channel widths on the basis of actually measured data finally.

Since an increase in a chip area according to this method is 1.05 times as large with respect to seventy percent of the entire area, the entire area increases by about 1.04 times. Thus, display with a small rate of increase and invisible fluctuation becomes possible. In addition, the relation between a gradation and fluctuation also changes to a relation indicated by solid lines 191 and 193 shown in FIG. 19, and fluctuation of 2.5% is realized in all gradations.

Moreover, since the transistor group 241 and the transistor group 242 are formed in different sizes, respectively, current output of the transistor group 241 increases or decreases with respect to current output of the transistor group 242 due to deviation of a simulation and an actually measured value.

Even if a current output of the transistor group 241 can be reduced with respect to an output current of the transistor group 242, gradation reversal does not occur because an output is not zero or a negative current does not flow. Thus, no problem is caused.

On the other hand, in the case in which a current output of the transistor group 241 increases with respect to an output current of the transistor group 242, it is likely that gradation reversal occurs between adjacent gradations which are a gradation at which the transistors of the transistor group 241 contribute to output, and a gradation at which the transistors do not contribute to output. For example, gradation reversal is likely to occur between the gradations 3 and 4 or between the gradations 127 and 128.

Figure 36:
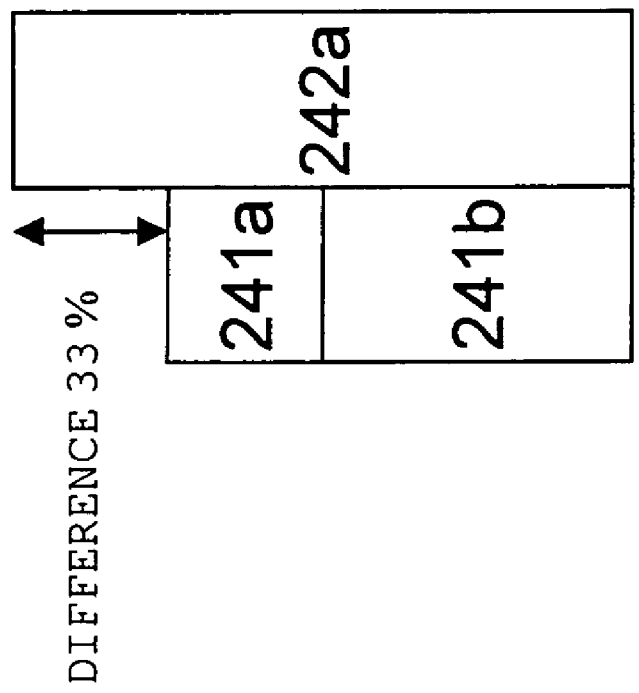
FIG. 36 is a diagram showing a gradation difference between a gradation 3 and a gradation 4.

Between the gradations 3 and 4, there is a luminance difference of 33% as shown in FIG. 36. Since output fluctuation is about 2.5% as shown in FIG. 14, even if fluctuation occurs in a direction in which a gradation difference decreases, there is still a difference of 30%. Therefore, there is no problem even if an actual current output of the transistor group 241 increases by 30% compared with a simulation value.

Figure 33:
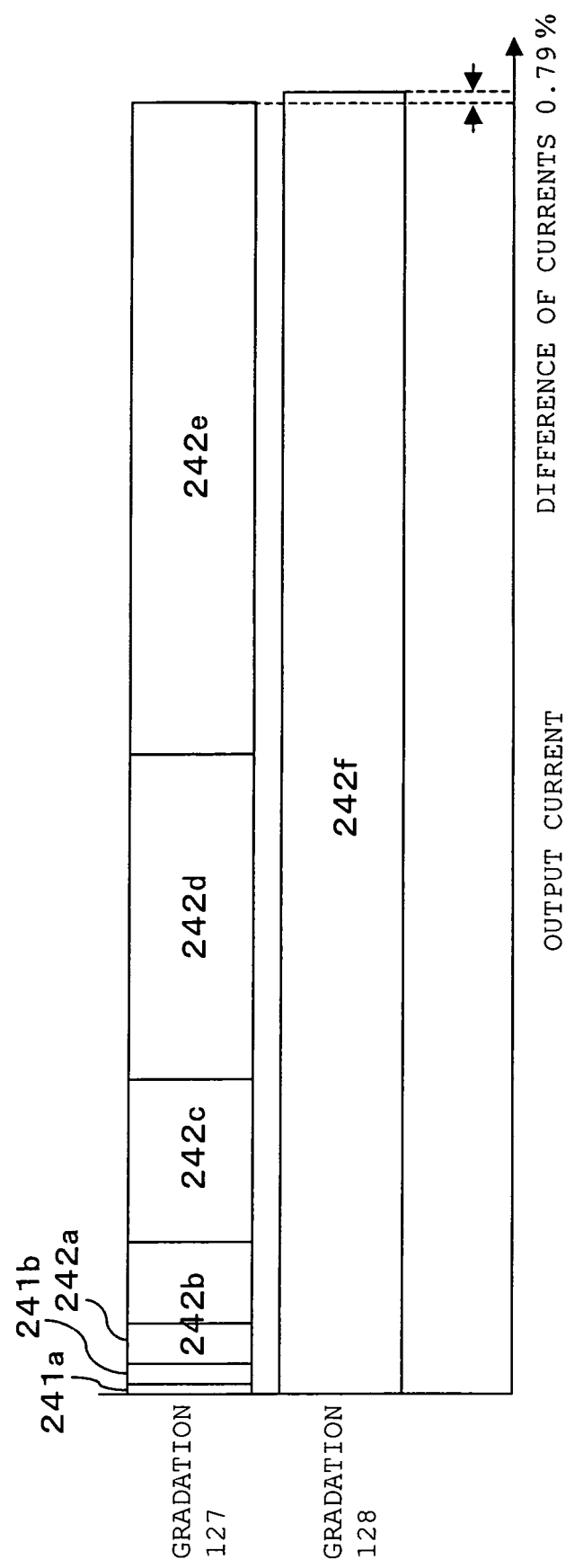
FIG. 33 is a diagram showing a difference of currents in a gradation 127 and a gradation 128.

Between the gradations 127 and 128, there is a gradation difference of 0.79% as shown in FIG. 33. Since 124 gradations of the gradation 127 and the gradation 128 are outputted by the transistors 242 of the identical size, fluctuation is about 0.5% as in the fluctuation between adjacent gradations. Therefore, it is likely that a gradation difference decreases to 0.29% at the minimum. Even if a current generated by the transistors of the transistor group 241 increases, the gradation difference only has to be controlled to 0.29% as a whole. Gradation reversal does not occur if a current of the transistors of the transistor group 241 is 12.3% at the maximum.

Figure 37:
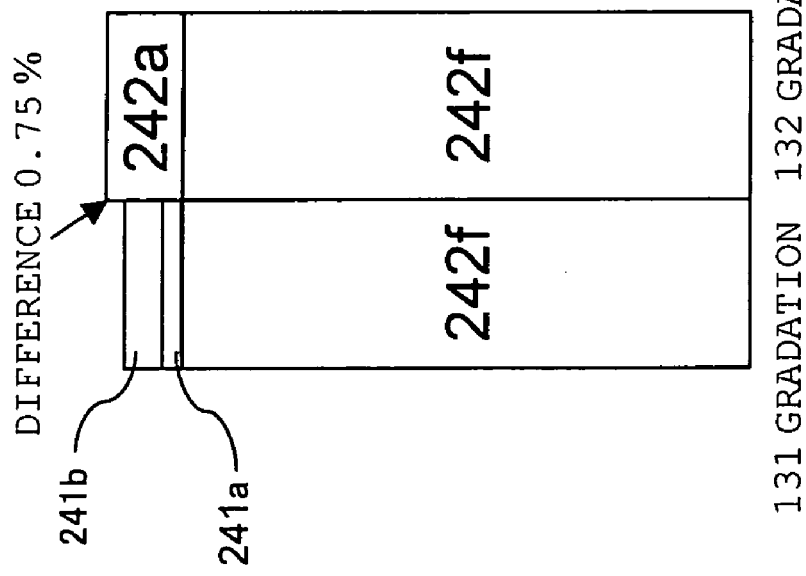
FIG. 37 is a diagram showing a gradation difference between a gradation 131 and a gradation 132.

In the case in which a gradation exceeds the gradation 128, for example, between the gradations 131 and 132, a gradation difference is 0.75% as shown in FIG. 37. However, all the transistors have a current output of a transistor group 242f, and three transistor groups of the transistor group 242a, the transistor group 241a, and the transistor group 241b have different current outputs. A current of the transistor group 242a is one thirty-seconds compared with the transistor group 242f, and a change of a current value due to fluctuation in the transistors decreases compared with the case of 128 gradations or less. In this case, it is likely that a luminance difference decreases by 0.08% and, as a result, the luminance difference is 0.67% even if there is fluctuation in the transistors. Since the luminance difference increases compared with that between the gradations 127 and 128 and a ratio occupied by current output of the transistor group 241 decreases, there is no problem even if a current of the transistors of the transistor group 241 increases compared with at least that between the gradations 127 and 128.

Figure 34:
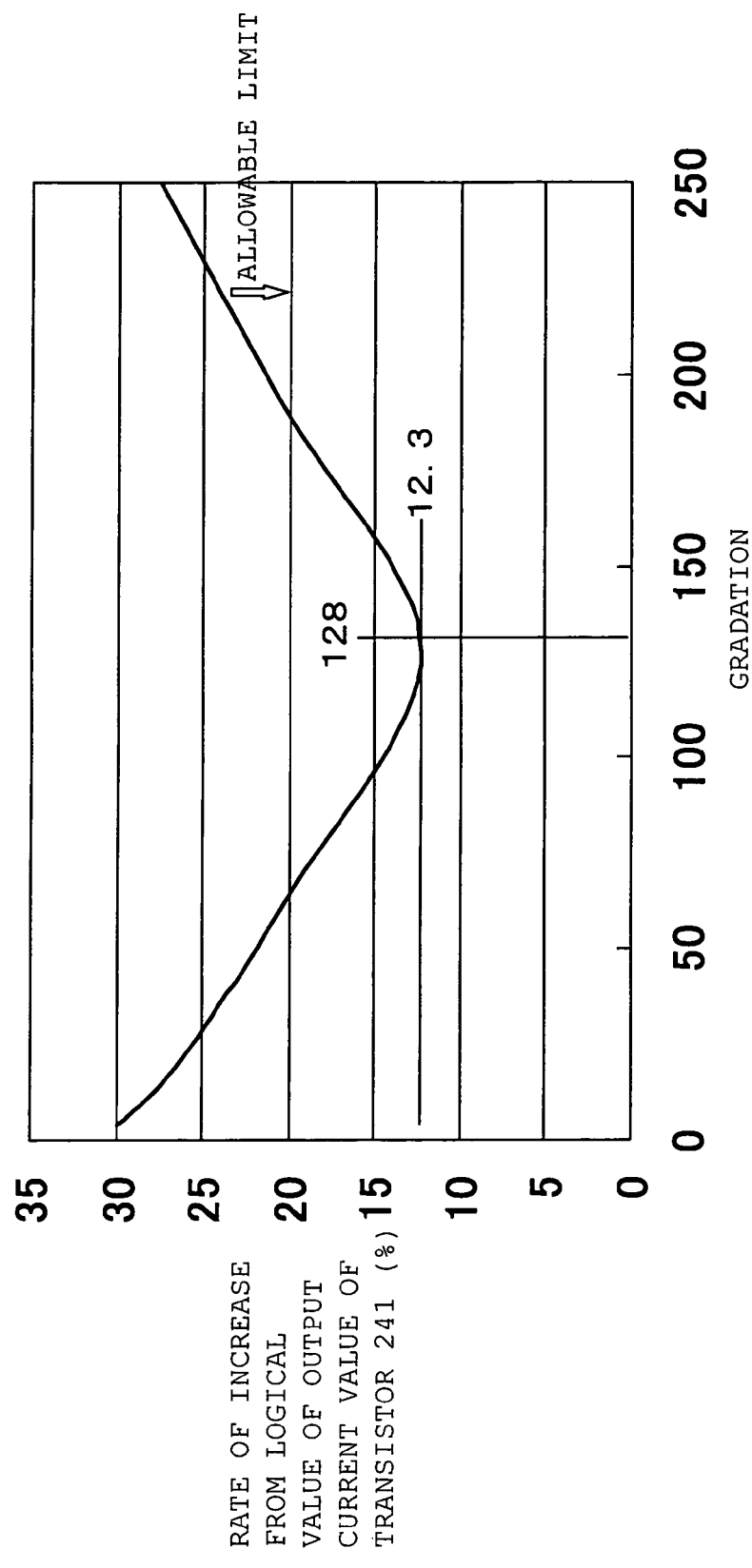
FIG. 34 is a diagram showing a relation between an allowable limit of deviation from a logical value of an output current value of a transistor 241 and a display gradation in a driver of 256 gradation display in FIG. 25.

FIG. 34 shows a relation between a range, in which gradation reversal does not occur even if a current amount of the transistors of the transistor group 241 exceeds a simulation value (logical value), and a display gradation.

According to FIG. 34, deviation from the logical value is not allowed most is between the gradations 127 and 128. In this case, deviation is 12.3%. If an actual value does not deviate from the logical value at least by 12%, current output can be realized without causing gradation reversal.

In the eight-bit driver in the structure of FIG. 24 and FIG. 25, even if a transistor size of lower order two bits (outputted by the transistor group 241) and higher order six bits (outputted by the transistor group 242) is changed, it becomes possible to perform display without gradation reversal.

Figure 32:
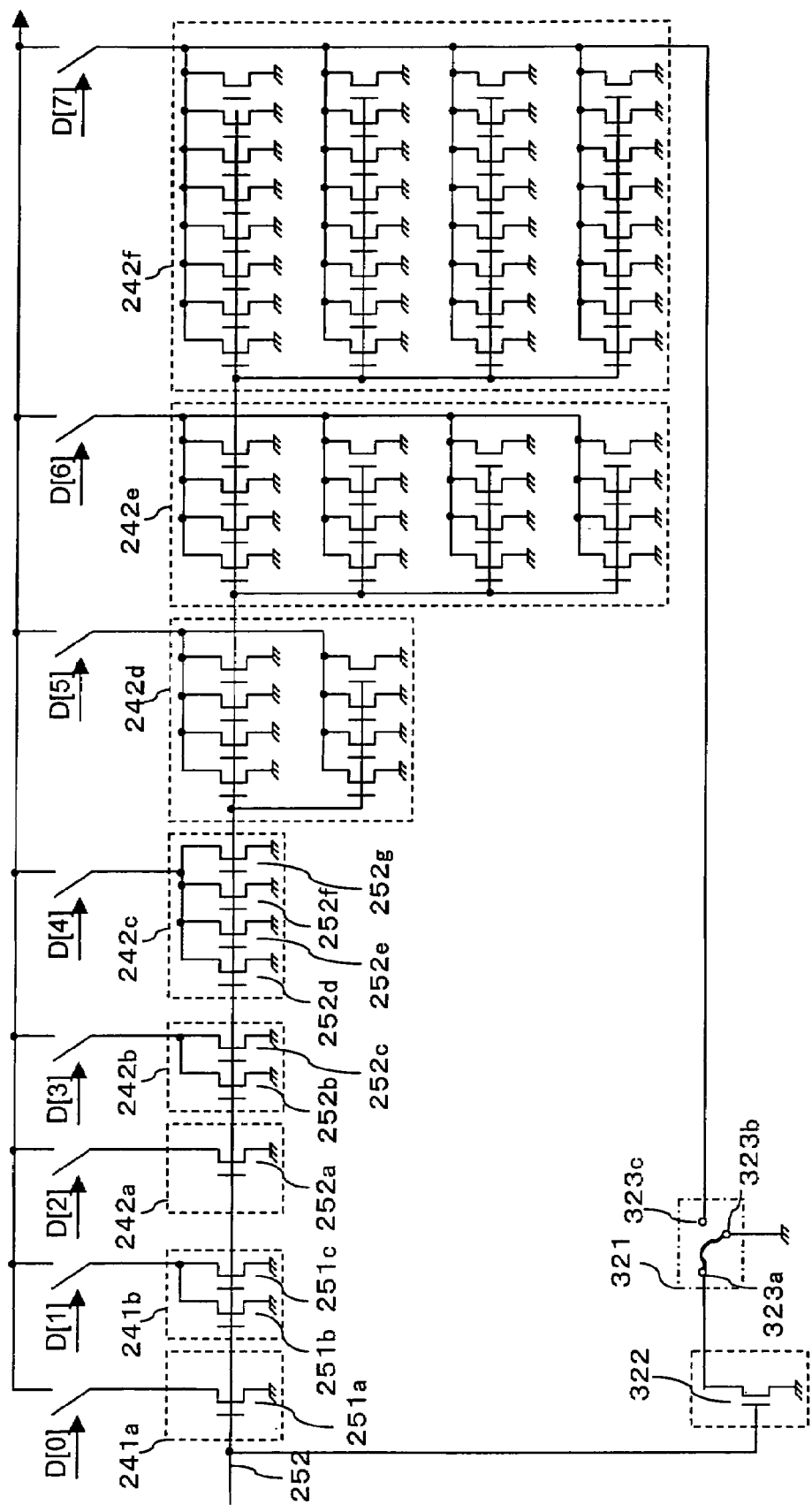
FIG. 32 is a diagram showing a structure in which a current source can be further added to a current source corresponding to a most significant bit in a structure of an output stage in which a relation of magnitudes of currents between lower order two bits and higher order six bits is adjusted according to a transistor channel width with respect to an eight-bit video input and a current is changed according to the number of transistors in each bit.

FIG. 32 shows a circuit structure of one output of a current output stage 23 in which, since gradation reversal occurs between the gradation 127 and the gradation 128 most easily, a circuit of eliminating gradation reversal with repair even in the case in which gradation reversal occurs between these two gradations is incorporated.

Compared with the structure in FIG. 25, the circuit structure is characterized in that a transistor for current increase 322 and a switching unit 321 are added at the 128 gradation or more.

There are three terminals 323 in the switching unit 321, and the terminals 323 are connected to the transistor for current increase 322, a ground potential, and the current source 242f, respectively.

Usually, in the switching unit 321, 323a and 323b are connected, and 323c is in an unconnected state. Therefore, the transistor for current increase 322 does not affect current output. The circuit is shipped in this state when there is no gradation reversal.

On the other hand, in the case in which gradation reversal occurs when a current of the transistor group 241 increases, in order to increase a current at the 128 gradation or more to prevent gradation reversal, connection of the switching unit 321 is changed by a laser or the like to connect the terminals 323a and 323c.

Consequently, a current at the 128 gradation or more increases, and gradation reversal can be prevented.

It is assumed that a current of the transistor for current increase 322 is a current equivalent to about 10% of a current of the transistor group 241a. Since reversal occurs between the 127 and 128 gradations when a current of the transistor group 241 exceeds 12.3%, in order to remedy the reversal, the current of the transistor for current increase 322 is set to about 10% of the current of the transistor group 241a. When a current of the transistor group 241 deviates by 22%, gradation reversal between the 127 and 128 gradations cannot be prevented. However, in this case, gradation reversal also occurs between 63 and 64 gradations already. Since correction between the 63 and 64 gradations is impossible with this circuit, it is unnecessary to take into account the deviation of 22%.

Therefore, in the invention, the circuit is constituted such that only gradation reversal can be remedied only between gradations in which gradation reversal occurs most easily. Thus, a current of the transistor for current increase 322 only has to be about 10% of a current of the transistor group 241a.

An influence by this transistor for current increase 322 on fluctuation between adjacent gradations is 0.8% of the entire circuit because an output current of 322 is 1/1280 with respect to a current at the 128 gradation. Thus the influence can be neglected. The transistor for current increase 322 may be created with a size of the transistor group 241*a* or about one quarter of the transistor group 241*a*.

Since the switching unit 321 is provided in each output, a driver IC with less likelihood of gradation reversal is realized. Consequently, a defective product can be changed to a non-defective product by laser processing or the like, and it can be expected that yield is increased.

However, if laser processing is performed for each output, an increase in man-hour and an increase in cost due to time consumed for the processing are caused. It is likely that a price does not fall so much as an effect of the increase of yield.

Figure 39:
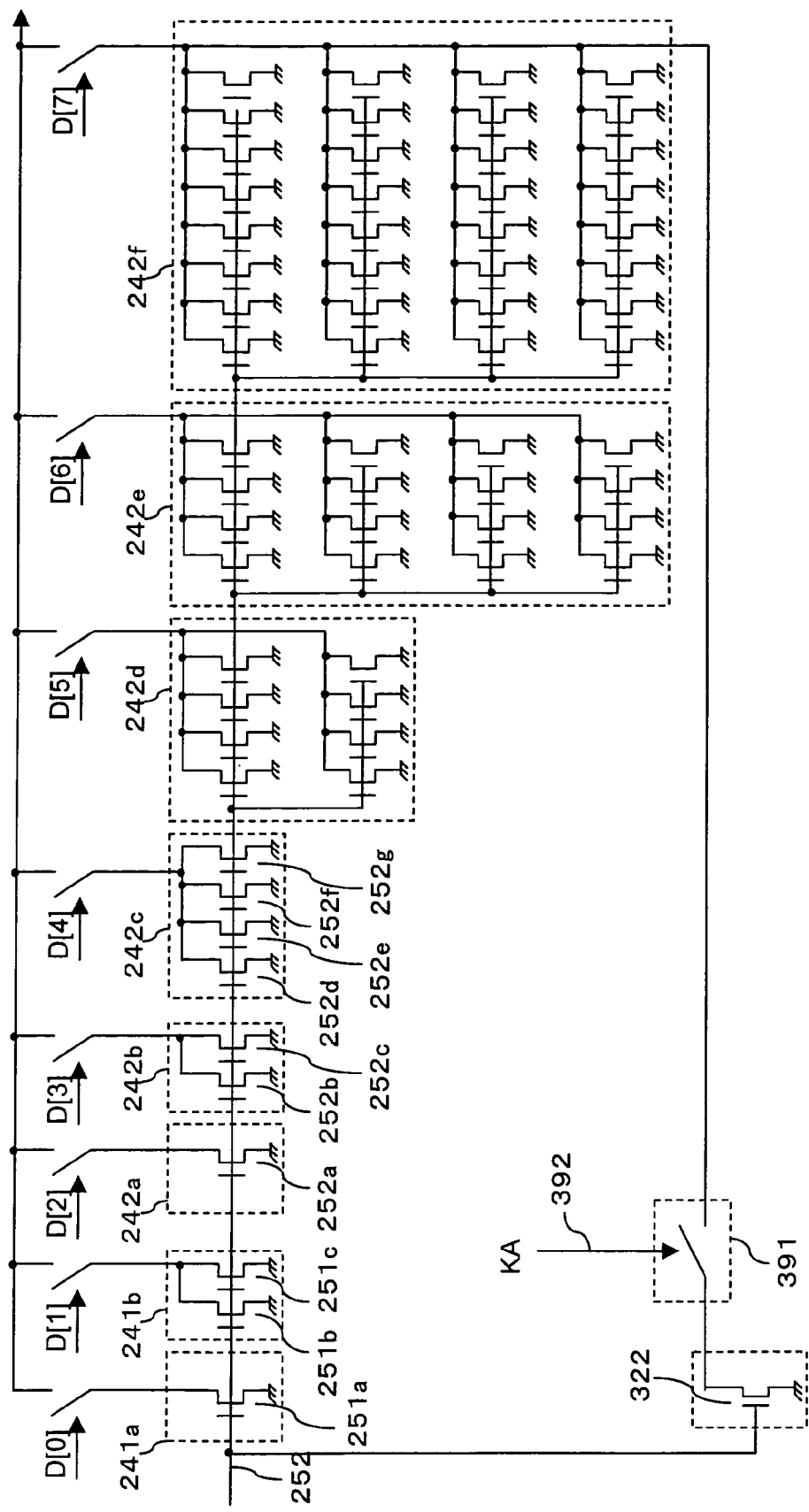
FIG. 39 is a diagram showing a current output stage with a function for raising a current of a most significant bit current source at the time when a raising signal line is used.

Thus, as shown in FIG. 39, a structure is devised in which a current at 128th gradation can be raised easily using a raising signal 392 with an external command input by connecting the transistor for current increase 322 and the current source 242*f* via switching means 391 and controlling the switching means 391 with the raising signal 392.

A raising signal 612 may be set for each output. However, in this case, a latch of holding a value of the raising signal 612 for each signal line is necessary. It is possible to distribute a signal to each latch by an input of the raising signal 392 of one bit if a shift register used for distributing a video signal is shared. However, there is a problem in that a circuit size increases because the latches are provided in a number equivalent to the number of signal lines. The number of bits of data, which a latch unit 22 should hold, increases by one bit in each source line. In the case in which a circuit size may increase or in the case in which an area occupied by the latch unit in an entire area is reduced by using a refining process, a raising signal may be controlled to determine whether a current is to be raised for each output. However, in the case in which gradation reversal occurs, since the gradation reversal occurs when a simulation value and an actually measured value are far different, basically, judgment on necessity of the transistor for current increase 322 should be made for all terminals in common.

Thus, the raising signal line 392 is set to be one common signal line in one source driver, and it is determined whether a current at the 128 gradation or more is increased at all outputs according to control of this signal line.

Figure 43:
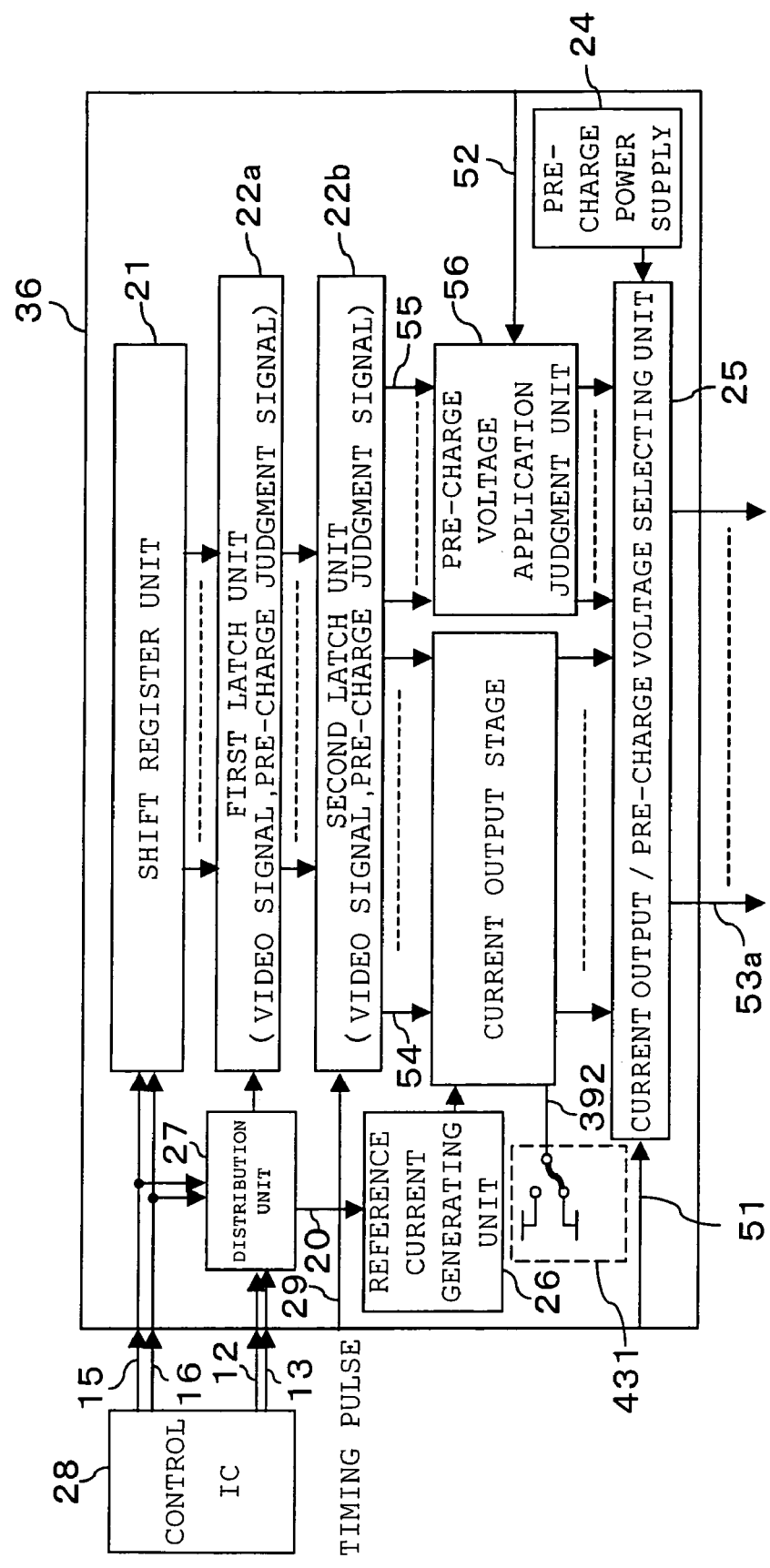
FIG. 43 is a diagram showing an example of a structure of a source driver having a function for, in the case in which gradation reversal has occurred, eliminating the gradation reversal by changing a level of a raising signal.

For example, this signal line is set to a low level usually to bring the switching unit 391 in a nonconductive state. However, if all outputs are controlled collectively by switching the raising signal line 392 to a high level with laser processing, repair can be implemented in a short period. This is realizable if a circuit 431 as shown in FIG. 43 is formed.

Moreover, in the case in which a ROM 351 can be constituted in the inside of a source driver IC 36, a value of the ROM 351 may be written according to an external control signal so as to switch the raising signal line 392 to the high level in an IC in which gradation reversal has occurred and switch the raising signal line 392 to the low level in an IC in which gradation reversal has not occurred.

Figure 35:
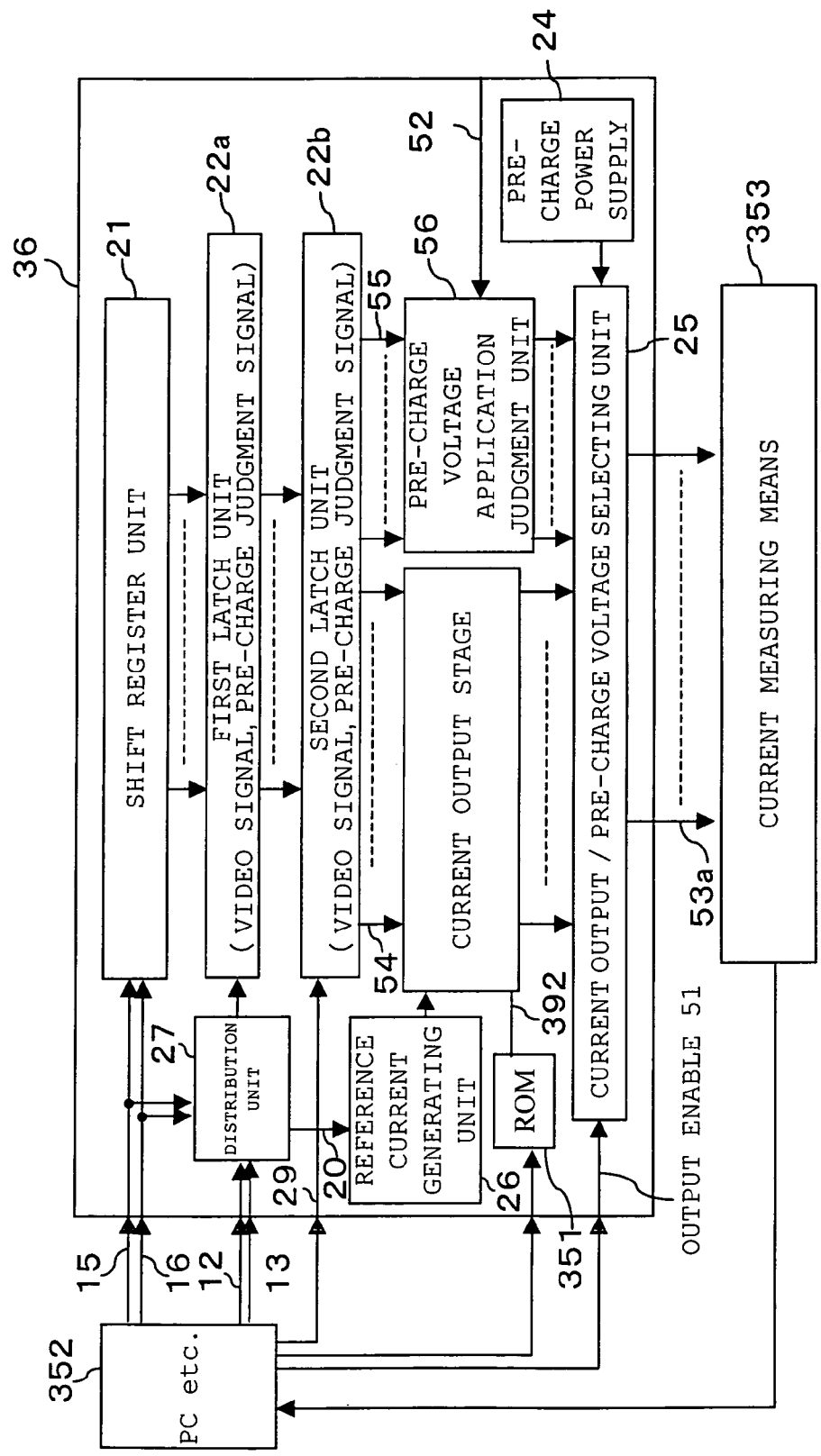
FIG. 35 is a diagram showing a circuit structure at the time when gradation reversal is detected to perform correction in a source driver having an output stage of FIG. 39.

For example, as shown in FIG. 35, a signal from 352 such as a PC can be inputted to the ROM 351 at the time of inspection, and 352 such as the PC detects whether gradation reversal has occurred according to a current value of output current measuring means 353 and writes a signal of the high level in the ROM 351 when gradation reversal occurs. When gradation reversal does not occur, the PC or the like writes a signal of the low level in the ROM 351. Consequently, it can be judged automatically whether gradation reversal is to be corrected, a defective product can be rescued without intervention of manpower, and an IC can be provided fast and inexpensively.

Figure 27:
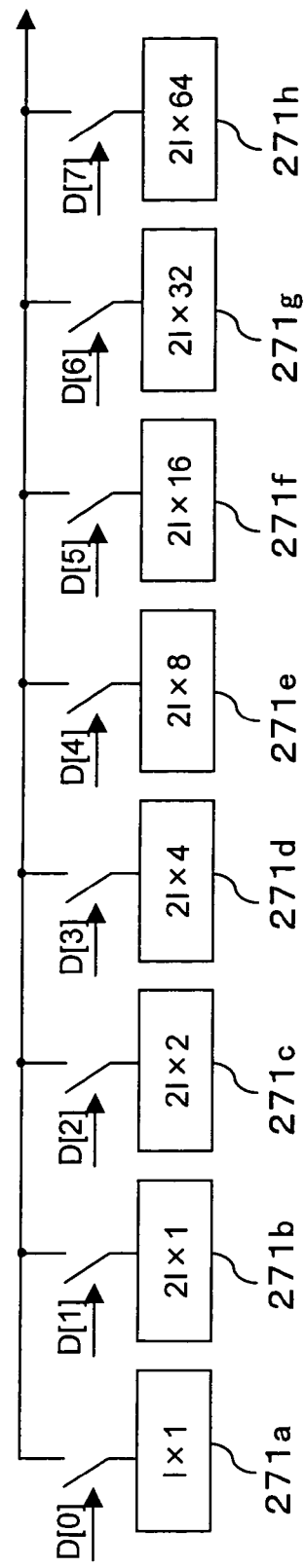
FIG. 27 is a diagram showing a current output stage in which a lower order one bit of eight-bit data is outputted with a transistor structure of a certain size, a transistor with a larger drain current amount compared with the transistor for the lower order one bit is prepared for remaining higher order seven bits, and gradation display is performed according to the number of transistors.

In the above explanation, a source driver is assumed to be an eight-bit driver. However, the invention can be realized even if the source driver is not an eight-bit driver. In addition, other than the combination of lower order two bits and higher order six bits, as shown in FIG. 27, it is possible to realize the invention with a combination of a lower order one bit and higher order seven bits. Lower order N bits are formed in a certain transistor size and higher order M bits are formed in another transistor size, whereby a current driver of (N+M) ($\geq 3$) bit output can be realized. In this case, it is most preferable that transistors of the lower order N bits output a current that is ½ N of current output of transistors of the higher order M bits. However, it is also possible that, as long as gradation can be represented, current output of the transistors of the higher order M bits only has to be larger than that of the transistors of the lower order N bits.

It is preferable that a relation between N and M is $N \leq M$. Since a rate of current output of transistors corresponding to N bits increases as N increases, an influence of deviation of a current value of the transistors corresponding to N bits from a logical value increases. For example, at the time of an eight-bit driver, deviation up to 12.3% can be allowed when N=2 and M=6, but deviation up to 5.26% can only be allowed when N=3 and M=5 and deviation up to 2.46% can only be allowed when N=4 and M=4. When deviation is reduced to 2.46%, the deviation is in the same level as fluctuation between adjacent gradations. The deviation in this order is a minimum value at which deviation between a logical value and an actually measured value can be controlled.

Therefore, N=4 is a maximum value in the eight-bit driver.

In general, in an (N+M) bit driver, it is also necessary that $N \leq M$ in order to reduce an influence of deviation from a logical value of lower order transistors (for N bits). In addition, even if $N \leq M$, it is preferable that $N \leq 4$ in order to improve a gradation property between adjacent gradations.

Note that, in the invention, the explanation is made using the organic luminescent element as a display element. However, it is possible to implement the invention using any element such as an inorganic electroluminescence element, a light-emitting diode, or the like as long as the element is a display element in which a current and a luminance is in a proportional relation.

When an eight-bit signal subjected to gamma correction is inputted to perform display using the source driver IC 36, it becomes possible to realize display subjected to gamma correction even if the FRC is not used. Therefore, display further on a low gradation side is facilitated (an influence of clicker due to the FRC is eliminated), and a display device with a high display quality can be realized.

Figure 21:
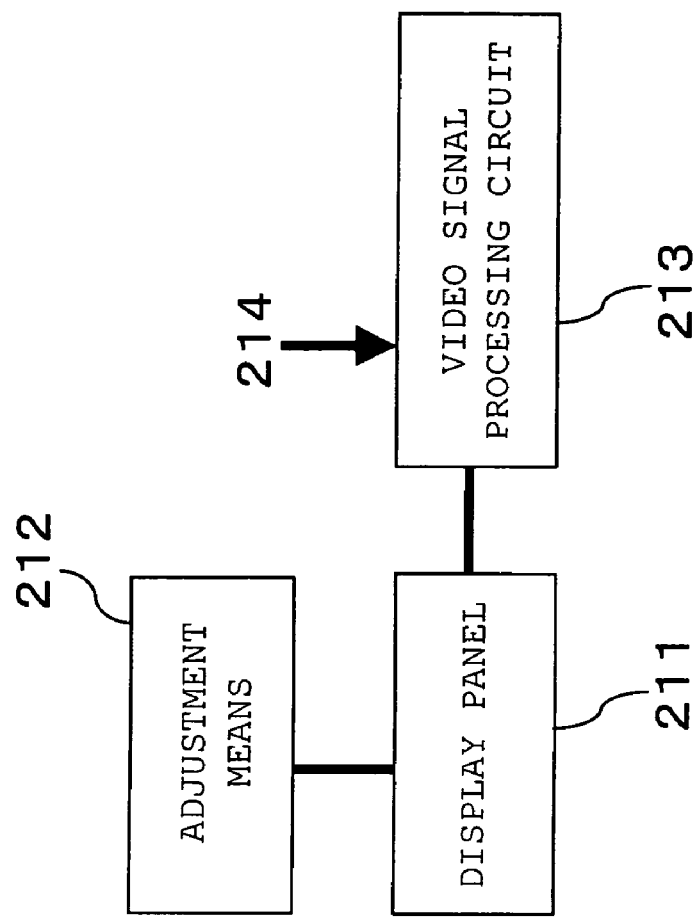
FIG. 21(a) is a diagram showing a case in which a display device using the embodiment of the present invention is applied to a television.
FIG. 21(b) is a diagram showing a case in which a display device using the embodiment of the present invention is applied to a television.
Figure 21:
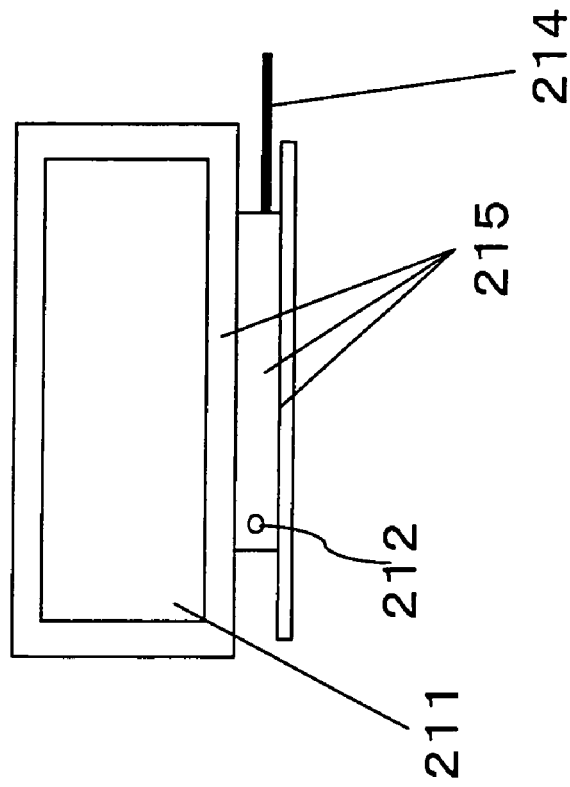
Figure 22:
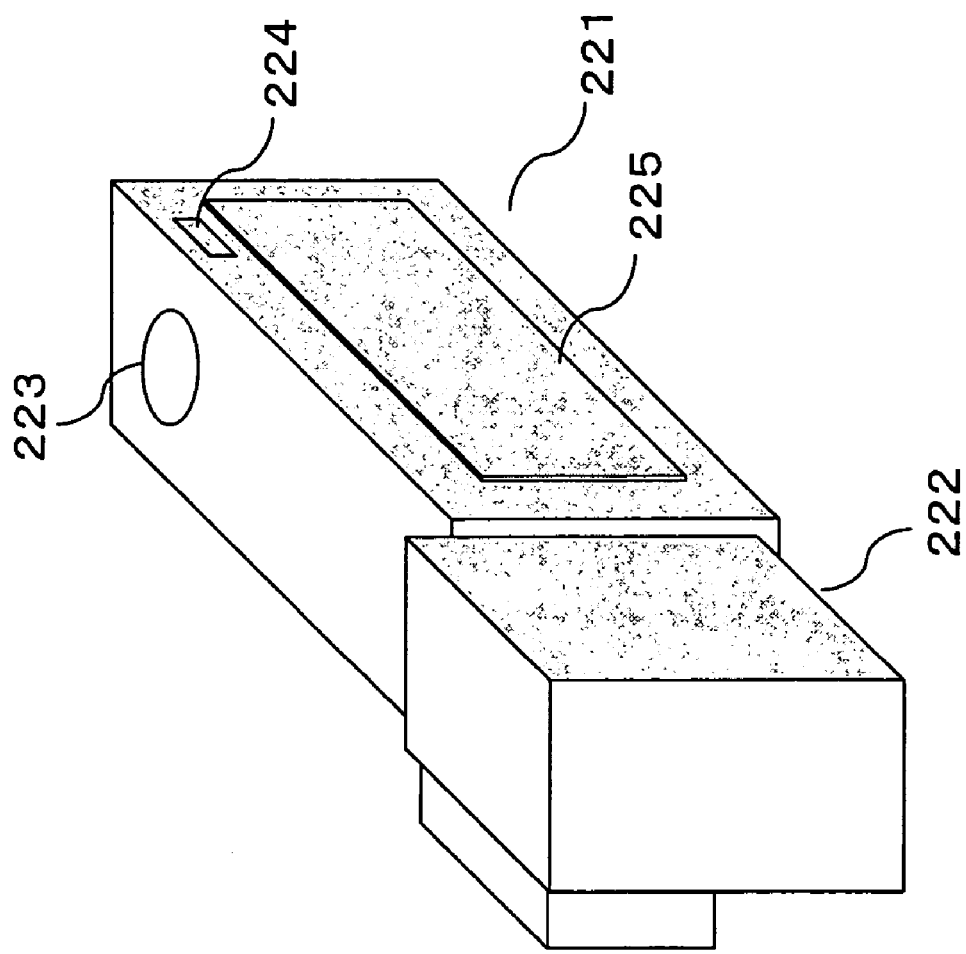
FIG. 22 is a diagram showing a case in which the display device using the embodiment of the present invention is applied to a digital camera.
Figure 23:
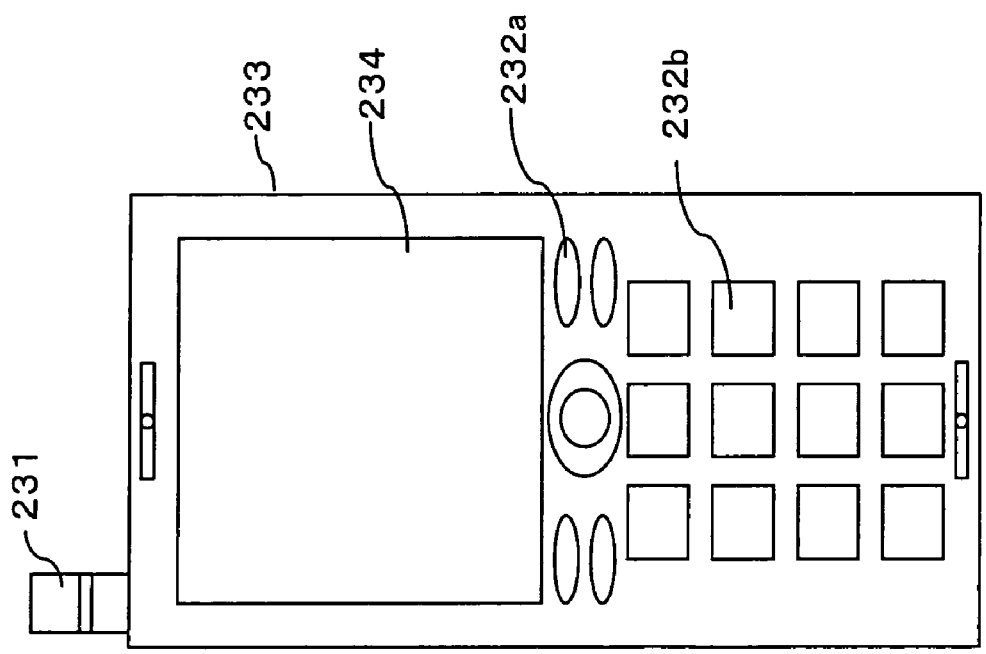
FIG. 23 is a diagram showing a case in which the display device using the embodiment of the present invention is applied to a personal digital assistant.

The driver IC 36 is a driver indispensable for a display device as shown in FIG. 21 to FIG. 23.

The example in the case in which a transistor used in the pixel 67 is the p type transistor has been described. The circuit can be realized in the same manner if an n type transistor is used.

Figure 20:
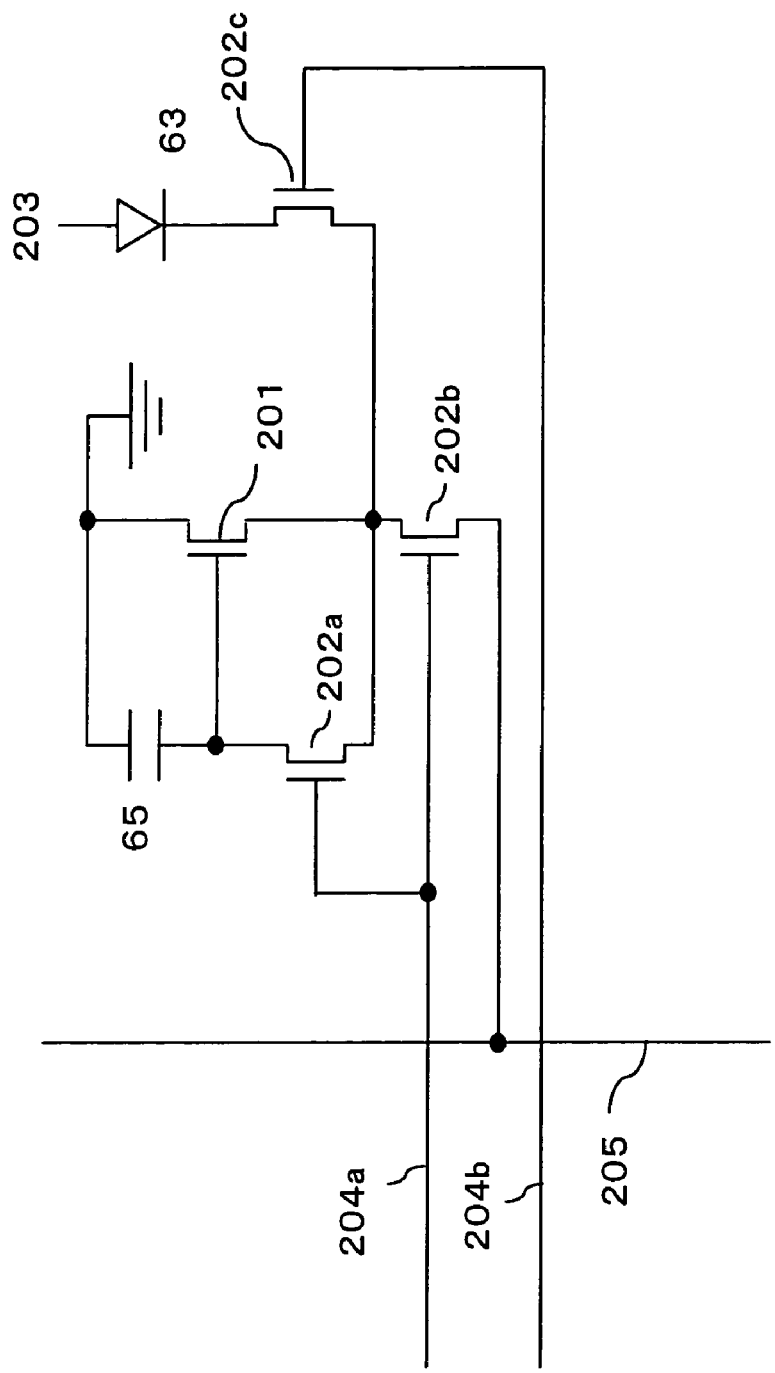
FIG. 20 is a diagram showing a pixel circuit using a current copier in the case in which an n type transistor is used.

FIG. 20 shows a circuit for one pixel at the time when a pixel structure of a current mirror type is formed of the n type transistor. A direction in which a current flows is reversed, and a power supply voltage changes accordingly. Therefore, a current flowing through a source signal line 205 needs to flow from the source driver IC 36 toward the pixel 67. The structure of the output stage is a current mirror structure of the p type transistor so as to discharge a current to the outside of the driver IC. A direction of a reference current is also reversed to change in the same manner.

In this way, it is possible to apply a transistor used in a pixel in both the p and n types.

Embodiment 2

Figure 2:
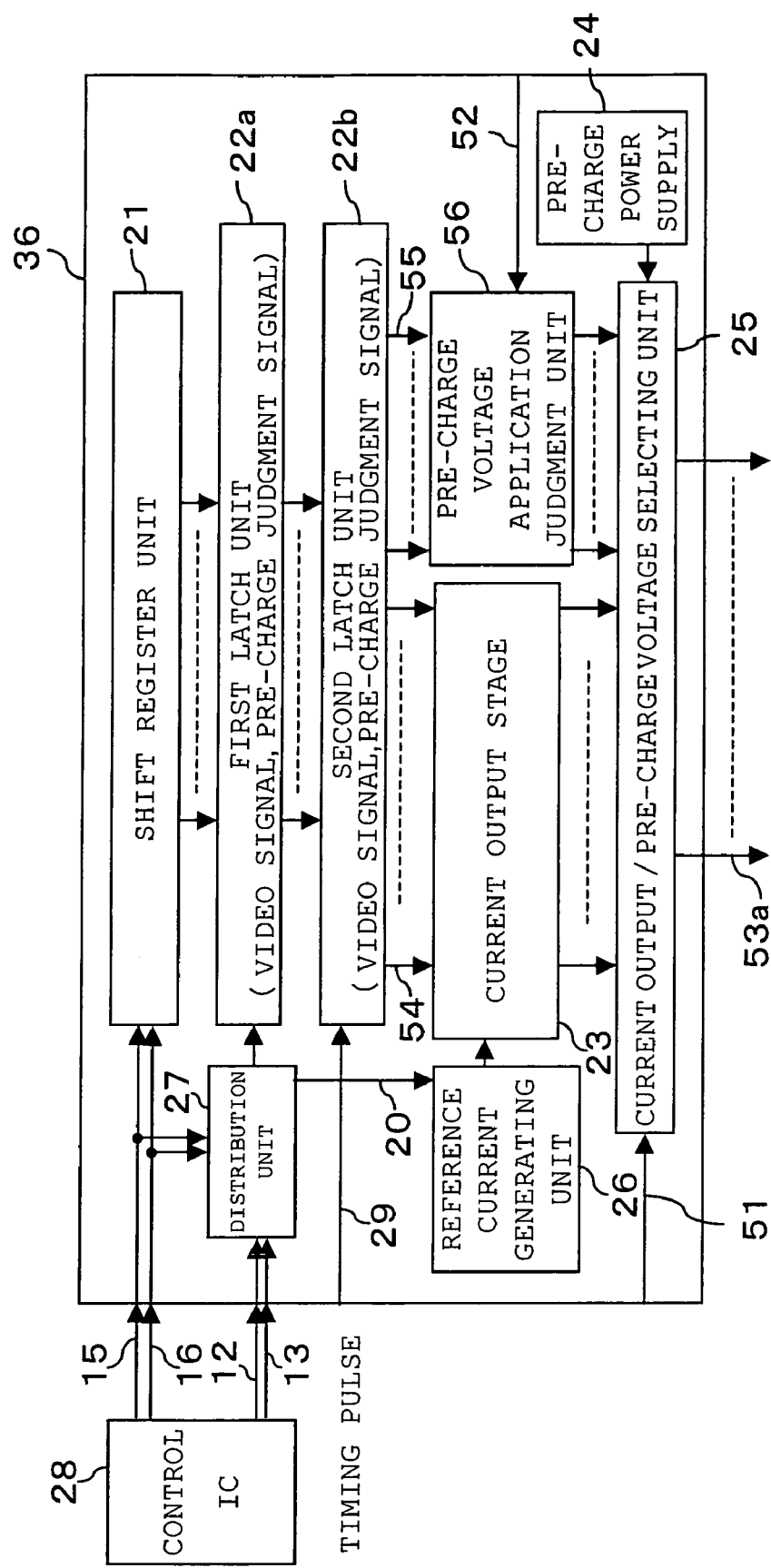
FIG. 2 is a block diagram of a driver IC at the time when it can be selected from the outside whether pre-charge is performed for each video signal for dot.

A structure of a current output type source driver IC 36 in a current output type semiconductor device in embodiment 2 of the present invention is shown in FIG. 2. Since the number of outputs can be realized simply by increasing and reducing the numbers of shift registers 21, latch units 22, current output stages 23, pre-charge voltage application judgment units 56, and current output/pre-charge voltage selection units 25, which are required for one output, according to an increase and a decrease of the number of outputs, it is possible to cope with an arbitrary number of outputs. However, if the number of outputs increases, since a chip size becomes too large and general versatility is lost, about 600 is the maximum practically.

A video signal of the driver IC 36 of the invention is inputted from a control IC 28 through signal lines 12 and 13. This video signal is distributed into a video signal and various setting signals by a distribution unit 27, and only the video signal is inputted to a shift register unit 21. In the structure of FIG. 2, an input of a video signal 214 is distributed to each output terminal by the shift register unit 21 and two latch units 22. The distributed video signal is inputted to the current output stage 23. In the current output stage 23, a current value corresponding to a gradation is outputted from the video signal and a reference current which is generated by the reference current generation unit 26.

Pre-charge judgment signal data of a latch unit is inputted to a pre-charge voltage application judgment unit 56.

On the other hand, in the pre-charge voltage application judgment unit 56, a signal is generated for controlling a switch which is to decide whether a voltage supplied by pre-charge power supply 24 outputs to output 53 by a pre-charge judgment signal which is latched by latch unit 22 and a pre-charge pulse. Accordingly, a current or a voltage is outputted to the outside of the drive IC 36 via the current-output/pre-charge-voltage-selection-unit 25 which selects according to the output signal of the pre-charge voltage application judgment unit 56 whether to output a current to the outside of the drive IC 36 according to the graduation or to supply a voltage from the pre-charge power supply 24.

The voltage outputted from the pre-charge power supply 24 turns into a voltage value necessary for displaying black on a display panel. A method of applying this pre-charge voltage is a configuration peculiar to the driver IC 36 of performing gradation display on an active matrix type display device according to a current output.

Figure 6:
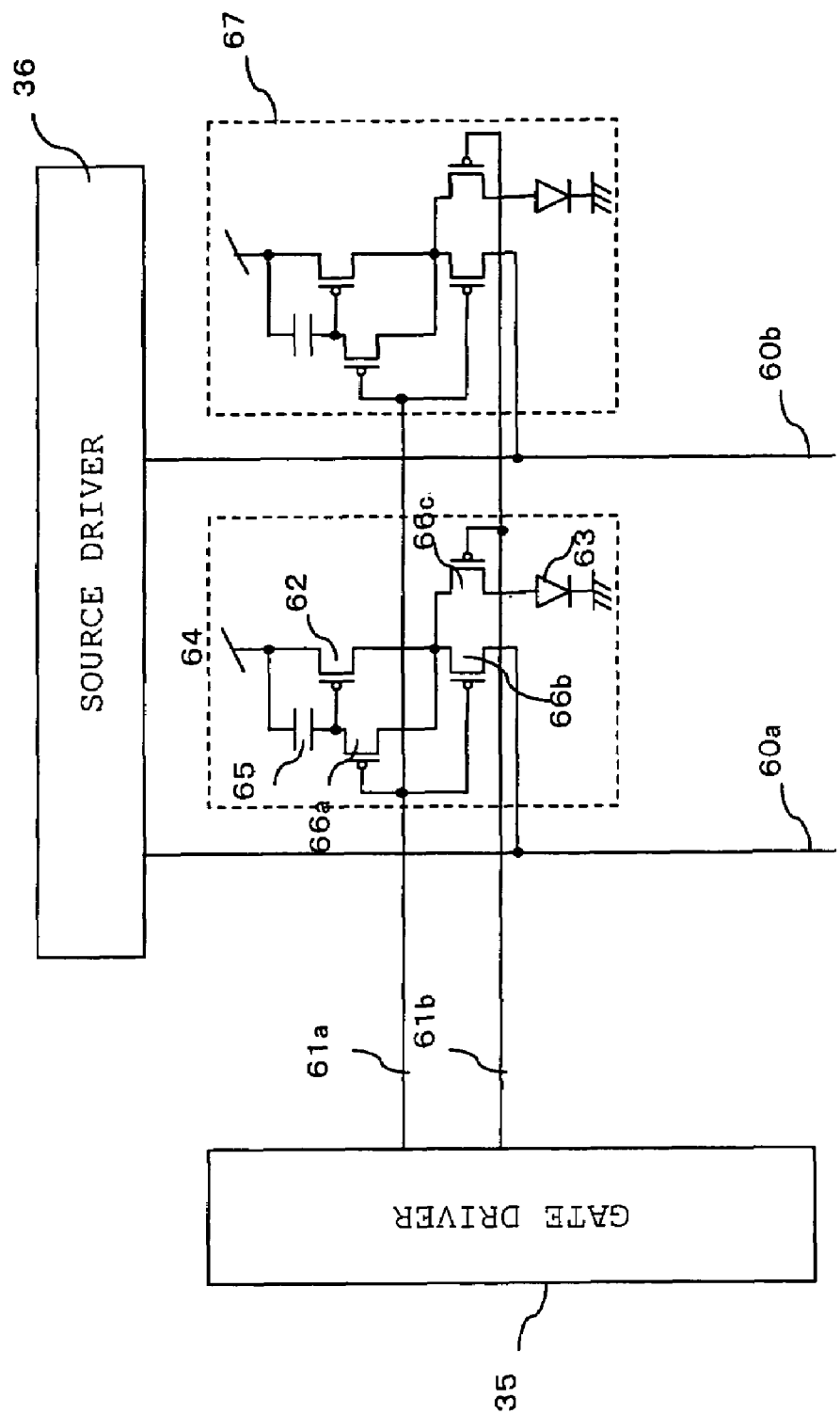
FIG. 6 is a diagram showing a circuit of an active matrix type display device using a pixel circuit of a current copier structure.
Figure 7:
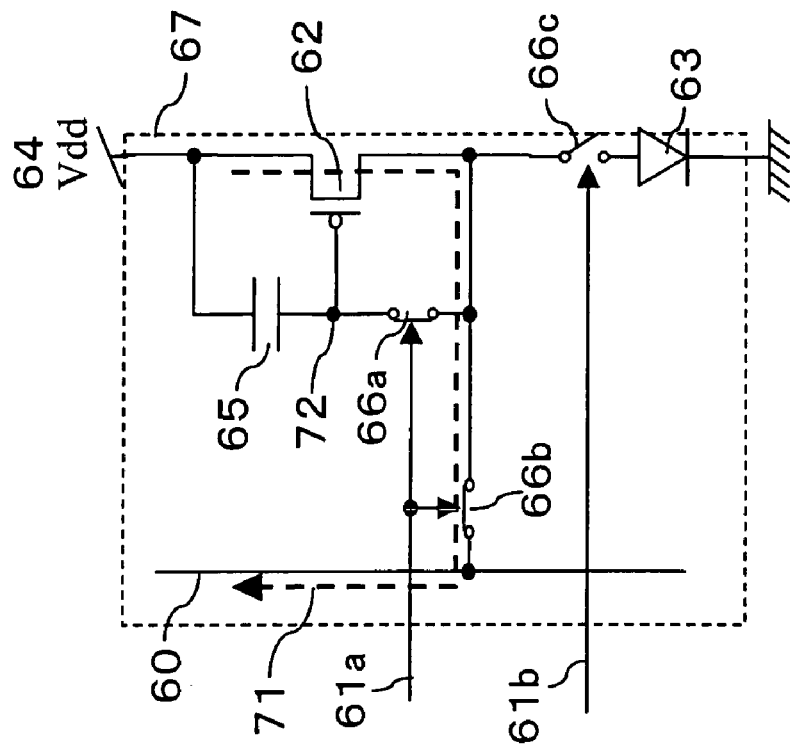
FIG. 7(a) is a diagram showing an operation of a current copier circuit.
FIG. 7(b) is a diagram showing an operation of a current copier circuit.
Figure 7:
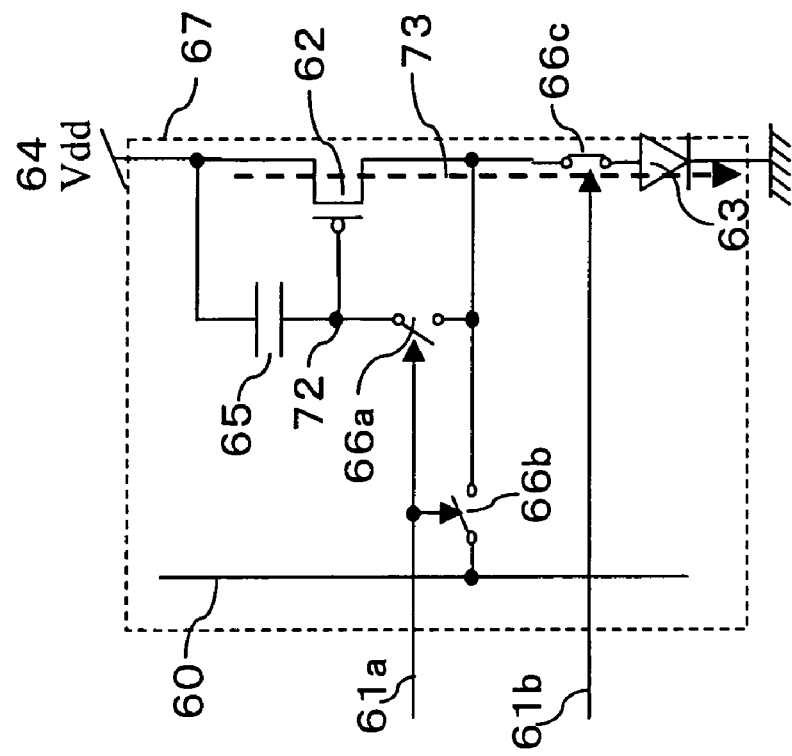
Figure 12:
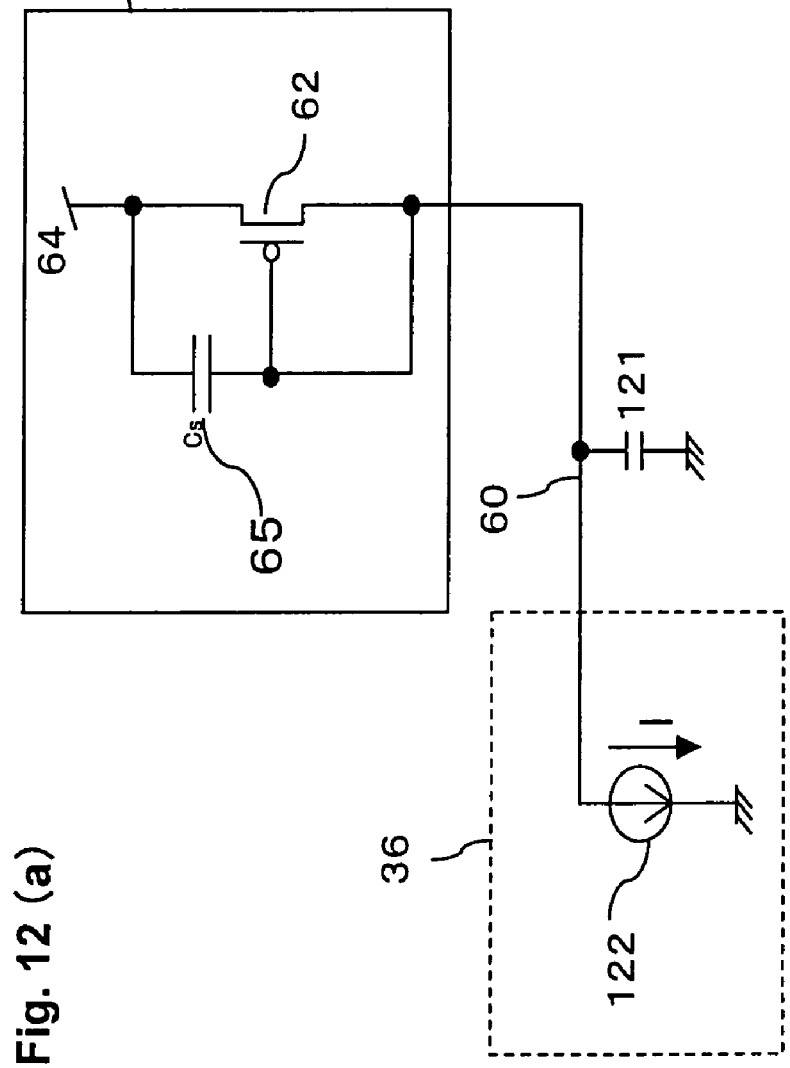
FIG. 12(a) is a diagram showing an equivalent circuit at the time when a source signal line current flows to a pixel in a pixel circuit of a current copier structure.
FIG. 12(b) is a diagram showing an equivalent circuit at the time when a source signal line current flows to a pixel in a pixel circuit of a current copier structure.
Figure 12:
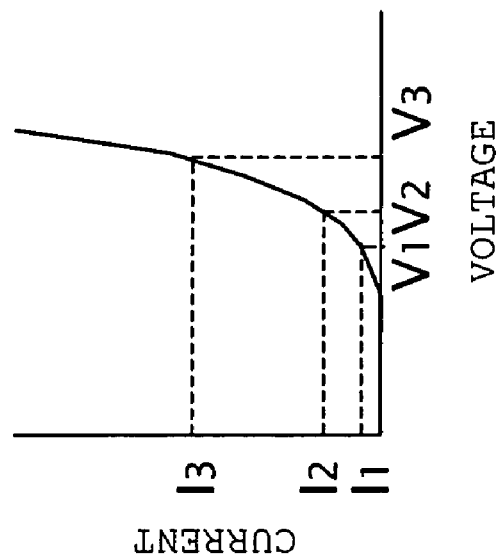

For example, a case in which a predetermined current value is written in a certain pixel from a source signal line in an active matrix type display device of a pixel structure shown in FIG. 6 will be considered. An extracted circuit relating to a current path from the output stage of the source driver IC 36 to the pixel in the case in which pre-charge is not executed, that is, a pre-charge circuit is not present is as shown in FIG. 12(*a*).

A current I corresponding to a gradation flows from the inside of the driver IC 36 as a lead-in current in a form of a current source 122. This current is taken into the inside of the pixel 67 through a source signal line 60. The taken-in current flows through the drive transistor 62. In other words, the current I flows to the source driver IC 36 from the EL power supply line 64 via the drive transistor 62 and the source signal line 60 in the selected pixel 67.

When a video signal changes and a current value of the current source 122 changes, a current flowing to the drive transistor 62 and the source signal line 60 also changes. At that point, a voltage of the source signal line changes according to a current-voltage characteristic of the drive transistor 62. In the case in which the current-voltage characteristic of the drive transistor 62 is FIG. 12(*b*), for example, when it is assumed that a current value flown by the current source 122 has changed from I2 to I1, a voltage of the source signal line changes from V2 to V1. This change in the voltage is caused by the current of the current source 122.

A stray capacitor 121 is present in the source signal line 60. In order to change the source signal line voltage from V2 to V1, it is necessary to draw a charge of this stray capacitor. A time ΔT required for this drawing is ΔQ (the charge of the stray capacitor)=I (a current flowing to the source signal line)×ΔT=C (a stray capacitance value)×ΔV. Here, when it is assumed that ΔV (a signal line amplitude in a black display time from a white display time) is 5[V], C=10 pF, and I=10 nA, ΔT=50 millisecond is required. This means that, since the time is longer than one horizontal scanning period (75 μsec) at the time when QCIF+size (the number of pixels 176×220) is driven at a frame frequency of 60 Hz, if it is attempted to perform black display on a pixel below a white display pixel, switch transistors 66*a* and 66*b* of writing a current in a pixel close while a source signal line current is changing, and therefore halftones arememorized in the pixel, whereby the pixel glistens at luminance between white and black.

Since a value of I decreases as a gradation becomes lower, it becomes difficult to draw the charge of the stray capacitor 121, there is a problem in that a signal before the luminance changes to a predetermined luminance is written inside the pixel. This problem occurs more conspicuously in display of a lower gradation. To put it in an extreme way, a current of the current source 122 at the time of black display is 0, and it is impossible to draw the charge of the stray capacitor 121 without flowing a current.

Therefore, a structure in which a voltage source with an impedance lower than that of the current source 122 is prepared to apply the voltage source to the source signal line 60 as required is adopted. This voltage source is equivalent to the pre-charge power supply 24 of FIG. 2, and a mechanism for allowing application of the voltage source is a current output/pre-charge voltage selection unit 25.

Figure 13:
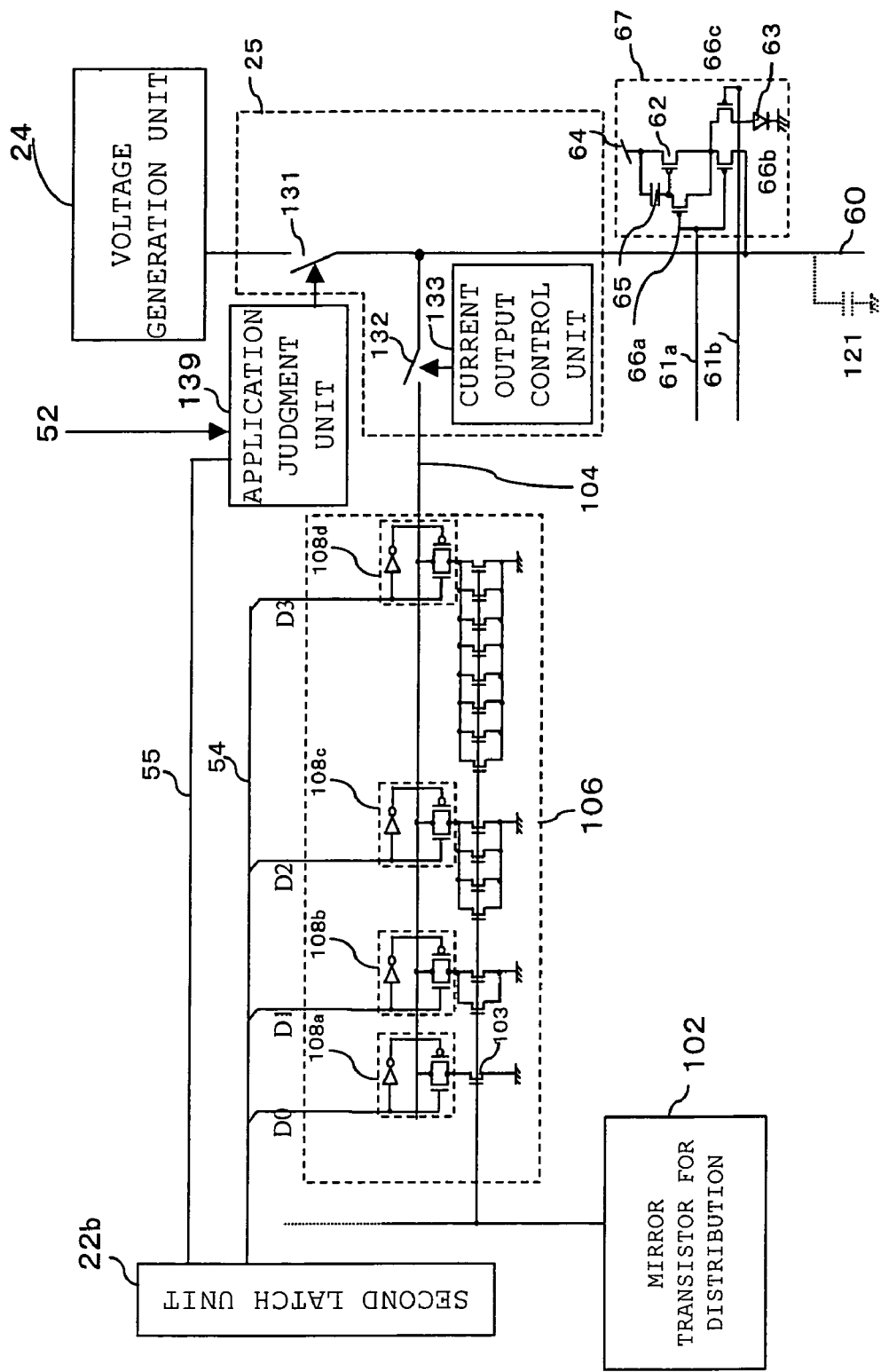
FIG. 13 is a diagram showing a relation among a current output at one output terminal, a pre-charge voltage application unit, and a changeover switch.

A schematic circuit with respect to one source signal line 60 is shown in FIG. 13. A voltage supplied from the pre-charge power supply 24 is applied to the source signal line 60, whereby the charge of the stray capacitor 121 can be charged and discharged. As the voltage supplied from the pre-charge power supply 24, a voltage corresponding to each gradation current may be supplied according to the characteristics of FIG. 12(*b*). However, a circuit size increases because a digital/analog conversion unit corresponding to the gradation data 54 is required also in the voltage generation circuit.

In a small panel (9 inches or less), since a capacitance value of a stray capacitor 121 is 10 to 15 pF and the number of pixels is small, a relatively long vertical scanning period is secured. Consequently, it can be said that it is practically sufficient in terms of cost (chip area) versus effect to generate only a voltage corresponding to a black gradation, for which it is most difficult to write a current value, as the voltage to be generated in the pre-charge power supply 24.

Figure 38:
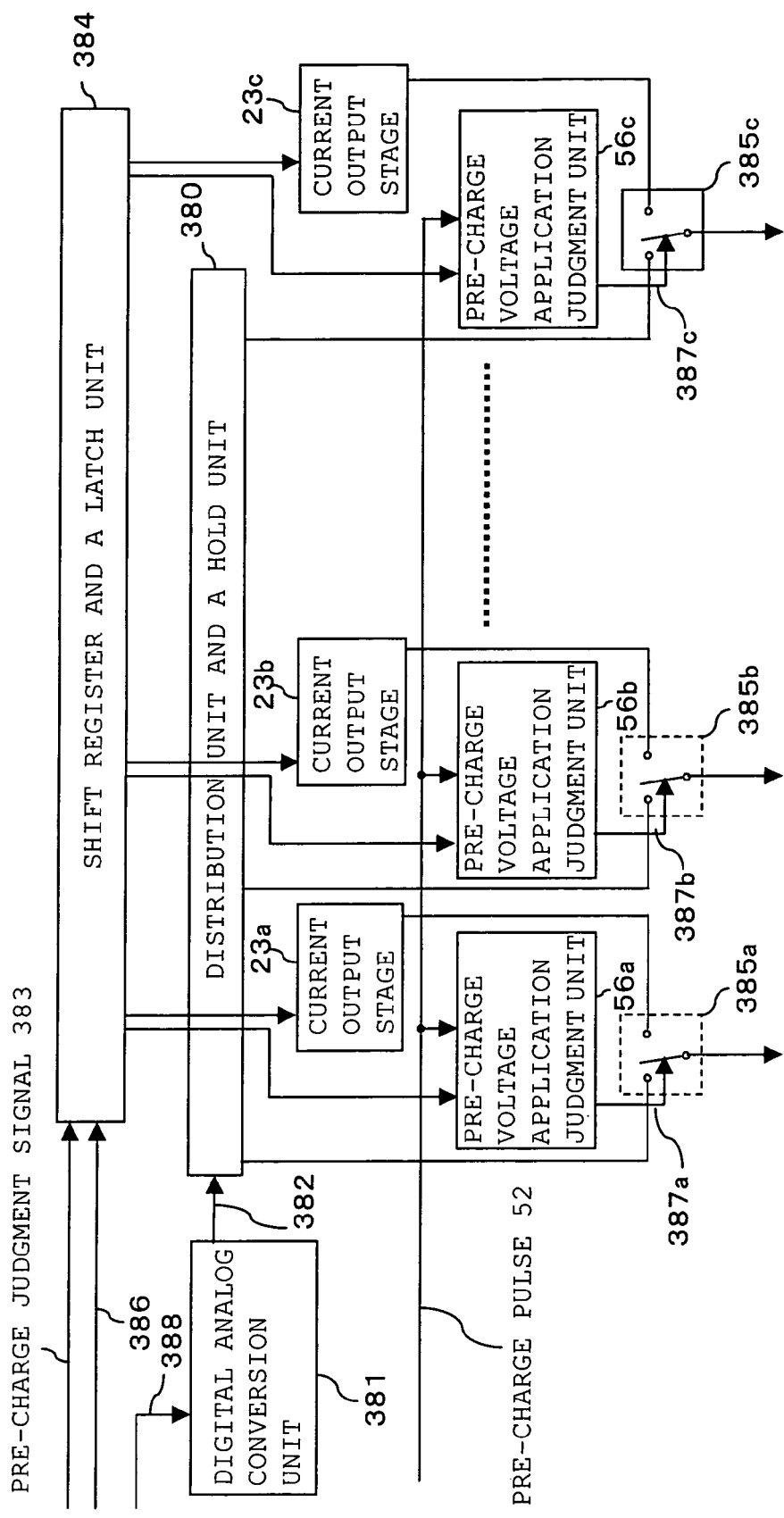
FIG. 38 is a diagram a structure of an output stage in the case in which one of a current according to a gradation and a voltage according to a gradation can be outputted upon selection in one horizontal period or a current according to a gradation and a voltage according to a gradation can be outputted in a temporal order.

(Note that, in a large high-definition panel, as shown in FIG. 38 explained later, a driver IC using a digital analog conversion unit is also possible.)

In the small panel, one voltage generated from a pre-charge power supply 24 is enough, and it is sufficient to judge whether a voltage is outputted to control a switch 131 depending on data. In other words, a one-bit signal line (pre-charge judgment signal), which judges whether the voltage from the pre-charged power supply 24 is to be applied before current output corresponding to a certain video signal is performed, is prepared.

Figure 9:
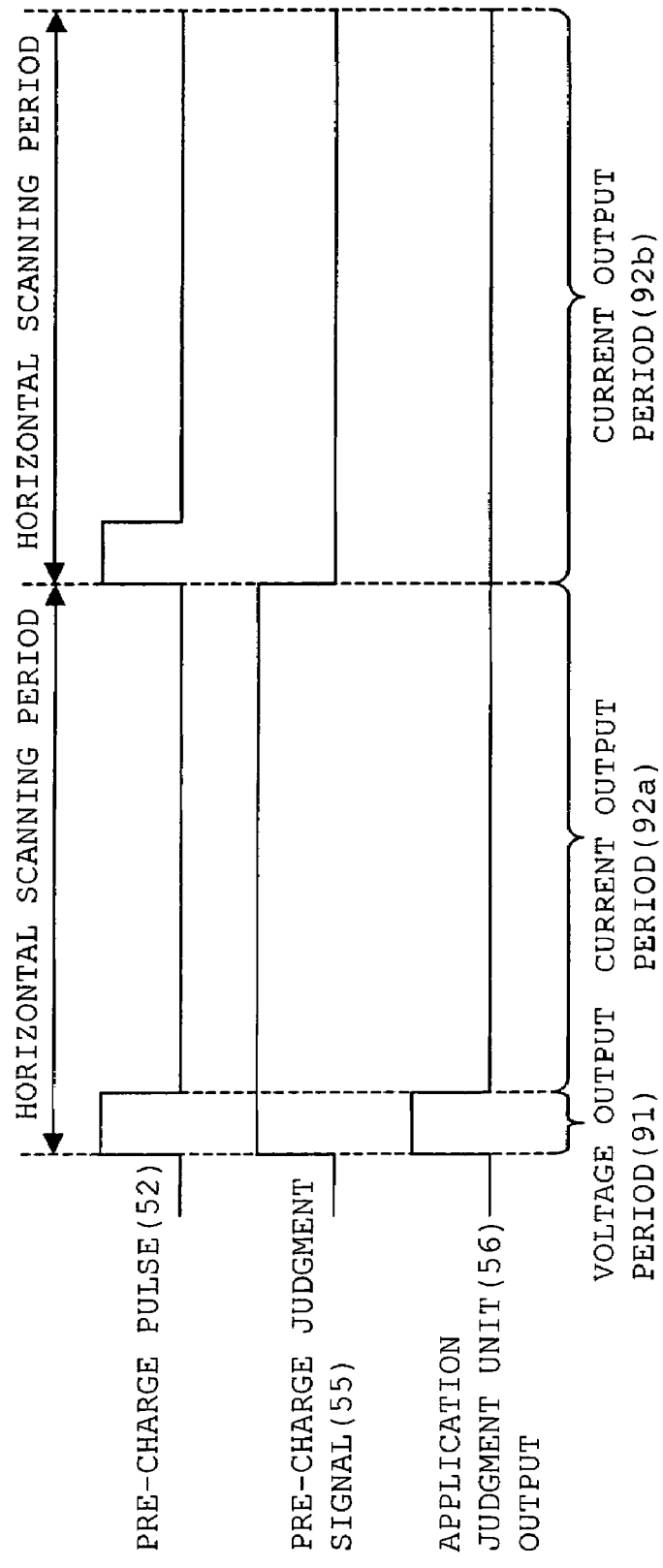
FIG. 9 is a diagram showing a relation among a pre-charge pulse, a pre-charge judgment signal, and an application judgment unit output.

FIG. 9 shows a voltage application judgment operation in a circuit structure in FIG. 13. It is judged whether a voltage is to be applied according to a pre-charge judgment signal 55. In this example, it is assumed that an "H" level indicates that there is voltage application and an "L" level indicates that there is no voltage application.

Time required for a gate voltage of a drive transistor 62 in the inside of the pixel circuit 67 to equal to an output voltage of the pre-charge power supply 24 depends upon a time constant represented by a product of a wiring capacity and a wiring resistance of a source signal line 60. The gate voltage can change to be the same as the output voltage in about 1 to 5 microseconds depending upon a buffer size and a panel size of an output of the pre-charge power supply 24.

When gradation display is performed by a voltage, even if an identical voltage can be supplied to each pixel, a current flowing to an EL element 63 is different due to fluctuation in a current-voltage characteristic of the driver transistor 62, and luminance unevenness occurs. Thus, in order to correct the fluctuation in the drive transistor 62, current output is performed after the gate voltage is changed to a predetermined voltage in 1 to 5 microseconds.

Switching of voltage output and current output for that purpose is performed using a pre-charge pulse. A voltage of the pre-charge power supply 24 is outputted only at the time when the pre-charge pulse and the pre-charge judgment signal 55 are simultaneously "H", and current output is performed in other cases, whereby current output can be performed when voltage application is unnecessary, and fluctuation correction can be performed according to a current after voltage application even in the case in which voltage application is necessary.

Figure 15:
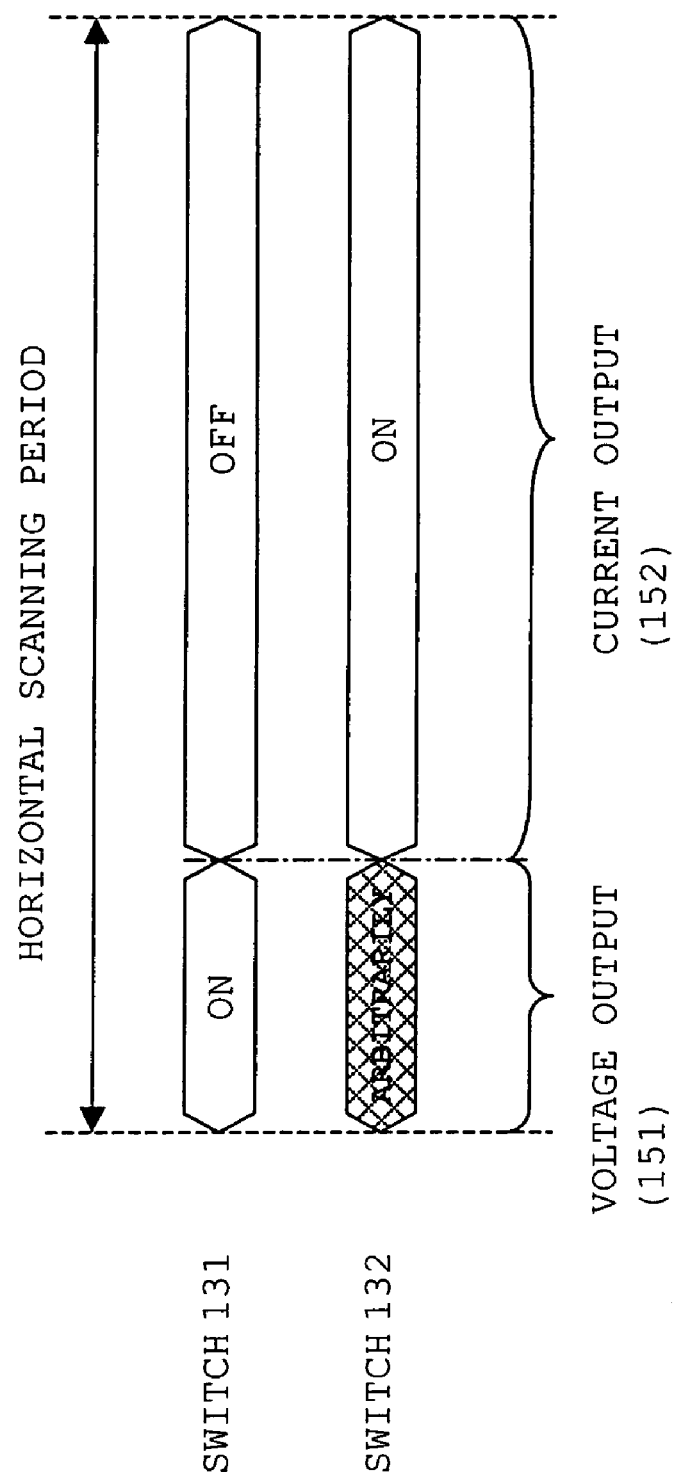
FIG. 15 is a diagram showing a relation between a period in which a pre-charge voltage is applied within one horizontal scanning period and a period in which a current based upon gradation data is outputted.

The above operation is performed for the switch 131 controlling the pre-charge power supply 24. However, an operation of a switch 132 by a current output control unit 133 is required to be ON in a current output period 152 but may be ON or OFF in a voltage output period as shown in FIG. 15.

If it is OFF, since an output of the pre-charge power supply 24 is directly outputted from the source driver, no problem is caused. On the other hand, even if it is ON, a voltage of a current output destination 104 generated by the digital analog conversion unit 106 depends upon a load, if the pre-charge power supply 24 is outputted, a voltage of the source signal line 60 is identical with a voltage of the pre-charge power supply 24. Therefore, the switch 132 may be in any state.

Therefore, the switch 132 and the current output control unit 133 may not be provided. However, actually, when it is assumed that an operational amplifier is used for output of the pre-charge powers supply 24, a current is drawn from the operational amplifier into the current source for gradation display 103, and it is necessary to improve a current output capability of the operational amplifier. Therefore, in the case in which a capability of the operational amplifier cannot be improved, insufficiency of the current output capability of the operational amplifier is often supplemented by providing the switch 132 and causes the switch 132 to perform an operation opposite to that of the switch 131.

Presence or absence of the switch 132 depends upon a design of the operational amplifier at the time of driver design. In the case in which the operational amplifier is reduced in size, the switch 132 is provided. In the case the operational amplifier or the pre-charge power supply 24 is supplied from the outside of the source driver 36 in which a power supply having a sufficient current output capability is used, the switch 132 and the current output control unit 133 may be removed in order to reduce a circuit size of the source driver.

Since the voltage value to be outputted from the pre-charge power supply 24 is only the voltage corresponding to the current at the time of a black gradation (hereinafter referred to as black voltage), for example, in the case in which it is assumed that the gradation data 54 displays a white gradation for continuous plural horizontal scanning periods, a source signal line repeats black, white, black, and white states. If pre-charge is not performed, the white state occurs continuously. In other words, on the contrary, by performing pre-charge, a change in a signal line is intensified, and in addition, it is likely that display is not fully white depending upon a current at the time of white display, and insufficiency of a writing current is caused.

Thus, it is sufficient to use the pre-charge judgment unit such that pre-charge is not performed in a gradation for which a relative large amount of current flows and only a gradation, for which a current hardly changes to a predetermined current, near the black gradation is assisted by the pre-charge power supply 24. For instance, it is most effective that a judgment output has a period in which a pre-charge voltage is inputted only at the time when a gradation is 0 (black), and a pre-charge voltage is not inputted at the time of display in other gradations. By setting luminance at the time of a lowest gradation to be low, contrast increases, and it becomes possible to display a more beautiful picture.

Figure 17:
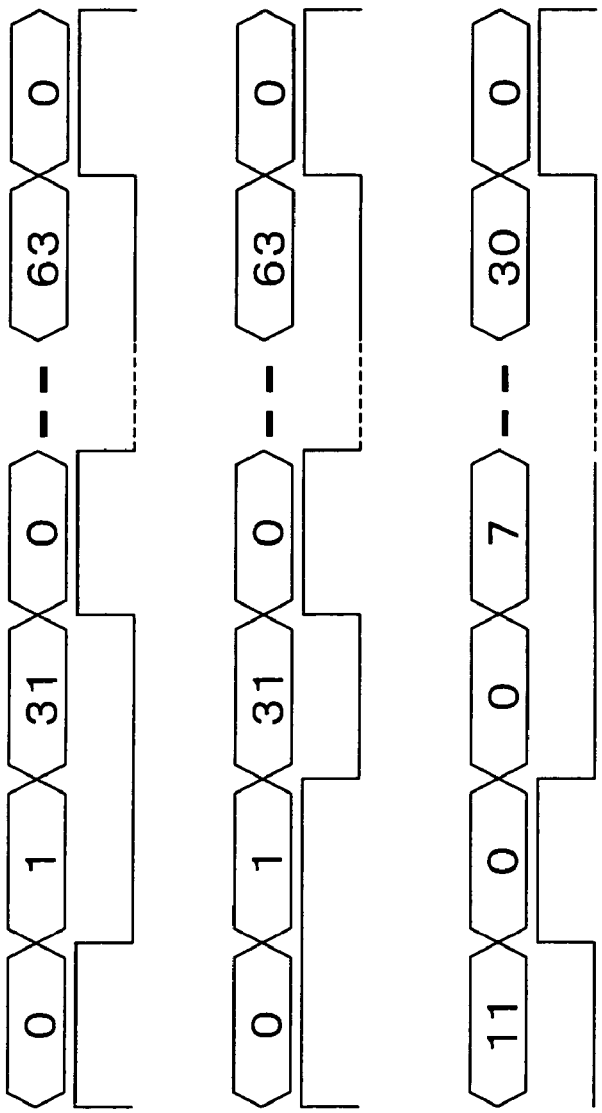
FIG. 17(a) is a circuit block diagram of a driver IC in the embodiment of the present invention.
FIG. 17(b) is a circuit block diagram of a driver IC in the embodiment of the present invention.
FIG. 17(c) is a circuit block diagram of a driver IC in the embodiment of the present invention.

For example, as shown in FIG. 17(*a*), pre-charge can be performed only when a gradation is zero by setting a pre-charge judgment signal 55 only when a gradation data 54 is zero.

In addition, if a pre-charge judgment signal 55 is set when the gradation data 54 is zero and one, pre-charge can be performed when a gradation is zero and one (FIG. 17(*b*)).

Incidentally, in a pattern in which there is no change in a source signal line such as black display on the entire screen, if a pre-charge voltage is applied only at the beginning of one frame, thereafter, a predetermined gradation flows sufficiently only with black current.

That is, even at the time of same black display, a time during which a current changes to a predetermined current value only with the current is different depending upon a current value flown to the source signal line in the previous horizontal scanning period, and as an amount of change increases, the change takes longer time. For example, although it takes time to perform black display after white display, in the case in which black display is performed after black display, since a change in a signal line is only a change by fluctuation in the drive transistor 62, a time required for the change is short.

Thus, a signal for judging whether or not to apply a pre-charge voltage (pre-charge judgment signal 55) in synchronization with gradation data 54 is introduced for each color, whereby it is also possible to implement a structure in which presence or absence of pre-charge can be selected in an arbitrary gradation or in an identical gradation.

The pre-charge judgment signal 55 is applied to the gradation data 54. Following this, since latch units 22 are also required to latch a pre-charge judgment signal, latch units of the number equivalent to the number of video signal bits+one bit are provided.

FIG. 17(*c*) shows a case in which pre-charge is inputted when a gradation is 0 and when a gradation in the previous period is not 0 (pre-charge is performed when a gradation is 0 but, even if a gradation is 0, pre-charge is not performed if it continues).

This method has an advantage that, unlike the method mentioned above, it can be selected whether or not pre-charge is performed according to a state of a source signal line of one horizontal scanning period earlier even in an identical gradation.

Note that this pre-charge judgment signal is supplied from a control IC 28. According to a command operation of the control IC 28, the pre-charge judgment signal 55 can be outputted with a pattern thereof changed as shown in FIGS. 17(*a*) to (*c*).

It is possible to change setting of pre-charge flexibly from the outside of the source driver IC 36 depending on a capacity of the source signal line or a length of one horizontal scanning period, and there is an advantage that general versatility increases.

A method of generating the pre-charge judgment signal 55 in the control IC 22 will be explained. It is judged whether an input video signal is subjected to pre-charge, and a result of the judgment is outputted from the control IC 22 to the source driver as the pre-charge judgment signal 55.

From a current change amount of a source signal line and from the viewpoint that a change in a current value flowing to the source signal line to a predetermined current value are affected, judgment according to a state of an immediately preceding row and judgment according to a display gradation of a row concerned are performed with respect to the judgment on whether pre-charge is to be performed.

For example, when a state of the source signal line changes from white to black and then to black, a change amount is large and the change takes time when the state changes from white to black. However, when an identical gradation is displayed over plural rows as at the time when the state changes from black to black, a change in a source signal line current in a period corresponding to a row displaying the identical gradation is small because the change is equivalent to an amount compensating for fluctuation.

Utilizing this phenomenon, with reference to data of an immediately preceding row, voltage output is performed from a pre-charge voltage only when a gradation difference between the data of the immediately preceding row and data concerned is large. In the example mentioned above, pre-charge is performed when the state changes from white to black and is not performed when the state changes from black to black. It is possible to extend a time for change necessary for fluctuation correction from black to black because pre-charge is not performed and to improve accuracy of correction. Consequently, it is seen that it is preferable not to perform pre-charge when a gradation of the immediately preceding row and gradation data of a row concerned are identical.

Moreover, since a voltage for performing pre-charge is only a voltage corresponding to the black state, when a luminance of the row concerned is high compared with a state of the immediately preceding row, gradation display only has to be performed with a predetermined current without changing the state to black. Therefore, it is seen that, when the gradation of the row concerned is high compared with the gradation of the immediately preceding row, it is preferable not to perform pre-charge.

Moreover, since a current amount is large when a pixel concerned has a half tone or higher tones, the current easily changes to the predetermined current. Thus, pre-charge is unnecessary regardless of a pixel of the immediately preceding row. However, when a resolution is high, when a current amount is small even if the pixel has the half tone, or when a current does not change easily because, for example, a panel size is large, pre-charge may be performed when the pixel of the immediately preceding row is has the half tone or lower tones.

In general, as a change in a current value, a change from a white state to a black state is more difficult than a change from the black state to the white state. As explained above, this is because a state of a signal level has to be changed from a state of the signal level of the immediately preceding row to a desired state of a source signal line according to a current corresponding to a display gradient to be displayed, and the change is more difficult in a low gradation part with a smaller current value. When a change amount is still larger, a horizontal scanning period ends before the change is completed. Thus, when a change takes time, a change amount is large, and a gradation concerned is a low gradation, that is, when a gradation of the pixel of the immediately preceding row is the half tone or higher hones, it is effective to perform pre-charge when a luminance of the pixel concerned is the half tone or lower tones.

If the immediately preceding row has the half tone or lower tones, a predetermined gradation can be displayed because a change amount is small even when a luminance of the pixel concerned is the half tone or lower tones.

Consequently, pre-charge is not performed when a luminance of the pixel concerned is larger than a certain gradation, and depending upon a gradation of the immediately preceding row when it is equal to or smaller than the certain gradation, pre-charge is not performed when the luminance is larger than data of the immediately preceding row and is performed when the luminance is smaller than the data of the immediately preceding row. Pre-charge is not performed when the gradation is identical with data of the immediately preceding row regardless of a gradation of the row concerned.

Note that, concerning data of a first row in which data of the immediately preceding row is not present, a state immediately before writing data in the first row in a pixel, that is, a state of a source signal line in a vertical blanking period is important.

In general, a vertical blanking period, in which no row is selected during one frame, is present. In this period, a source signal line is cut off from all pixels by a switching transistor, and there is no path through which a current flows. When a current output stage of a source driver IC is constituted as shown in FIG. 13, only the source signal line is connected beyond a current output 104 in the vertical blanking period, and even if the current source for gradation display 103 attempts to draw a current from the source signal line, the current source for gradation display 103 cannot draw a current because there is no current path.

Therefore, the current source for gradation display 103 attempts to draw a current forcefully to decrease a drain voltage of a transistor constituting the current source 103. A potential at the source signal line falls simultaneously.

When the vertical blanking period ends and a current is to be supplied to a pixel of a first row, the fall of the source signal line potential increases, and the source signal line potential falls to be low compared with that at the time of normal white display. (Here, when the pixel structure in FIG. 6 is adopted, a potential at the source signal line is lowest at the time of white display and highest at the time of black display.) Therefore, compared with other rows, it is difficult to change a potential at the source signal line until a current value corresponding to a gradation is obtained. (A necessary change width is large.)

When the fall of the source signal line potential is large, a potential further falls compared with that at the time of white display. Even in the case in which white display is performed on the first row when the change takes time, display is performed at a high luminance compared with a predetermined luminance. Concerning a row to be scanned immediately after the vertical blanking period ends, it is desirable to output a pre-charge voltage regardless of a display gradation.

Thus, in the invention, the problem in that a luminance of the first row is different from a luminance of other rows is solved using a vertical synchronization signal to obtain a pre-charge judgment signal corresponding to data equivalent to the next row in the vertical blanking period as a signal for performing pre-charge forcefully.

Note that, as a method of easing the fall of the potential at the source signal line even if only slightly, black display data may be inputted to the gradation data 54 in the vertical blanking period to bring a switch 108 into a nonconductive state to thereby control the fall of the potential at the source signal line. In addition, a switch may be provided between the current output 104 and the source signal line to bring the switch into a nonconductive state in the vertical blanking period. This switch may be shared with a current voltage selecting unit 385. It is possible to reduce the number of switches if the switch is adapted to have three values as states of the switch to be separated a current output, a voltage output, and a source signal line.

An average luminance and a lighting ratio of a display image are affected by a phenomenon in which a predetermined gradation is hard to write, in particular, a phenomenon in which black is in half tone display. When the lighting ratio is high, a luminance is high as a whole, and visual recognition is impossible even if a small number of black display pixels are in half tone display. On the other hand, when the lighting ratio is low, a luminance of almost all pixels is set low. If this luminance cannot be displayed normally, since a luminance of substantially the entire display changes, display is completely different from an original video, which significantly affects a display quality.

Thus, arrangement is made such that, in display with a high lighting ratio that does not affect a display quality significantly, pre-charge is not performed in order to give priority to uniform display by current drive and, in display with a low lighting ratio in which an increase in a black display luminance is conspicuous, pre-charge is performed.

It is possible to calculate a lighting ratio of a panel by adding up all luminance data in one frame. A luminance of a pixel of low gradation display can be displayed with high fidelity by, depending upon a value of the lighting ratio obtained in this method, not performing pre-charge when the lighting ratio is high and performing pre-charge based on a result of judgment to this point when the lighting ratio is low.

Figure 41:
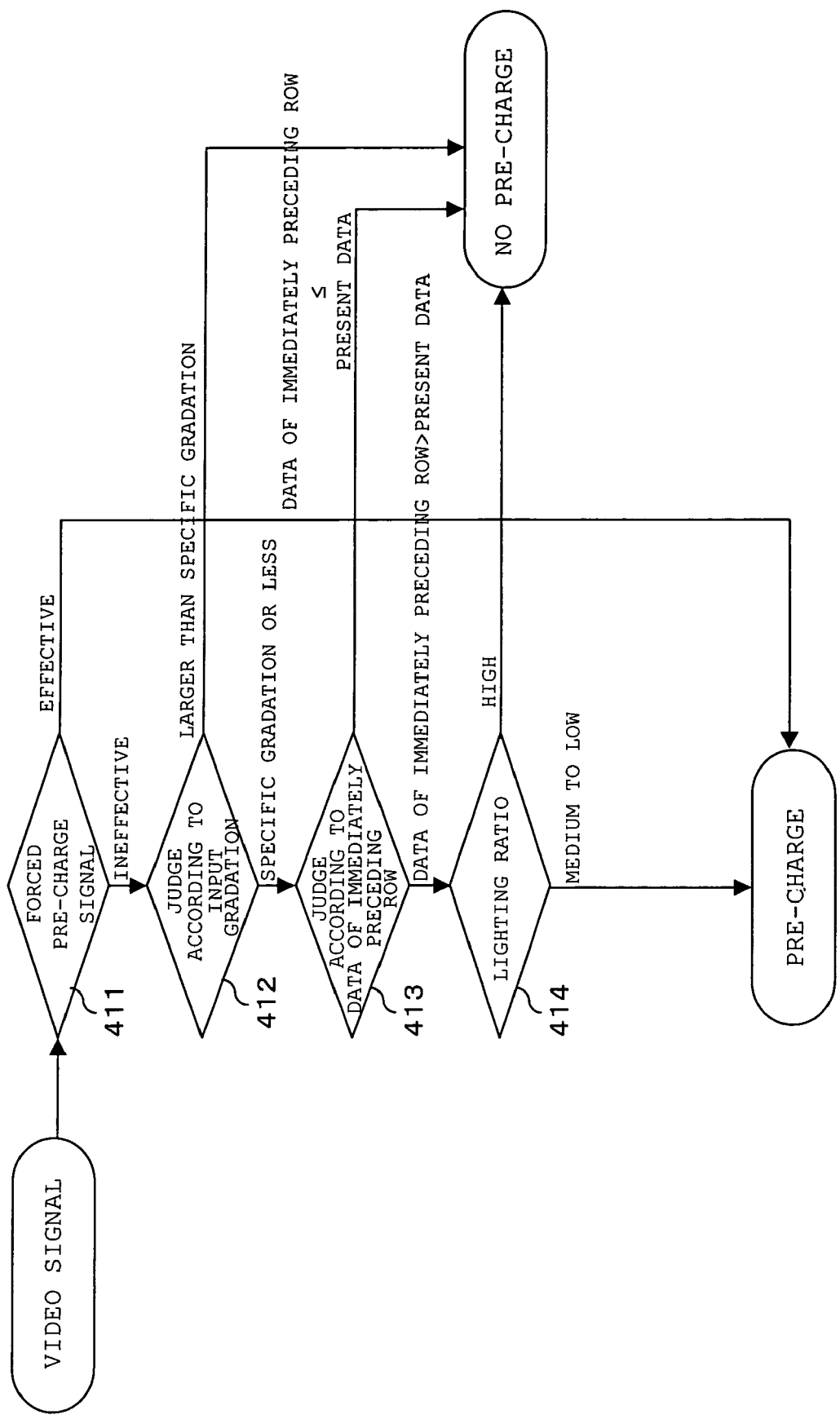
FIG. 41 is a diagram showing a flowchart for judging whether a pre-charge voltage is to be outputted in the invention.

FIG. 41 shows a flowchart for performing a method of pre-charge described above.

In the case in which a forced pre-charge signal is effective from a video signal and the forced pre-charge signal, a pre-charge voltage is outputted regardless of the video signal. When there are plural voltages, a voltage value to be outputted may be changed according to the video signal. Here, if the forced pre-charge signal is made effective only when a video signal corresponding to a first row is inputted, pre-charge is performed for data of the first row regardless of the video signal, and it becomes possible to avoid a phenomenon in which a current hardly changes to a predetermined value due to fall of a source signal line voltage in the vertical blanking period.

In the case in which the forced pre-charge signal is invalid, gradation of an input video signal is judged (412). In a small panel or a panel with a low resolution, in a high gradation area where a current amount is large compared with a low gradation part, it is possible to change the current amount to a predetermined current value only with a current in a predetermined period (one horizontal scanning period). Thus, in 412, it is judged that pre-charge is not performed at a gradation at which it is possible to write a predetermined current and pre-charge is performed at a gradation at which the predetermined current is not obtained only by a current.

Next, when a gradation is equal to or lower than a specific gradation for which pre-charge is necessary, the processing proceeds to 413. (Here, since the specific gradation varies depending upon a display panel, it is preferable that the specific gradation can be set according to an external command.) It is judged whether pre-charge is performed according to a state of a video signal of an immediately preceding row. If present video signal data has a higher gradation than that of the data of the immediately preceding row, and a state of a signal line is changed to black by pre-charge, a change in the signal line increases on the contrary; therefore pre-charge is not performed. In addition, if the video signal data has the same gradation as that of the immediately preceding row, pre-charge is not performed either.

When it is judged that pre-charge is performed in all judgments to this point, next, a lighting ratio is referred to, and pre-charge is not performed when the lighting ratio is high regardless of a result of judgment. When the lighting ratio is low, pre-charge is performed according to the judgment.

Note that, in this explanation, it is judged whether pre-charge is performed through all the steps 411 to 414 in order. However, all the steps are not always necessary.

Figure 40:
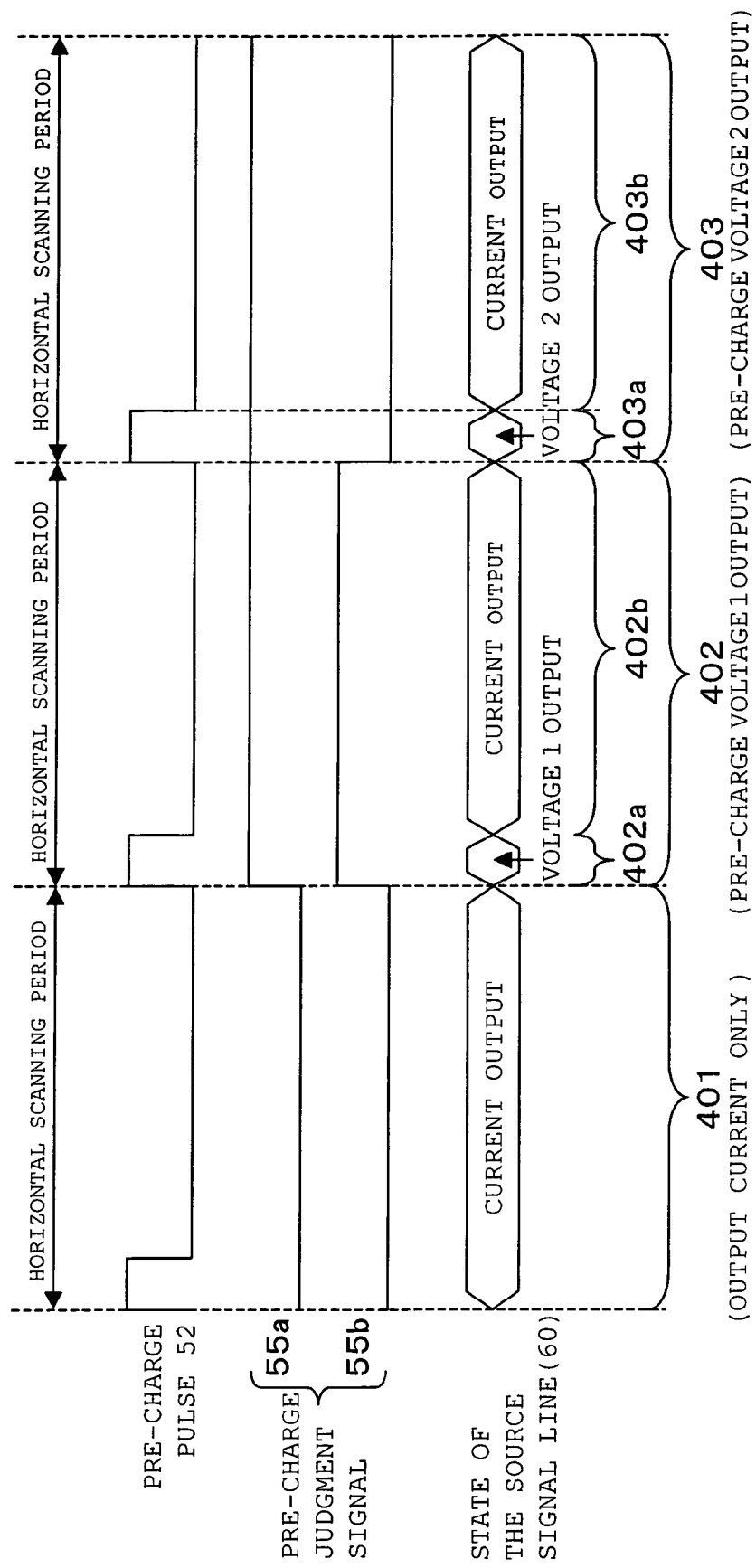
FIG. 40 is a diagram showing a relation among a precharge pulse, a pre-charge judgment signal, and a source signal line in a source driver in which there are plural voltages of a pre-charge power supply 24 and it is possible to select and output any one of the plural voltages to perform current output or it is possible to perform only current output.

Note that, when there are plural outputs of the pre-charge power supply 24, there are plural switches 131, and it is possible that the number of outputs of an application judgment unit is (number of voltage outputs+1) of the pre-charge power supply 24. Since there are (number of voltage outputs+1) outputs, it is necessary to change the number of bits of pre-charge judgment signals 55 to N bits ($2N \geq$(number of voltage outputs+1), N is a natural number) rather than one bit. The number of bits of the latch unit 22 is changed accordingly, whereby it is possible to cope with the change of the number. FIG. 40 shows an example of the pre-charge judgment signal 55 of 2 bits. This is a case in which there are three voltage values of the pre-charge power supply 24. If the pre-charge power supply 24 has a period in which the pre-charge power supply 24 outputs only a current when both pre-charge judgment signals is zero and outputs a first voltage when all the pre-charge signals are one, a period in which the pre-charge power supply 24 outputs a second voltage when only 55a is one, and a period in which the pre-charge power supply 24 outputs a third voltage when only 55b is one, it is possible to apply an appropriate pre-charge voltage by controlling the pre-charge judgment signal 55 according to a gradation.

Figure 42:
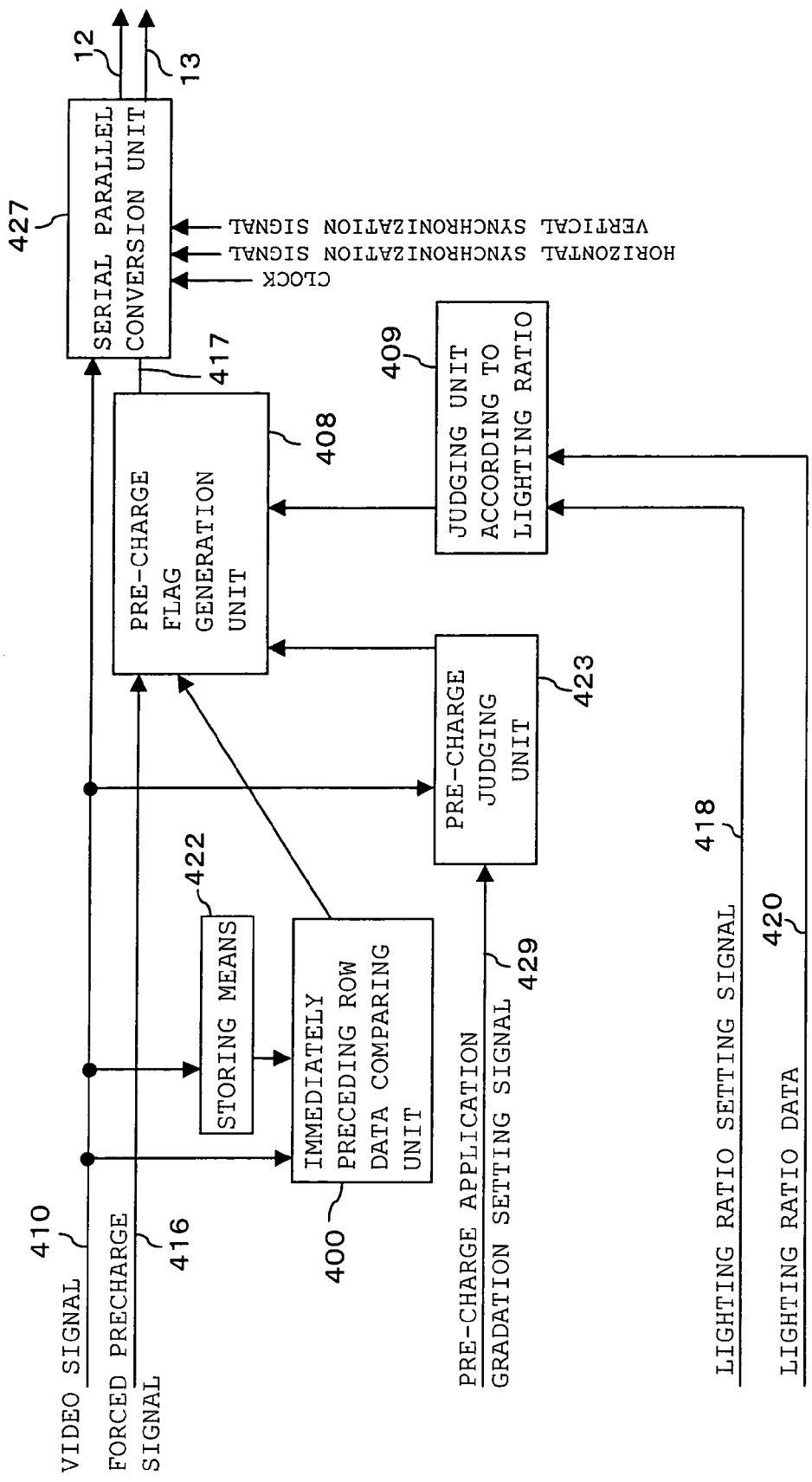
FIG. 42 is a diagram showing a pre-charge judgment signal generation unit for realizing a pre-charge application system of the invention.

FIG. 42 shows a circuit block diagram for realizing the method of pre-charge according to the invention. A judgment signal indicating whether pre-charge is to be performed as a result of judgments of respective blocks is outputted to 417 with respect to a video signal 410. It is determined whether pre-charge is to be performed on a source driver side according to the judgment signal 417 outputted at substantially identical timing with the video signal 410. A serial parallel conversion unit 427 is not always necessary but is necessary for matching a signal to an input interface of the source driver 36 when the source driver 36 is realized by combining with a source driver IC constituted by 36 in FIG. 2.

The video signal 410 is inputted to a pre-charge judging unit (421) and storing means (422).

As shown in 411 in FIG. 41, forced pre-charge only has to be inserted in last stages of all pre-charge judgment block so as to mask a result of judgment because pre-charge is performed when a forced pre-charge signal 416 is inputted regardless of the video signal 410. Therefore, in FIG. 42, a pre-charge flag generation unit 408 is constituted in a last stage. If pre-charge is performed at the "H" level according to the pre-charge judgment signal 417, a desired operation can be realized when this block is constituted only by inclusive OR.

Since pre-charge is not performed when data of an immediately preceding row is smaller than present data, first, the data of the immediately preceding row and the data of a row concerned are compared. As a circuit for that purpose, there are the storing means 422 and an immediately preceding row data comparing unit 400. The storing means 422 has a capacity capable of holding data equivalent to the number of outputs of the source driver 36 and holds a video signal during one horizontal scanning period to thereby keep the data of the immediately preceding row. An output of this storing means 422 and the video signal 410 are compared, whereby the data of the immediately preceding row and the row concerned are compared, and a result of the comparison is inputted to the next pre-charge judging unit. The result of the judgment is outputted at one bit representing whether pre-charge is performed.

In addition, since pre-charge is not performed in the case of high gradation data that can be written only by a current, it is judged whether the gradation data is larger or smaller than a gradation set by a pre-charge application gradation judgment signal 429 with reference to the video signal 410, and a signal indicating whether pre-charge is to be performed is outputted.

Moreover, judgment is performed according to a lighting ratio. A signal, which indicates that pre-charge is performed when a lighting ratio determined by a lighting ratio setting signal 418 is exceeded from calculated lighting ratio data 420 and lighting ratio setting signal 418, is outputted by a unit for judgment according to lighting ratio 409.

In a pre-charge flag generation unit 408 to which outputs of the immediately preceding row data comparing unit, the pre-charge judging unit, and the unit for judgment according to lighting ratio and the forced pre-charge signal 416 are inputted, a signal for performing pre-charge is outputted to 417 regardless of other signals when per-charge is performed by the forced pre-charge signal 416. In other cases, a signal is outputted such that pre-charge is performed only when all outputs of the immediately preceding row data comparing unit, the pre-charge judging unit, and the unit for judgment according to lighting ratio indicate that pre-charge is to be performed.

Consequently, the pre-charge flag 417 corresponding to the video signal 410 performs output corresponding to a result that is judged in accordance with a flow of FIG. 41.

Figure 3:
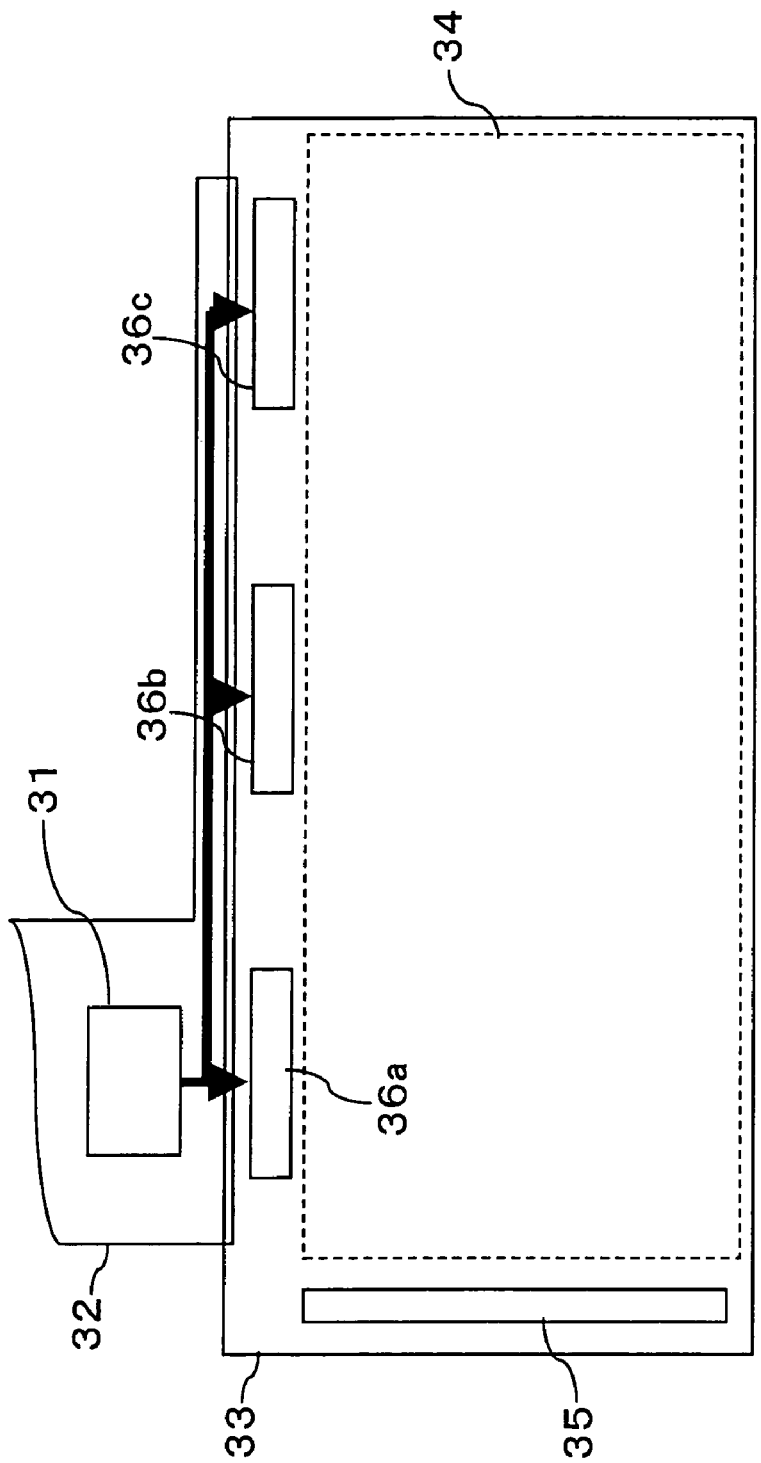
FIG. 3 is a diagram showing a display panel using plural source driver ICs.
Figure 4:
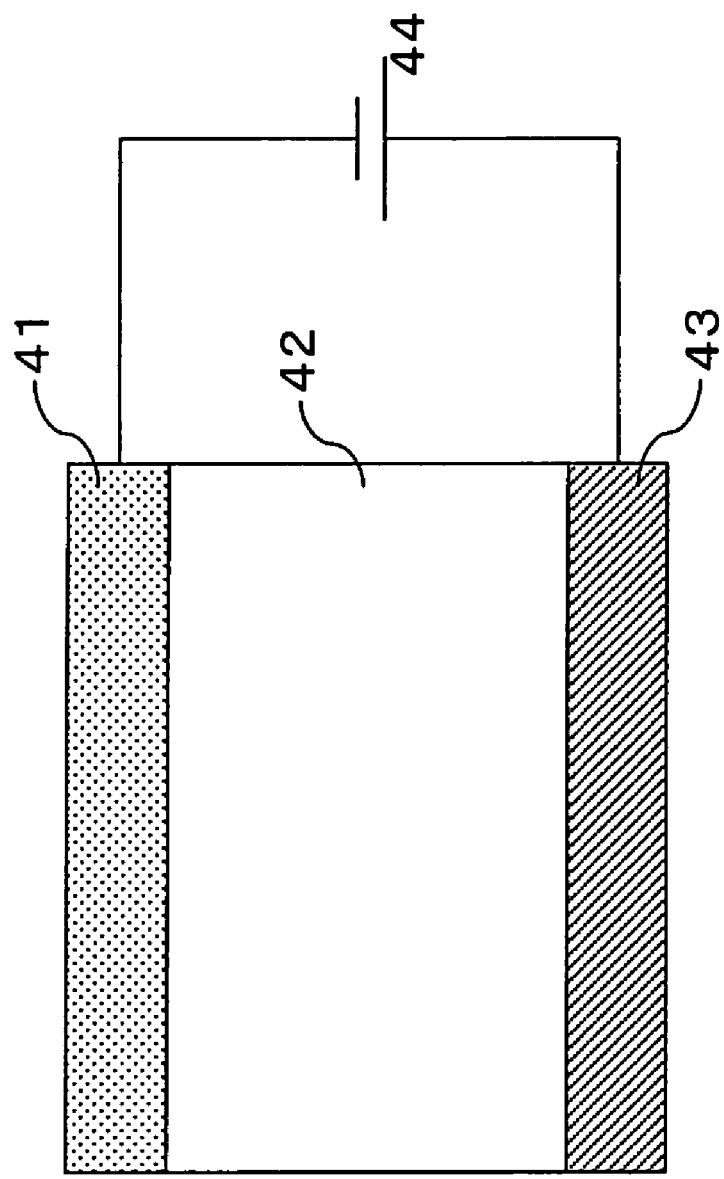
FIG. 4 is a diagram showing a structure of an organic luminance element.
Figure 5:
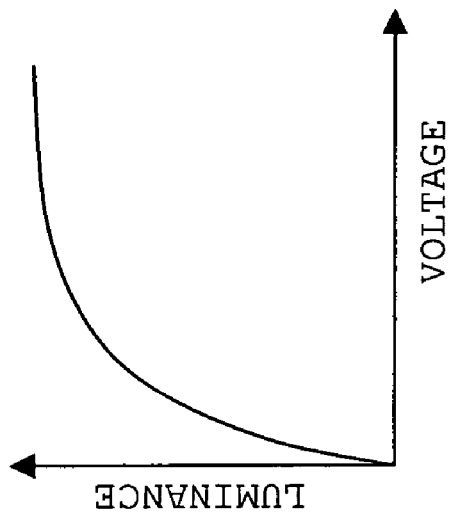
FIG. 5(a) is a diagram showing a current-voltage-luminance characteristic of an organic luminance element.
FIG. 5(b) is a diagram showing a current-voltage-luminance characteristic of an organic luminance element.
Figure 5:
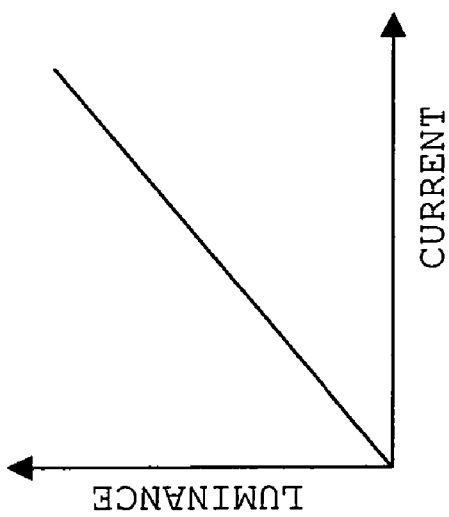

The serial parallel conversion unit 427 is necessary for matching a signal to the input interface of the source driver 36 in FIG. 3 and is unnecessary when video signals of respective colors and the pre-charge output 417 (for each color) are transferred in parallel. (The video signals and the pre-charge outputs 417 are directly outputted to a source driver.)

Note that, in the structure in FIG. 2, an example in which the control IC 28 and the source driver 36 are constituted by separate chips is described. However, the control IC 28 and the source driver 36 may be an integral chip constituted by an identical chip. In this case, the structures in FIG. 41 and FIG. 42 are incorporated in the source driver 36.

It is preferable that an output voltage value of the pre-charge power supply 24 can be controlled by an electronic volume or the like. This is because a voltage of pre-charge for causing a predetermined current to flow is determined on the basis of a voltage of an EL power supply line 64. When it is attempted to cause a current I2 to the source signal line 60 in FIG. 12, a potential at the source signal line 60 is (voltage of EL power supply line)—V2 from a relation between a drain current and a drain-gate voltage of the transistor 62 (FIG. 12($b$)).

Figure 31:
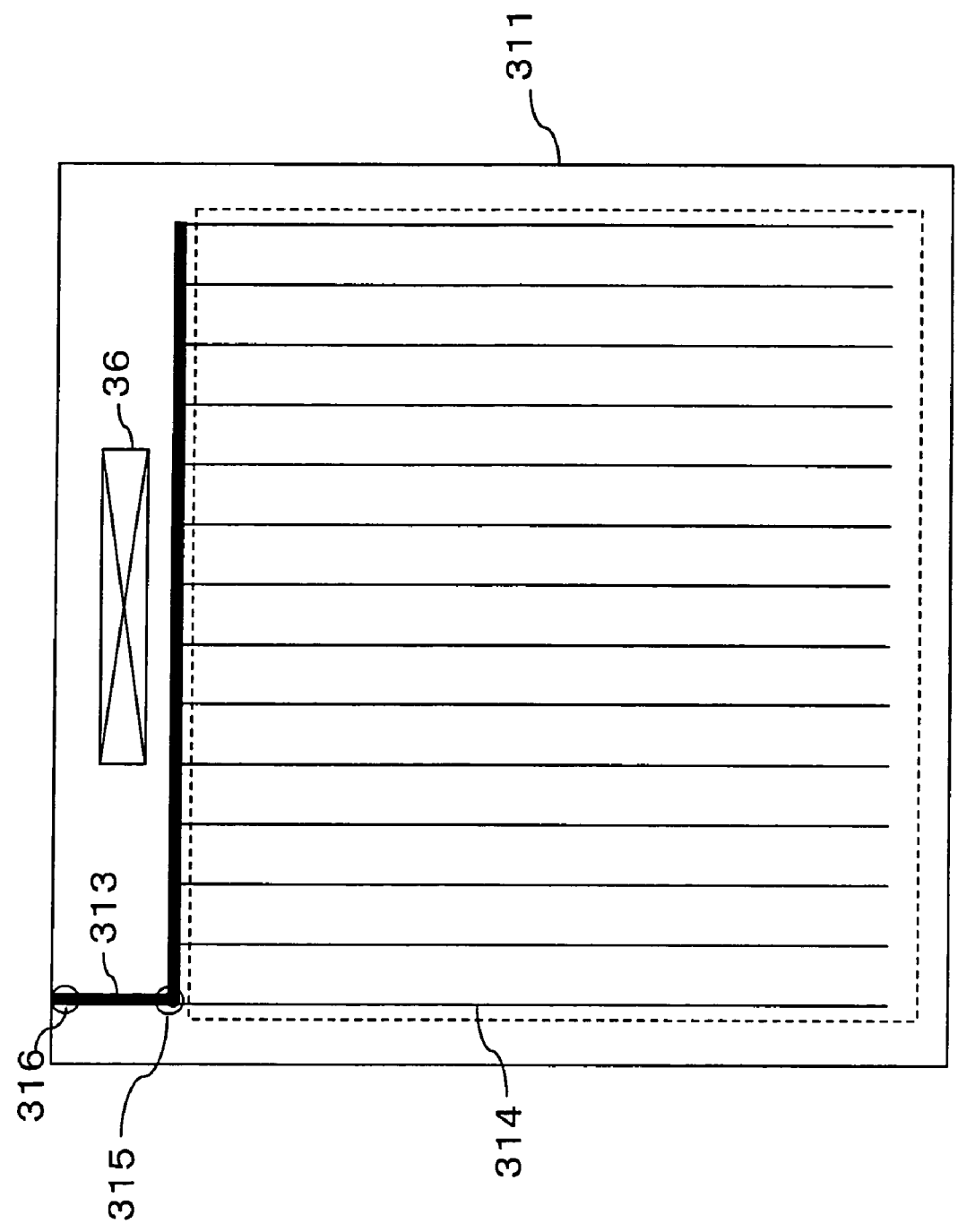
FIG. 31 is a diagram showing a wiring of an EL power supply line in FIG. 6 or FIG. 44.

On the other hand, the EL power supply line 64 is supplied to respective pixels by wirings 313 and 314 in a display panel shown in FIG. 31. A maximum current flows to 313 when all the pixels are in white display, and a minimum current flows to 313 when all the pixels are in black display. In this case, potentials are different at points of 315 and 316 at the time of white display due to a wiring resistance of 313. On the other hand, potentials are substantially equal in 315 and 316 at the time of black display. In other words, potentials of the EL power supply line 64 are different at the time of white display and at the time of black display due to voltage drop of the EL power supply line 313. Even if same currents of I2 are caused to flow, a voltage of the source signal line 60 varies according to a difference of a voltage drop amount of the EL power supply line 313. Therefore, unless a voltage value of the pre-charge power supply 24 is changed according to the voltage drop amount of 313, a problem is caused in that a current of a source signal line changes and, as a result, a luminance changes.

If a voltage of the EL power supply line 64 varies, it is necessary to make a voltage to be applied to the source signal line 60 different. A voltage only has to be changed using lighting ratio data in one frame. Since a current flowing to the EL power supply line 313 increases when a lighting ratio is high, an electronic volume is controlled so as to increase voltage drop and decrease a voltage value of the pre-charge power supply 24. On the other hand, since voltage drop of the EL power supply line 313 is small when the lighting ratio is low, a voltage value of the pre-charge power supply 24 is increased by an electronic volume, whereby it becomes possible to eliminate luminance unevenness caused by a wiring resistance of the EL power supply line 313.

On the other hand, in a large panel, since it becomes difficult to write a current to a predetermined value, it is necessary to prepare a voltage value for almost every gradation, in particular, in a low gradation to improve writing. Moreover, there is also a method of increasing the number of pre-charge power supplies 24 in order to increase a voltage value. However, the switches 131 are required in a number equivalent to the number of voltages. In particular, since switches are required in a number equivalent to the number of power supplies in each source line, the switches occupy a large area.

The pre-charge judgment signal 55 of N bits is required with respect to the number of power supplies (2N−1), and a decode unit for controlling (2N−1) switches from a signal of N bits is required for an application judgment unit 39 of each source signal line. Thus, there is also a problem in that a circuit size of this decode unit increases in accordance with an increase of N to make a chip area large.

This is because, since digital data (gradation data) is converted into an analog value (pre-charge voltage) in each source line, a digital analog conversion unit is required for each source line. Thus, a circuit size increases as the number of output voltages increase.

Thus, as shown in FIG. 38, only one digital analog conversion unit 381 is prepared in a semiconductor circuit. The digital analog conversion unit 381 converts data transferred serially into an analog voltage and then distributes the analog voltage to each source signal line. Therefore, an output 382 of the digital analog conversion unit is inputted to a distribution unit and a hold unit 383 to distribute an analog voltage based upon gradation data to each source signal line.

On the other hand, as a method of outputting a current corresponding to a gradation, as in FIG. 2, gradation data 386 is distributed to each source line by a shift register and a latch unit 384 to output a current corresponding to a gradation with a current output stage 23 in each source line.

The current voltage selecting unit 385 is arranged in front of an output to a source signal line as a section for determining which of a current or a voltage is outputted. The current voltage selecting unit 385 is switched by a pre-charge judgment signal 380, a pre-charge voltage application judgment unit 56, and a pre-charge pulse 52 to determine whether a current is outputted or a current is outputted after outputting a voltage. The pre-charge voltage application judgment unit 56 determines whether a period for performing voltage output is provided, and the pre-charge pulse 52 determines a period for performing voltage output when the voltage output is performed.

Consequently, if the digital analog conversion unit 381 has the number of analog output stages corresponding to the number of gradations, it becomes possible to output a voltage corresponding to a gradation, and it becomes possible to, in a period in which a certain row is selected (equivalent to a horizontal scanning period), first, change a source signal line current to substantially a predetermined value according to a voltage and then correct deviation of a current value due to fluctuation of a transistor of each pixel according to current output.

In order to change a source signal line current to a predetermined current value according to a current, in particular, in a low gradation part, a time equal to or more than a horizontal scanning period is often required. Since the method of changing a source signal line current according to a voltage is capable of completing the change in about 1 microseconds, and correction according to a current is a little, there is an advantage that the change of a current to a predetermined current within a horizontal scanning period is facilitated in the method of causing a current to flow after applying a voltage.

For example, in a semiconductor circuit for driving that is capable of performing 256 gradation display, if a source signal line current can be changed to a predetermined current value sufficiently only with a current at higher order 128 gradations, a voltage only has to be outputted for lower 128 gradations. Therefore, a digital analog conversion unit 381 only has to have a resolution of seven bits and can only output voltages of 128 types. When gradation data 386 is one of the higher order 128 gradations, the pre-charge judgment signal 380 is inputted such that voltage output is not performed. Consequently, the current voltage selecting unit 385 always outputs only a current. Since an output signal of the digital analog conversion unit 381 is not outputted to the outside of the semiconductor circuit for driving, the output signal takes any value. As a most simple method, a voltage corresponding to a value of lower order seven bits may be outputted neglecting a higher order one bit of the inputted gradation data 386.

When the gradation data 386 is between 0 to 127 gradations, the current voltage selecting unit 385 is controlled by the pre-charge judgment signal 380 to provide a period in which an analog voltage from the digital analog conversion unit 381 is outputted to the outside of the semiconductor circuit for driving.

Figure 44:
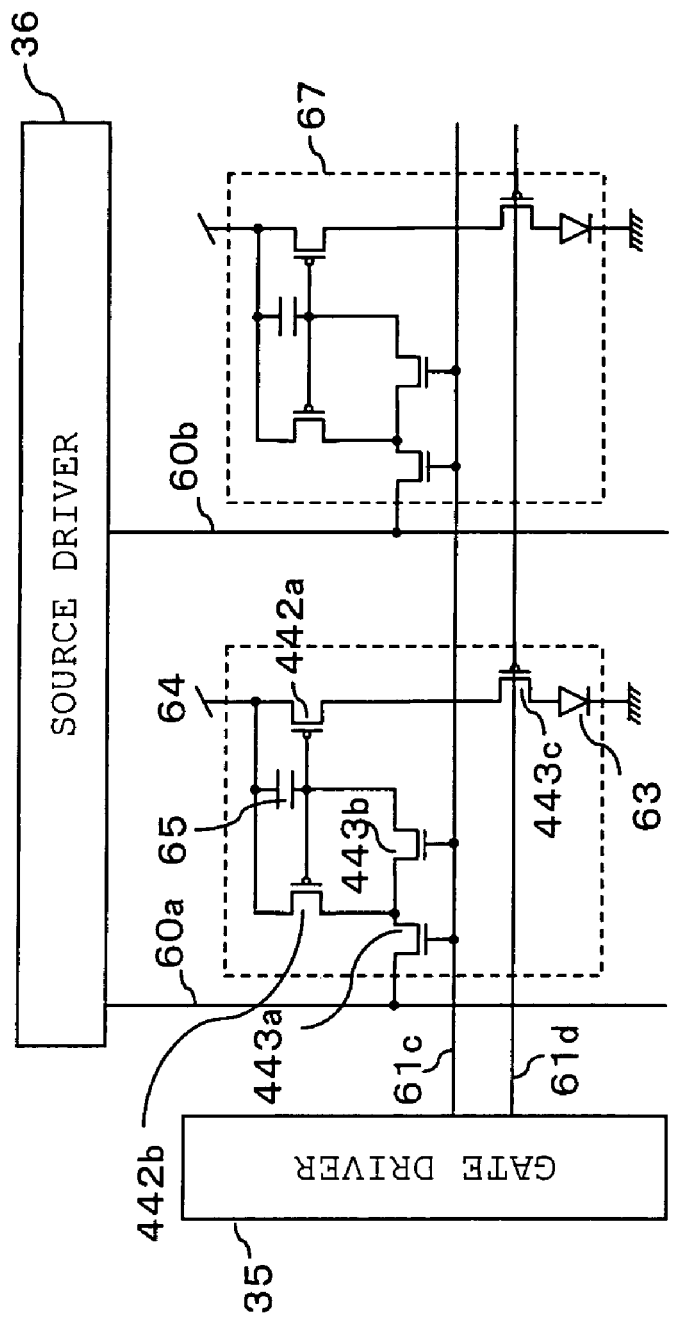
FIG. 44 is a diagram showing a display device using a pixel structure of a current mirror format.

Consequently, a circuit, in which are solution of a digital analog conversion unit is reduced, can be formed. In addition, in the case of a pixel structure of a current copier using a p-type transistor as shown in FIG. 6 or a current mirror as shown in FIG. 44, in general, a voltage of a source signal line is highest at the time of black display and drops as display changes to white display. Compared with a voltage change width in a range from black to white, a voltage change width in a range from black to half tone is small. Therefore, in the case of a structure for outputting a voltage only at the time of 0 to 127 gradations, it becomes possible to reduce a dynamic range of an output voltage.

In addition, in the source driver IC 36 of the invention, since an operation for outputting a current and correcting fluctuation of a drive transistor is performed after applying a voltage, a voltage value to be outputted, with which substantially a target current value is obtained, only has to be applied, and accuracy is not required. Consequently, since a value of an output deviation of a voltage output of the digital analog conversion unit 381 may be large compared with that of a liquid crystal panel, it is also possible to reduce a circuit size so much more for that.

In general, easiness of current change varies depending upon a difference of a size of a penal using a source driver IC (a stray capacitance of a source line is different) or a difference of the number of pixels in a scanning direction (a horizontal scanning period is different).

When the driver IC of this structure is used, if the pre-charge pulse 52 is inputted from the outside of the source driver IC, the pre-charge judgment signal 380 and the gradation data 386 become external signal inputs as shown in FIG. 2. Thus, there is an advantage that a gradation range, in which gradation display is performed using only a current or both a voltage and a current, can be set arbitrarily according to a panel. Setting of the gradation range can be controlled with a control IC formed in the outside as shown in FIG. 2. In addition, in the case in which an operation of the control IC can be changed according to a command input, it is possible to adjust the operation according to the command input. Note that, other than constituting the control IC outside the source driver IC as shown in FIG. 2, the source driver IC and the control IC may be integrally formed in an identical chip as it is seen in part of source drivers for liquid crystal. In this case, it is sufficient that a gradation range can be adjusted according to a command input of an integrated IC.

According to the invention described above, the problem in that, in a low gradation part, since a current flowing to a source signal line is small, a current cannot change to a predetermined value within a predetermined time (horizontal scanning period), and therefore a luminance of a pixel of the next row in which white display is performed becomes higher than a predetermined value is solved by pre-charge voltage input.

Figure 10:
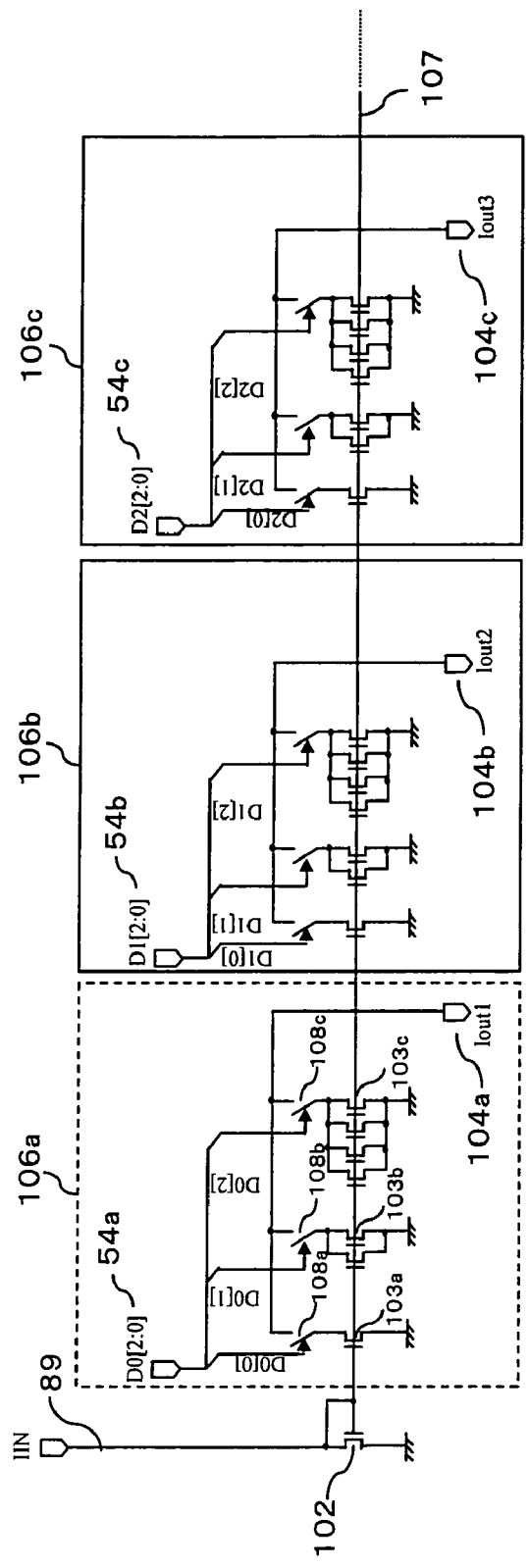
FIG. 10 is a diagram showing a circuit of outputting a current to each output of a conventional current output type driver.

FIG. 8 is a diagram showing a reference current generation circuit. A reference current defines a current value per one gradation (reference current 89) in the structure of the output stage shown in FIG. 10.

In FIG. 8, the reference current 89 depends upon a potential at a node 80 and a resistance value of a resistance element 81.

Moreover, it is possible to change a potential at the node 80 according to control data 88 by a voltage adjusting unit 85.

Figure 11:
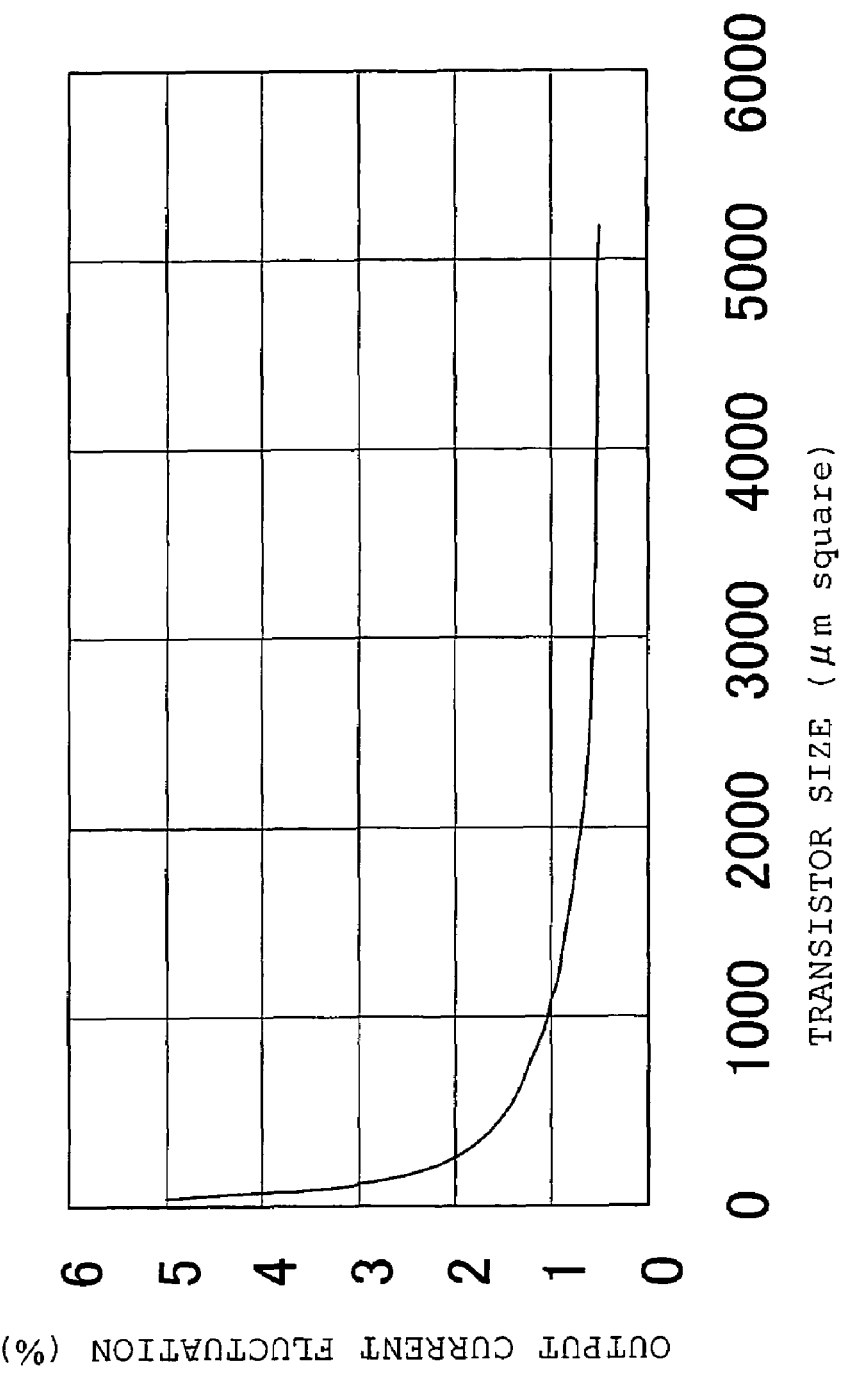
FIG. 11 is a diagram showing a relation between a transistor size of a current source for gradation display 103 of FIG. 10 and fluctuation in an output current.

Fluctuation in an output current for each terminal occurs depending upon a transistor size of the current source for gradation display 103 of performing current output. A relation between a transistor size (channel area) and fluctuation in an output current is shown in FIG. 11. Since it is necessary to reduce fluctuation between adjacent terminals in a chip and among chips to be 2.5% or less taking into account fluctuation in a reference current, it is desirable to reduce fluctuation in an output current in FIG. 11 (fluctuation in a current in an output stage) to 2.5% or less, and it is advisable to set a transistor size of the current source for gradation display 103 to 160 square microns or more.

Incidentally, in a display panel using an organic luminous element, a current flows only to a lighting pixel and does not flow to a non-lighting pixel. Therefore, a maximum current flows at the time of full-screen white display, and a minimum current flows at the time of full-screen black display.

A power supply circuit, which supplies a current to a display panel is required to be given a capacity allowing a maximum current to flow to the power supply circuit. However, screen display, to which the maximum current flows, is hardly performed. It is very wasteful to provide a power supply circuit with a large capacity for the maximum current that is generated in extremely rare opportunities. In addition, it is necessary to make the maximum current as small as possible in order to reduce power consumption.

Thus, as a method of reducing a maximum current, when white display pixels occupy sixty percent or more of all pixels, a luminance of all the pixels is reduced by about 2 to 3%. Consequently, the maximum current falls by 2 to 3%, and power at a peak time falls.

This method can be realized if a value of the reference current 89 generated from the reference current generating unit 26, which determines a current per one gradation, is changed by about 2 to 3%.

Therefore, a value of the control data 88 is changed and a voltage at the node 80 is changed according to a display pattern, whereby the reference current 89 is changed.

In this way, in order to change a value of control data according to a display pattern, it is necessary to perform control for judging the display pattern and changing the control data according to a result of the judgment. Therefore, this judgment is usually performed by the control IC 28.

Consequently, the number of signal lines inputted to the source driver IC 36 from the control IC 28 is equivalent to the number of control data lines of an electronic volume in addition to video signal lines. Therefore, the number of input/output terminals of both the ICs increases. When control of the electronic volume requires six bits and the video signal line requires eighteen bits (six bits for each color), twenty-four terminals are required.

Moreover, since the pre-charge power supply 24 is incorporated, a register for setting an output voltage of the pre-charge power supply 24 is present. Since a pre-charge voltage depends upon a TFT characteristic of a display panel and a threshold voltage of an organic luminous element, it is necessary to set a voltage value different for each different panel and to set the voltage value at least once from the outside. It is inefficient to provide an external input terminal for performing the setting once.

It is effective to reduce the number of input/output signal lines for reduction in a chip area and simplification of drawing-around of wiring in the outside.

Thus, in the invention, a data line and an address line are connected between a control IC and a source driver IC, and a video signal and various setting signals (this signal will be hereinafter represented as a command data signal, and a period, in which the command data signal is applied, is represented as a command period) are transferred serially at high speed to reduce the number of signal lines. The video signal transfers three primary colors of red, green, and blue serially. FIG. 1 shows a timing chart of the data line and the address line. After a start pulse 16 is inputted, pixel data for one row is transferred from a data line 12. Thereafter, data for various kinds of control are transferred. For example, a set value of an electronic volume is transferred. In order to distinguish data flowing through the data line 12, an address 13 is transferred synchronously with data of the data line 12. In this example, red data, green data, and blue data are obtained when data of the address line 13 is 0, 1, and 2, respectively. A value of 4 or more indicates various setting signals, that is, command data.

Figure 18:
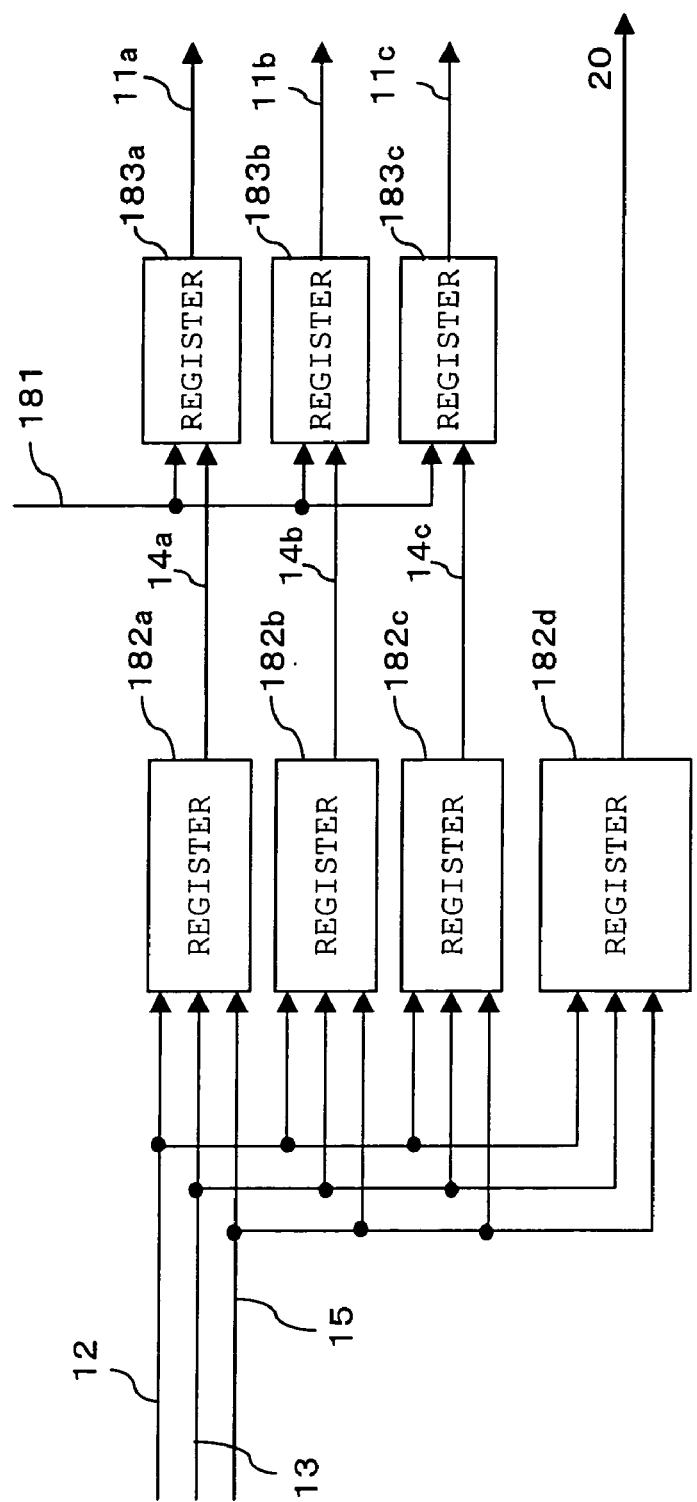
FIG. 18 is a diagram showing a circuit of distributing an input serial current to each signal.

FIG. 18 shows a block diagram of the distribution unit 27 for distributing data that is serially transferred. The distribution unit is constituted by a register or a latch circuit of two stages for a video signal or one stage for other command data signals.

Only necessary data are captured by the register or latch circuit 182 of the first stage, and timing of signals of three colors is adjusted for video signals 11a, 11b, and 11c such that a carry pulse of the next shift register unit 21 can be extended. Consequently, video data 11 as shown in FIG. 1 is extracted. This data is distributed to respective outputs by the shift register unit 21.

Figure 28:
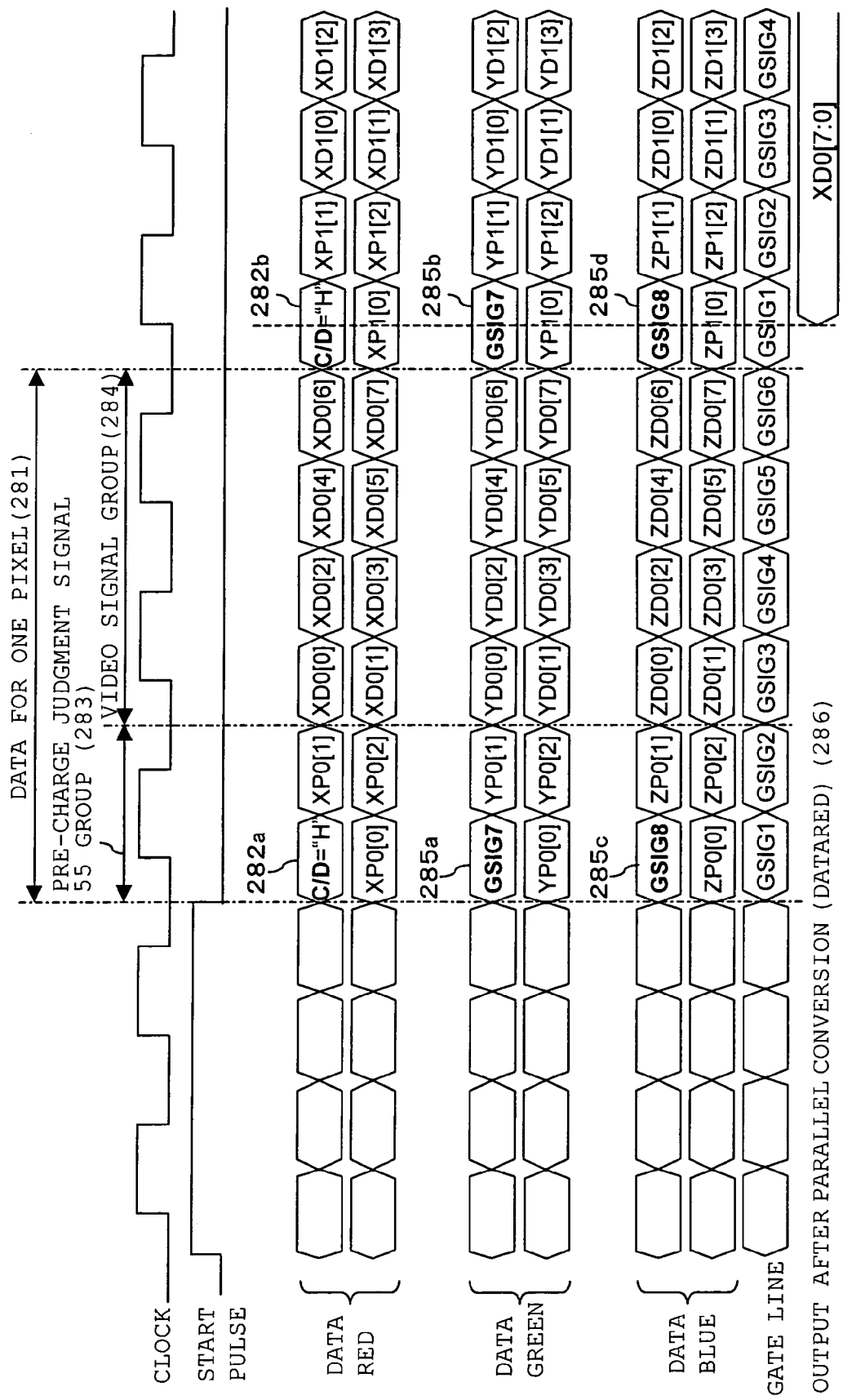
FIG. 28 is a diagram showing a time chart at the time of data transfer in the case in which the number of input signal lines of a source driver is reduced by inputting data serially at high speed for each color.
Figure 29:
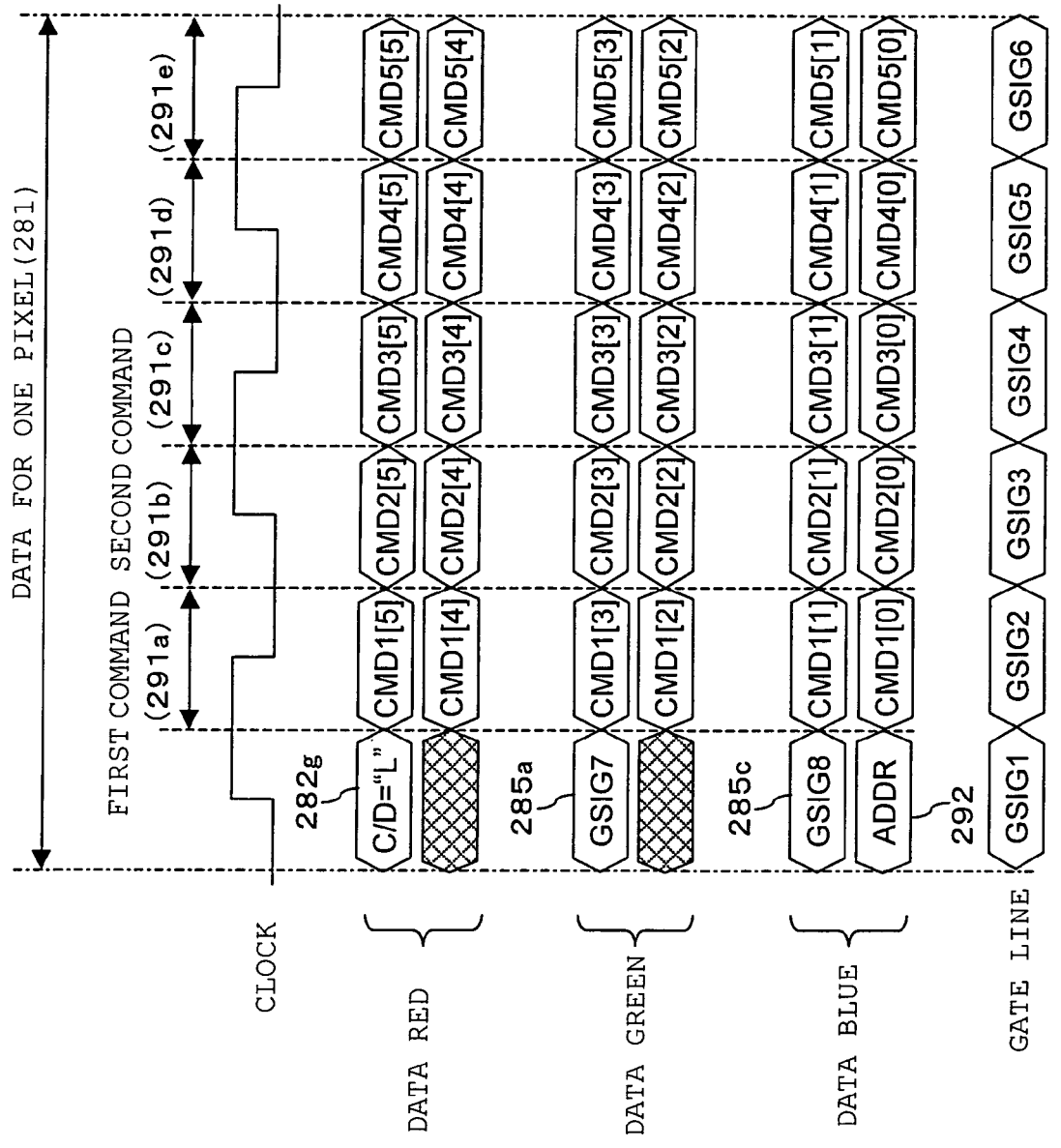
FIG. 29 is a diagram showing a time chart at the time of command transfer in the case in which the number of input signal lines of a source driver is reduced by inputting data serially at high speed for each color.
Figure 30:
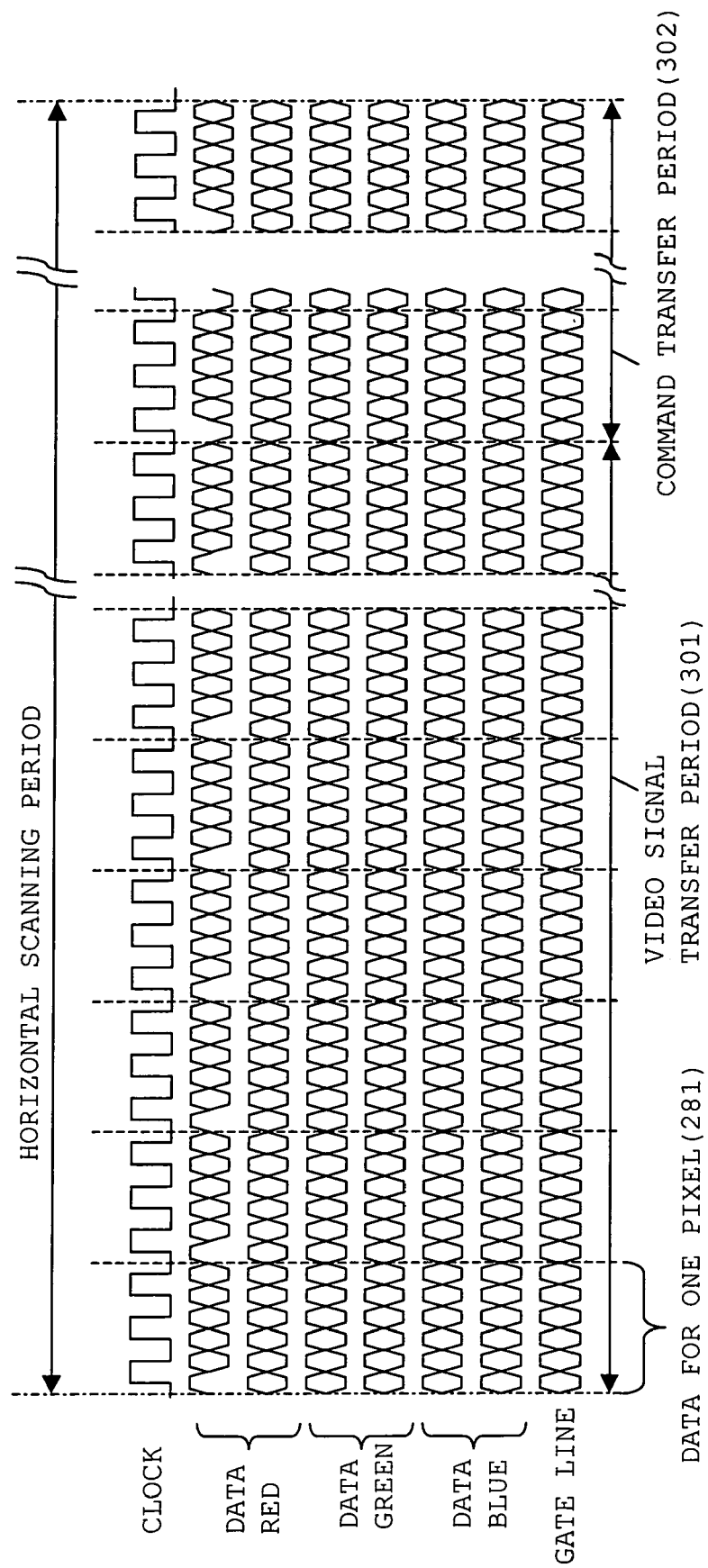
FIG. 30 is a diagram showing a transfer order in FIG. 28 and FIG. 29 in a one horizontal scanning period.

In addition, FIG. 28 to FIG. 30 show a second example for reducing the number of signal lines.

In this example, a method of preparing a signal line for each color and transferring data of each color serially is described. Video signals corresponding to respective dots are transferred in order, and a command data signal is sent using a blanking period. FIG. 30 shows a relation of transfer in one horizontal scanning period. Identification of a video signal transfer period 301 and a command data signal transfer period 302 is performed by a data command flag 282. One data at the top of data for one pixel 281 is allocated to this data command flag 282 (in this example, one of red data is used), if the data command flag 282 indicates a high level, this data is judged as a video signal, and if the data command flag 282 indicates a low level, the data is judged as a command. This data command flag 282 may be in any part of the data for one pixel 281. However, processing is easily performed if the data command flag 282 is at the top because it can be judged first whether data to be inputted is command data.

In this example, the data for one pixel 281 consists of data transfer for six times, and a signal of eleven bits consisting of three bits of the pre-charge judgment signal 55 and eight bits of a video signal is transferred at sixfold speed by two signal lines. FIG. 28 shows details. First, a group 283 of pre-charge judgment signals 55 is transmitted, and a video signal group 284 is transmitted. Note that, an order is not limited to this order. In order to realize an identical circuit structure for red data, green data, and blue data, it is preferable to transfer the pre-charge judgment signals 55 and the video signal group 284 without using data for first one bit. Since a video signal is transferred serially, the video signal is inputted to a shift register after parallel conversion via a serial parallel conversion unit. Output timing of the red data after parallel conversion is indicated by 286.

Data may be blank data in a period represented by 285. In this example, a gate signal line sent by serial transmission is inputted to a source driver and subjected to parallel conversion in the inside of the source driver to perform signal supply to a gate driver. A signal of a gate signal line is inputted in the period of 285. (In a display device using an organic luminous element, two gate drivers, namely, a gate driver for pixel selection for causing a predetermined current to flow to a predetermined pixel and a gate driver for EL lighting for causing a current stored in a pixel to continuously flow are required as gate drivers. A clock, a start pulse, scan direction control, and an output enable terminal are required for the respective gate drivers. Thus, total eight signal lines are required. When six signal lines are sent in one gate signal line and two signal lines are sent in two sections of 285, waveform control for a gate driver becomes possible at one pixel timing. More detailed control is possible. In order to realize this, sections of 285 are required other than a gate signal line for serial transfer.

On the other hand, FIG. 29 shows an example of data transfer at the time of command data signal transmission. Since it is often sufficient that the number of bits for one command is about six bits, in this example, all red, green, and blue data are collectively regarded as a signal of six bits, and data for five times after the flag 282 as data command identification signal is captured as a command. Since an operation of a gate driver is necessary even in the blanking period, in the gate lines and the sections of 285, a signal for gate driver is inputted regardless of a value of the flag 282.

There is an unused data for three bits other than sections in which a signal for gate driver of signals at identical timing with the data command flag 282 is inputted. This part may be allocated to a command with a short bit length but is used as a command address when it is necessary to set five or more commands. In FIG. 29, with a source driver for receiving ten or less command as an example, a command address of one bit indicated by 292 is prepared. A command register to be updated is changed according to values of 282 and 292. Since data is transferred at one time, a serial parallel conversion unit is unnecessary, and an internal register input only has to be updated directly (an electronic volume input or the like determining the pre-charge power supply 24).

A video signal and a pre-charge judgment signal are transferred multiply and command data signal input is performed in a video signal non-transmission period by an input interface shown in FIG. 28 to FIG. 30, whereby it becomes possible to reduce the conventional number of input lines of ninety-three to the number of input lines of six in the case in which the number of commands is ten and a command bit length is six bits.

The number of signal lines and a transfer rate can be set arbitrarily. The number of signal lines can be set to one bit for each color at the minimum and a number obtained by distributing the number of signal bits necessary for each pixel of each color by two at the maximum. Since a clock frequency increases and drawing-around of wiring in the outside becomes difficult when the number of signal lines decreases, practically, it is preferable to adopt the number of signal lines with a data transfer rate of 100 MHz or less. In the invention, in order to reduce EMI, only a clock is set to a half frequency to capture data at both edges.

Note that, as an input signal, a signal may be transmitted by differential transmission even if the signal is not a signal of a CMOS level. When the differential transmission is used, there is an effect that, in general, EMI decrease because a signal line amplitude decreases.

Figure 16:
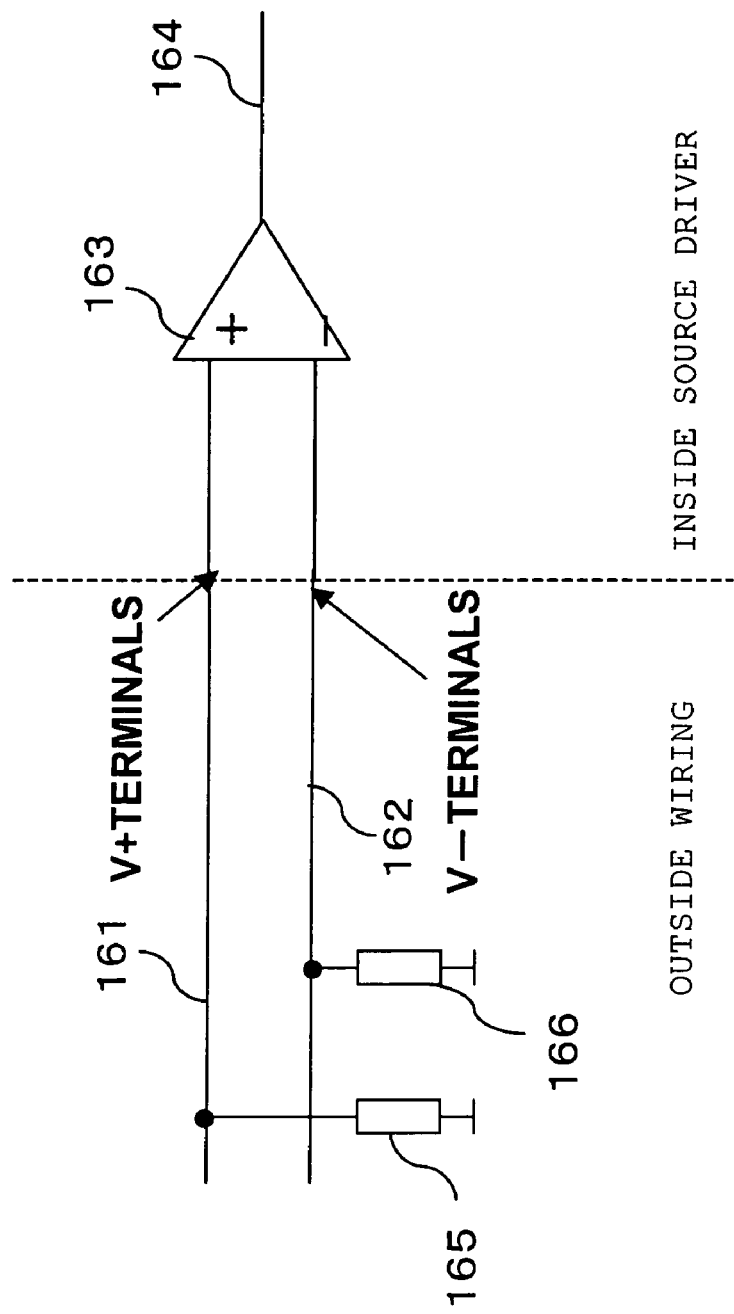
FIG. 16 is a diagram showing a circuit structure of an input unit of a source driver in which differential input is possible.

Concerning a clock and a data line for performing high-speed transfer, as an input format as shown in FIG. 16, transmission may be performed with an RSDS format for extracting a logic signal 164 from a difference of two input signal lines (161 and 162). Reference numerals 165 and 166 denote resistance elements for converting a signal subjected to current transmission into a voltage value. A value of this resistance element is determined according to specifications on a transmission side. This input terminal is incorporated in all the signal lines in FIG. 1 and FIG. 28, whereby a transmission format is changed to differential transmission, and a driver with less EMI is realized.

Consequently, the source driver IC 36 with the small number of input signal lines can be realized.

In the above explanation, the explanation is made assuming that a driver is a driver of a monochrome output. However, the present invention is also applicable to a drive of a multicolor output. Identical circuits only have to be prepared by the number multiplied by the number of display colors. For example, in the case of three color outputs of red, green, and blue, it is sufficient to incorporate three identical circuits in an identical IC and use the circuits as circuits for red, green, and blue, respectively.

In the present invention as described above, the transistor is explained as a MOS transistor. However, the present invention is also applicable to a MIS transistor and a bipolar transistor in the same manner.

In addition, the present invention is applicable to a transistor of any material such as crystal silicon, low-temperature polysilicon, high-temperature polysilicon, amorphous silicon, and a gallium arsenide compound.

INDUSTRIAL APPLICABILITY

According to the current output type semiconductor circuit and the current output method in accordance with the invention, even if the number of output bits of a current driver is increased, an increase in a circuit size can be controlled to be lower. The current output type semiconductor circuit and the current output method are useful as, for example, a drive device for display and a display device.

The invention claimed is:

1. A current output type semiconductor circuit, comprising:
   first current source groups that include a first unit transistor of outputting a predetermined current and output lower order N (N is a natural number) bits; and
   second current source groups that include a second unit transistor of outputting a current larger than the predetermined current and output higher order M (M is a natural number, (N+M)≧3) bits, wherein
   a current source group for current increase is provided on a current path through which a current source group of the second current source groups outputs the current for outputting a highest order bit.

2. The current output type semiconductor circuit according to claim 1, wherein, when it is assumed that a channel length of the first unit transistor is L1, a channel width thereof is W1, a channel length of the second unit transistor is L2, and a channel width thereof is W2, L1×W1<L2×W2.

3. The current output type semiconductor circuit according to claim 2, wherein L2×W2 is a maximum value among values at which fluctuation in an output current of the second unit transistor is equal to or lower than an allowable value of fluctuation in an output current of the first unit transistor.

4. The current output type semiconductor circuit according to claim 1, wherein a trimming circuit for implementation of the current increase is provided.

5. The current output type semiconductor circuit according to claim 1, wherein a control switch for implementation of the current increase is provided.

6. The current output type semiconductor circuit according to claim 5, wherein a memory, which stores a value of a control signal line to determine a state of the control switch, is provided.

7. A current output type semiconductor device, comprising:
   a driver that has a drive signal output stage of outputting at least a current signal for driving; and
   a control circuit that is constituted separately from the driver and generates at least video signals and command data signals for various controls, wherein the video signals and the command data signals are outputted from the control circuit via an identical signal line and at staggered times from each other between ON and OFF of a power supply of the control circuit and inputted to the driver.

8. The current output type semiconductor device according to claim 7, comprising a distribution circuit of distributing a signal inputted to the driver into the video signals and the command data signals.

9. A source driver for display device driving, comprising the current output type semiconductor device of claim 7.

10. A display device, comprising the source driver for display device driving of claim 9.

11. A current output type semiconductor device, comprising:
- a driver for driving that has a drive signal output stage of outputting at least a current signal for driving; and
- a control circuit that is constituted separately from the driver and generates at least video signals and command data signals for various controls, wherein
- the video signals are outputted via an identical signal line and at staggered times from each other for each video signal corresponding to each color of the three primary colors between ON and OFF of a power supply of the control circuit.

12. The current output type semiconductor device according to claim 11, comprising a distribution circuit of distributing a signal inputted to the driver into the video signals and the command data signals.

13. A source driver for display device driving, comprising the current output type semiconductor device of claim 11.

14. A display device, comprising the source driver for display device driving of claim 13.

15. A signal input/output method, comprising:
- outputting at least a current signal for driving from a driver including a drive signal output stage;
- generating at least video signals and command data signals for various controls from a control circuit constituted separately from the driver; and
- inputting the video signals and the command data signals to the driver via an identical signal line from the control circuit and at staggered times from each other between ON and OFF of a power supply.

16. A current output type semiconductor circuit comprising:
- first current source groups that include a first unit transistor of outputting a predetermined current and output lower order N (N is a natural number) bits; and
- second current source groups that include a second unit transistor of outputting a current larger than the predetermined current and output higher order M (m is a natural number, (N+M)≧3) bits, wherein,
- when it is assumed that a channel length of the first unit transistor is L1, a channel width thereof is W1, a channel length of the second unit transistor is L2, and a channel width thereof is W2, L1×W1<L2×W2.

17. The current output type semiconductor circuit according to claim 16, wherein L2×W2 is a maximum value among values at which fluctuation in an output current of the second unit transistor is equal to or lower than an allowable value of fluctuation in an output current of the first unit transistor.

* * * * *